(12) United States Patent
Leclerc et al.

(10) Patent No.: US 9,505,876 B2
(45) Date of Patent: Nov. 29, 2016

(54) PREPARATION OF HIGH MOLECULAR WEIGHT POLYMERS BY DIRECT ARYLATION AND HETEROARYLATION

(71) Applicant: UNIVERSITE LAVAL, Quebec (CA)

(72) Inventors: Mario Leclerc, Quebec (CA); Philippe Berrouard, Quebec (CA)

(73) Assignee: UNIVERSITE LAVAL, Quebec, QC (CA)

( * ) Notice: Subject to any disclaimer, the term of this patent is extended or adjusted under 35 U.S.C. 154(b) by 0 days.

(21) Appl. No.: 14/352,541

(22) PCT Filed: Oct. 22, 2012

(86) PCT No.: PCT/CA2012/000970
§ 371 (c)(1),
(2) Date: Apr. 17, 2014

(87) PCT Pub. No.: WO2013/056355
PCT Pub. Date: Apr. 25, 2013

(65) Prior Publication Data
US 2014/0371409 A1    Dec. 18, 2014

Related U.S. Application Data

(60) Provisional application No. 61/549,478, filed on Oct. 20, 2011, provisional application No. 61/576,045, filed on Dec. 15, 2011, provisional application No. 61/651,915, filed on May 25, 2012.

(51) Int. Cl.
*C08G 75/00*    (2006.01)
*C08G 61/12*    (2006.01)
(Continued)

(52) U.S. Cl.
CPC ........... *C08G 61/126* (2013.01); *C08G 61/124* (2013.01); *H01L 51/0036* (2013.01);
(Continued)

(58) Field of Classification Search
CPC .............. C08G 61/122; C08G 61/126; C08G 2261/124; C08G 2261/1412; C08G 2261/322; C08G 2261/33241; C08G 2261/3243; C08G 2261/364; C08G 2261/413; C08G 2261/414; C08G 2261/92; C08F 234/04; H01L 51/0036; H01L 51/0043; H01L 51/0545; H01L 51/4226; Y02E 10/542; Y02E 10/549
USPC .......................... 528/377, 380; 526/171, 256
See application file for complete search history.

(56) References Cited

U.S. PATENT DOCUMENTS

2012/0322966 A1*  12/2012  Bazan et al. .................... 528/33

FOREIGN PATENT DOCUMENTS

EP           2644629        10/2013
WO       2005/049695        6/2005
(Continued)

OTHER PUBLICATIONS

Kumar et al. (Polym. Chem., 2010, 1, 286-288).*
(Continued)

*Primary Examiner* — Shane Fang
(74) *Attorney, Agent, or Firm* — Parker Highlander PLLC

(57) ABSTRACT

A method for preparing polymers by direct heteroarylation or arylation polycondensation is described herein. The method includes preparing a reaction mixture including at least a monomer to be polymerized, a catalyst and a ligand; heating the reaction mixture, and, optionally, end-capping the reaction mixture.

15 Claims, 15 Drawing Sheets

(51) Int. Cl.
H01L 51/00 (2006.01)
H01L 51/05 (2006.01)
H01L 51/42 (2006.01)
H01L 51/50 (2006.01)

(52) U.S. Cl.
CPC ....... *H01L51/0043* (2013.01); *C08G 2261/12* (2013.01); *C08G 2261/124* (2013.01); *C08G 2261/1412* (2013.01); *C08G 2261/1424* (2013.01); *C08G 2261/228* (2013.01); *C08G 2261/3223* (2013.01); *C08G 2261/3243* (2013.01); *C08G 2261/334* (2013.01); *C08G 2261/364* (2013.01); *C08G 2261/90* (2013.01); *C08G 2261/91* (2013.01); *C08G 2261/92* (2013.01); *C08G 2261/94* (2013.01); *C08G 2261/95* (2013.01); *H01L 51/0084* (2013.01); *H01L 51/0094* (2013.01); *H01L 51/05* (2013.01); *H01L 51/42* (2013.01); *H01L 51/50* (2013.01); *Y02E 10/549* (2013.01)

(56) References Cited

FOREIGN PATENT DOCUMENTS

WO   2012/058209   5/2012
WO   2012/068733   5/2012
WO   2012/083510   6/2012

OTHER PUBLICATIONS

Ozawa et al. Synthesis of Polythiophenes based on Direct Arylation Reaction, the Japan Chemical Society 90th Annual Spring Meeting (2010) Preprints 2F1-51.*
Ackermann et al., "Transition-metal-catalyzed direct arylation of (hetero)arenes by C—H bond cleavage", Angew. Chem. Int. Ed, 48, 9792-9826, 2009.
Ackermann, "Carboxylate-assisted transition-metal-catalyzed C—H bond functionalizations: mechanism and scope", Chemical Reviews, 111, 1315-1345, 2011.
Alberico et al., "Aryl-aryl bond formation by transition-metal-catalyzed direct arylation", Chemical Reviews, vol. 107, No. 1, 174-238, 2007.
Amb et al., "Dithienogermnole as a fused electron donor in bulk heterojunction solar cells", Journal of the American Chemical Society, 133, 10062-10065, 2011.
Baghbanzadeh et al., "Palladium-catalyzed direct arylation of heteroaromatic compounds: improved conditions utilizing controlled microwave heating", The Journal of Organic Chemistry, 76, 8138-8142, 2011.
Carsten et al., "Stille polycondensation for synthesis of functional materials", Chemical Reviews, 111, 1493-1528, 2011.
Chen et al., "Palladium-catalyzed direct arylation of thiophenes tolerant to silyl groups", Chem. Commun., 47, 1872-1874, 2011.
Chen et al., "Crystalline conjugated polymer containing fused 2,5-di(thiophen-2-yl)thieno[2,3-b]thiophene and thieno [3,4-c]pyrrole-4,6-dione units for bulk heterojunction solar cells", Chem. Commun., 47, 5064-5066, 2011.
Cheng et al., "Synthesis of conjugated polymers for organic solar cell applications", Chemical Reviews, vol. 109, No. 11, 5868-5923, 2009.
Chu et al., "Bulk heterojunction solar cells using thieno[3,4-c]pyrrole-4,6-dione and dithieno[3,2-b:2',3'-d]silole copolymer with a power conversion efficiency of 7.3%", Journal of the American Chemical Society, 133, 4250-4253, 2011.
Dong et al., "Carbonates: eco-friendly solvents for palladium-catalysed direct arylation of heteroaromatics", Green Chemistry, 12, 2053-2063, 2010.
Dyker, "Transition metal catalyzed coupling reactions under C—H activation", Angew. Chem. Int. Ed., 38, 1698-1712, 1999.

Gendron et al., "New conjugated polymers for plastic solar cells", Energy & Environmental Science, 4, 1225-1237, 2011.
Gendron et al., "Synthesis and photovoltaic properties of poly(dithieno[3,2-b:2',3'-d]-germole) derivatives", Macromolecules, 44, 7188-7193, 2011.
Guo et al., "Thieno[3,4-c]pyrrole-4,6-dione-based polymer semiconductors: toward high performance, air-stable organic thin-film transistors", Journal of the American Chemical Society, 133, 13685-13697, 2011.
Kakiuchi et al., "Catalytic C—H/olefin coupling", Accounts of Chemical Research, vol. 35, No. 10, 826-834, 2002.
Lafrance et al., "Palladium-catalyzed benzene arylation: incorporation of catalytic pivalic acid as a proton shuttle and a key element in catalyst design", Journal of American Chemical Society, 128, 16496-16497, 2006.
Leclerc et al., "Structural analysis of poly(3-alkylthiophene)s", Makromol. Chem., 190, 3105-3116, 1989.
Liégault et al., "Establishment of broadly applicable reaction conditions for the palladium-catalyzed direct arylation of heteroatom-containing aromatic compounds", J. Org. Chem., vol. 74, No. 5, 1826-1834, 2009.
Liégault et al., "Modulating reactivity and diverting selectivity in palladium-catalyzed heteroaromatic direct arylation through the use of a chloride activating/blocking group", J. Org. Chem., 75, 1047-1060, 2010.
Lu et al., "Polycondensation of dibromofluorene analogues with tetrafluorobenzene via direct arylation", Macromolecules, 44, 1252-1255, 2011.
Lyons et al., "Palladium-catalyzed ligand-directed C—H functionalization reactions", Chemical Reviews, 110, 1147-1169, 2010.
McGlacken et al., "Recent advances in aryl-aryl bond formation by direct arylation", Chemical Society Reviews, 38, 2447-2464, 2009.
Piliego et al., "Synthetic control of structural order in N-alkylthieno[3,4-c]pyrrole-4,6-dione-based polymers for efficient solar cells", Journal of American Chemical Society, 132, 7595-7597, 2010.
René et al., "Evaluation of electron-deficient phosphine ligands for direct arylation of heterocycles", Advanced Synthesis Catalysis, 352, 2116-2120, 2010.
René et al., "Room-temperature direct arylation of polyfluorinated arenes under biphasic conditions", Organic Letters, vol. 12, No. 9, 2116-2119, 2010.
Satoh et al., "Catalytic direct arylation of heteroaromatic compounds", Chemistry Letters, vol. 36, No. 2, 200-205, 2007.
Schipper et al., "Direct arylation as a synthetic tool for the synthesis of thiophene-based organic electronic materials", Chemistry of Materials, 23, 1594-1600, 2011.
Sévignon et al., "New synthetic method for the polymerization of alkylthiophenes", Tetrahedron Letters, 40, 5873-5876, 1999.
Su et al., "Improving device efficiency of polymer/fullerene bulk heterojunction solar cells through enhanced crystallinity and reduced grain boundaries induced by solvent additives", Advanced Materials, 23, 3315-3319, 2011.
Thyrunavukkarasu et al., "One-pot synthesis of diarylmethylidenefluorenes and phenanthrenes by palladium-catalyzed multiple C—H bond functionalization", Chemistry European Journal, 16, 1436-1440, 2010.
Wang et al., "Palladium-catalyzed dehydrohalogenative polycondensation of 2-bromo-3-hexylthiophene: an efficient approach to head-to-tail poly(3-hexylthiophene)", Journal of American Chemical Society, vol. 132, No. 33, 11420-11421, 2010.
Yuan et al., "A thieno[3,4-c]pyrrole-4,6-dione-based donor-acceptor polymer exhibiting high crystallinity for photovoltaic applications", Macromolecules, vol. 43, No. 17, 6936-6938, 2010.
Zou et al., "A thieno[3,4-c]pyrrole-4,6-dione-based copolymer for efficient solar cells", Journal of American Chemical Society, vol. 132, No. 15, 5330-5331, 2010.
PCT International Search Report and Written Opinion issued in International application No. PCT/CA2012/000970, mailed Feb. 6, 2013.
Allard et al., "Easy and versatile synthesis of new poly(thieno[3,4-d]thiazole)s", Polymer Chemistry, vol. 3, No. 10, 2875, 2012.

(56) References Cited

OTHER PUBLICATIONS

Berrouard et al., "Synthesis of 5-Alkyl[3,4-c]thienopyrrole-4,6-dione-Based Polymers by Direct Heteroarylation", Angewandte Chemie International Edition, vol. 51, No. 9, 2068-2071, 2012.

Borghese et al., "Direct C—H arylation of 3-methoxythiophene catalyzed by Pd. Application to a more efficient synthesis of pi-alkoxy-oligothiophene derivatives", Tetrahedron Letters, Pergamon, GB, vol. 47, No. 52, 9249-9252, 2006.

Facchetti et al., "Semi-conducting Polymers Prepared by Direct Arylation Polycondensation", Angewandte Chemie International Edition, vol. 51, No. 15, 3520-3523, 2012.

Hassan et al.,"Palladium-catalyzed synthesis of oligo(alkylthiophenes)", Journal of Molecular Catalysis A: Chemical, vol. 195, No. 1-2, 125-131, 2003.

Jo et al., "A New Terthiophene-Thienopyrrolodione Copolymer-Based Bulk Heterojunction Solar Cell with High Open-Circuit Voltage", Advanced Energy Materials, vol. 2, No. 11, 1397-1403, 2012.

Kumar et al., "Single step reductive polymerization of functional 3,4-propylenedioxythiophenes via direct C—H arylation catalyzed by palladium acetate", Polymer Chemistry, vol. 1, No. 3, 286-288, 2010.

Lu et al., "Synthesis of [pi]-Conjugated Polymers Containing Fluorinated Arylene Units via Direct Arylation: Efficient Synthetic Method of Materials for OLEDs", Macromolecules, vol. 45, No. 10, 4128-4133, 2012.

Rudenko et al., "Semi-Random P3HT Analogs via Direct Arylation Polymerization", Journal of Polymer Science Part A: Polymer Chemistry, vol. 50, No. 18, 3691-3697, 2012.

Zhao et al., "Facile Syntheses of Dioxythiophene-Based Conjugated Polymers by Direct C—H Arylation", Macromolecules, vol. 45, No. 19, 7783-7790, 2012.

Extended European Search Report issued in European application EP 12841723.5 mailed Mar. 23, 2015.

* cited by examiner

PREPARATION OF HIGH MOLECULAR WEIGHT POLYMERS BY DIRECT ARYLATION AND HETEROARYLATION

CROSS-REFERENCE TO RELATED APPLICATIONS

The present application is a national stage application under 35 U.S.C. §371 of International application No. PCT/CA2012/000970 filed on Oct. 22, 2012, which claims the benefit of priority from U.S. provisional applications Nos. 61/549,478; 61/576,045 and 61/651,915 filed on Oct. 20, 2011, Dec. 15, 2011 and May 25, 2012 respectively. The entire contents of each of the above-referenced disclosures are specifically incorporated herein by reference.

FIELD

The present disclosure broadly relates to methods for the synthesis of polymers via direct arylation and heteroarylation. More specifically, but not exclusively, the present disclosure relates to the synthesis of heteroaryl polymers via direct arylation and heteroarylation.

BACKGROUND

The last several years have witnessed significant advances in the field of plastic electronics (i.e. light-emitting diodes, photovoltaic devices, biosensors, etc.). The availability of simple and reliable coupling procedures (i.e. Stille, Suzuki, Heck, Kumada, etc.) to afford well-defined and reproducible polymeric materials is directly linked to the many advances in the field of plastic electrodes. However, these state-of-the-art methods generally involve organometallic reagents which create metal waste and require additional synthetic steps and more extensive purification procedures.

The Stille cross-coupling reaction has allowed significant advances in the synthesis of new organic molecules.[1] This reaction also had a significant impact in the field of macromolecular chemistry, especially regarding the synthesis of conjugated polymers.[1,2] However, notwithstanding its great versatility, the Stille reaction involves drawbacks such as the formation of toxic tin by-products and in some cases, instability of the organometallic reagents.

Recently, the development of reactions called "direct arylation" has received much attention.[3] These reactions allow the formation of carbon-carbon bonds between aromatics units with activated hydrogen atoms without the use of organometallic intermediates. Actually, these reactions are mostly developed for the synthesis of small molecules.[4] Indeed, up to now, only a few publications reported the use of direct arylation in polymerization reactions.[5] Moreover, there are very few examples showing the coupling between thiophenes or thiophene derivatives via direct heteroarylation and these moieties are particularly important monomers for plastic electronics.

The thieno[3,4-c]pyrrole-4,6-dione (TPD) unit is a useful building block for the development of new conjugated polymers for organic solar cells (power conversion efficiencies up to 7.3%)[6] and more recently, for organic field-effect transistors (hole mobilities up to 0.6 $cm^2V^{-1}s^{-1}$).[7]

Despite the many synthetic procedures available, the development of greener and cheaper synthetic procedures is desired. Greener materials are likely to exhibit improved performance and stability, considering they are inherently cleaner (absence of organometallic by-products). One promising approach is merging the advantages of plastic solar cells with new ecofriendly synthetic procedures. However, little is known about the production of green energy from green materials.

SUMMARY

The present disclosure broadly relates to the synthesis of polymers via direct arylation or heteroarylation.

The present disclosure, in one embodiment, includes a method for preparing a polymer comprising:
 (a) treating one or more monomers, one or more catalysts and one or more ligands under conditions for the direct arylation or heteroarylation of the at least one monomer to provide the polymer; and
 (b) isolating the polymer.

In an embodiment, the polymer is a high molecular weight polymer.

In another embodiment the present disclosure includes a method for preparing a polymer comprising:
 (a) treating
  (i) a monomer of Formula (I) and a monomer of Formula (II):

H*-A¹-H*      (I)

and

X¹-A²-X²      (II);

(ii) one or more monomers of Formula (III):

H*-A³-X³      (III);

or (iii) a monomer of Formula (III) and a monomer of Formula (IV):

H*-A³-X³      (III)

and

H*-A⁴-X⁴      (IV)

in the presence of one or more catalysts and one or more ligands under conditions for the direct arylation or heteroarylation of the monomer of Formula (I) and monomer of Formula (II) to provide a polymer comprising repeating units of Formula (V):

[A¹-A²]-      (V);

for the direct arylation or heteroarylation of the monomer of Formula (III) to provide a polymer comprising repeating units of Formula (VI):

-[A³]-      (VI); or for the direct arylation or heteroarylation of the monomer of Formula (III) and monomer of Formula (IV) to provide a random polymer comprising repeating units of Formula (VII):

-[A³-A⁴]-      (VII), wherein
H* is a hydrogen that is activated for direct arylation or heteroarytion reactions;
X¹, X², X³ and X⁴ are independently selected from leaving groups for direct arylation or heteroarylation reactions; and
A¹, A², A³ and A⁴ are independently selected from aryl and heteroaryl; and
 (b) isolating the polymer.

In an embodiment, the present disclosure relates to a method for the synthesis of high molecular weight conjugated polymers by direct heteroarylation polycondensation reactions. In a further embodiment, the present disclosure relates to a method for the synthesis of high molecular weight conjugated polymers by direct arylation reactions. In an aspect, these direct arylation and heteroarylation polycondensation reactions provide high yields of the desired polymer product. In a further aspect, these direct arylation and heteroarylation polycondensation reactions provide a green alternative over the commonly used coupling procedures often relying on organometallic reagents and intermediates.

In an embodiment, the present disclosure relates to a method for preparing heteroaryl polymers comprising reacting one or more activated heteroaryl monomers in the presence of one or more catalysts and one or more ligands under conditions for the direct heteroarylation of the one or more monomers to provide the heteroaryl polymer.

In an embodiment, the present disclosure relates to a method for preparing heteroaryl polymers comprising reacting one or more activated heteroaryl monomers in the presence of one or more catalysts and one or more ligands under conditions for the direct heteroarylation or arylation of the one or more monomers to provide the heteroaryl polymer.

Interestingly, the presence of the imide group in thieno[3,4-c]pyrrole-4,6-dione (TPD) unit may act as an orienting and activating group[8] for the hydrogen atoms at the 2,2'-positions (FIG. 1) and on this basis, this monomer represents a good candidate for direct arylation or heteroarylation polycondensation reactions instead of standard Stille cross-coupling reactions. Accordingly, an aspect includes a method for the synthesis of TPD-based polymers via direct heteroarylation. Another aspect includes a method for the synthesis of TPD-based polymers via direct arylation. Yet another aspect includes a catalytic process for the synthesis of TPD-based polymers using direct heteroarylation polycondensation reactions. Yet another aspect includes a catalytic process for the synthesis of TPD-based polymers using direct arylation polycondensation reactions.

Yet a further aspect includes a method for the synthesis of 2-alkylthieno[3,4-d]dithiazole-(TTZ) based polymers via direct heteroarylation. Another aspect includes a method for the synthesis of TTZ-based polymers via direct arylation. Yet another aspect includes a catalytic process for the synthesis of TTZ-based polymers using direct heteroarylation polycondensation reactions. Yet another aspect includes a catalytic process for the synthesis of TTZ-based polymers using direct arylation polycondensation reactions.

Yet a further aspect includes a method for the synthesis of (3,6-bis(thiophene-2-yl)-2,5-bis(2-octyldodecyl)pyrrolo[3,4-c]pyrrole-1,4(2H,5H)-dione)-(DPP) based polymers via direct heteroarylation. Another aspect includes a method for the synthesis of DPP-based polymers via direct arylation. Yet another aspect includes a catalytic process for the synthesis of DPP-based polymers using direct heteroarylation polycondensation reactions. Yet another aspect includes a catalytic process for the synthesis of DPP-based polymers using direct arylation polycondensation reactions.

Yet a further aspect includes a method for the synthesis of isoindigo-based polymers via direct heteroarylation. Another aspect includes a method for the synthesis of isoindigo-based polymers via direct arylation. Yet another aspect includes a catalytic process for the synthesis of isoindigo-based polymers using direct heteroarylation polycondensation reactions. Yet another aspect includes a catalytic process for the synthesis of isoindigo-based polymers using direct arylation polycondensation reactions.

Using the method of the present disclosure, certain novel polymers are prepared. Therefore, the present disclosure also includes novel polymers prepared using the methods of the disclosure.

In an embodiment of the disclosure, the present disclosure includes a polymer comprising repeating units of the Formulae (V), (VI) or (VII):

$$-[A^1-A^2]- \quad (V);$$

$$-[A^3]- \quad (VI); \text{ or}$$

$$-[A^3-A^4]- \quad (VII),$$

wherein
$A^1$, $A^2$, $A^3$ and $A^4$ are independently selected from aryl and heteroaryl; and the polymers were prepared using direct arylation or heteroarylation conditions.

In an embodiment, the present disclosure relates to the use of high molecular weight TPD-based polymers, TTZ-based polymers, DPP-based polymers and isoindigo-based polymers in various electronic devices. In an aspect, non-limiting examples of electronic devices include organic electronic devices including photovoltaic devices, OLEDs, OPVs, transistors, OFETs, batteries, and printed electronics generally, as well as sensors.

Other features and advantages of the present disclosure will become apparent from the following detailed description. It should be understood, however, that the detailed description and the specific examples while indicating preferred embodiments of the disclosure are given by way of illustration only, since various changes and modifications within the spirit and scope of the disclosure will become apparent to those skilled in the art from this detailed description.

BRIEF DESCRIPTION OF THE DRAWINGS/FIGURES

An embodiment of the disclosure will now be discussed in relation to the drawings in which.

DETAILED DESCRIPTION

I. Glossary

Figure 1:
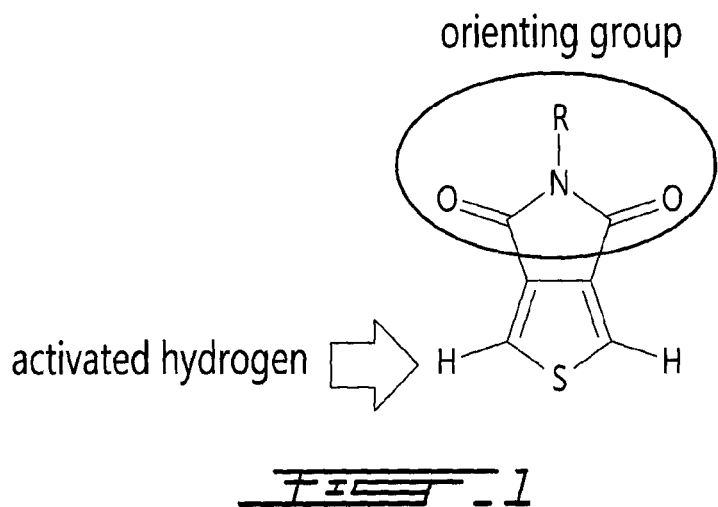
FIG. 1 is an illustration of the activated hydrogen atoms at the 2,2'-positions of the TPD unit.

In order to provide a clear and consistent understanding of the terms used in the present specification, a number of definitions are provided below. Moreover, unless defined otherwise, all technical and scientific terms as used herein have the same meaning as commonly understood by one of ordinary skill in the art to which this specification pertains.

The word "a" or "an" when used in conjunction with the term "comprising" in the claims and/or the specification may mean "one", but it is also consistent with the meaning of "one or more", "at least one", and "one or more than one" unless the content clearly dictates otherwise. Similarly, the word "another" may mean at least a second or more unless the content clearly dictates otherwise.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

As used in this specification and claim(s), the word "consisting" and its derivatives, are intended to be close ended terms that specify the presence of stated features, elements, components, groups, integers, and/or steps, and also exclude the presence of other unstated features, elements, components, groups, integers and/or steps.

The term "consisting essentially of", as used herein, is intended to specify the presence of the stated features, elements, components, groups, integers, and/or steps as well as those that do not materially affect the basic and novel characteristic(s) of features, elements, components, groups, integers, and/or steps.

The terms "about", "substantially" and "approximately" as used herein mean a reasonable amount of deviation of the modified term such that the end result is not significantly changed. These terms of degree should be construed as including a deviation of at least ±1% of the modified term if this deviation would not negate the meaning of the word it modifies.

The present description refers to a number of chemical terms and abbreviations used by those skilled in the art. Nevertheless, definitions of selected terms are provided for clarity and consistency.

Abbreviations: NMR: Nuclear Magnetic Resonance; MS: Mass Spectrometry; m.p.: melting point; HRMS: High Resolution Mass Spectrometry; SEC: Size-Exclusion Chromatography; $M_n$: Number Average Molecular Weight; PDI: PolyDispersity Index; DP: Degree of Polymerization; DSC: Differential Scanning calorimetry; TGA: Thermogravimetric Analysis; XRD: SEC: Size Exclusion Chromatography; X-Ray Diffraction (powder diffraction); PDI: PolyDispersity Index; EtOAc: Ethyl Acetate; $CH_2Cl_2$: Dichloromethane; $CDCl_3$: Chloroform-d; DMAP: 4-(N,N-dimethylamino) pyridine; TFA: Trifluoroacetic acid; TCDI: 1,1-thiocarbonyldiimidazole; AcOH: Acetic acid; TLC: Thin Layer Chromatography; FAB: Fast Atom Bombardment; FCC: Flash Column Chromatography.

As used herein, the term "alkyl" embraces straight-chain or branched chain saturated hydrocarbons. Substituted alkyl groups can be substituted in any suitable position. Examples of alkyl groups containing from 1 to 18 carbon atoms are methyl, ethyl, propyl, butyl, pentyl, hexyl, heptyl, octyl, nonyl, decyl, undecyl, dodecyl, tetradecyl, hexadecyl and octadecyl, the n-isomers of all these residues, isopropyl, isobutyl, isopentyl, neopentyl, isohexyl, isodecyl, 3-methylpentyl, 2,3,4-trimethylhexyl, sec-butyl, tert-butyl, or tert-pentyl. A specific selection of alkyl groups consists of methyl, ethyl, n-propyl, isopropyl, n-butyl, isobutyl, sec-butyl and tert-butyl.

As used herein, the term "lower alkyl" embraces straight-chain or branched-chain saturated hydrocarbons containing 1, 2, 3, 4, 5 or 6 carbon atoms. Substituted alkyl groups can be substituted in any suitable position. Examples of lower alkyl groups are methyl, ethyl, propyl, isopropyl, butyl, isobutyl, tert-butyl, pentyl, isopentyl, neopentyl, and hexyl.

As used herein, the term "alkylene" embraces a linear saturated divalent hydrocarbon group of one to six carbon atoms or a branched-chain saturated divalent hydrocarbon group of three to six carbon atoms. Examples of alkylene groups are methylene, ethylene, 2,2-dimethylethylene, propylene, 2-methylpropylene, butylene, and pentylene.

As used herein the term "alkenyl" embraces straight-chain or branched-chain unsaturated hydrocarbons that contain one or more, for example one, two or three double bonds which can be in any suitable position. Of course, an unsaturated alkyl group has to contain at least two carbon atoms. Examples of alkenyl groups are vinyl, 1-propenyl, allyl, butenyl or 3-methyl-2-butenyl.

As used herein the term "alkynyl" embraces straight-chain or branched-chain unsaturated alkyl groups that contain one or more, for example one, two or three, triple bonds which can be in any suitable position. Of course, an unsaturated alkyl group has to contain at least two carbon atoms. Examples of alkynyl groups are ethynyl, 1-propynyl or propargyl.

As used herein the term "cycloalkyl" embraces monocyclic or polycyclic hydrocarbons, for example monocyclic, bicyclic, tricyclic or quadracyclic, i.e., they can for example be monocycloalkyl groups, bicycloalkyl groups, tricycloalkyl groups, or quadracycloalkyl groups, provided they have a suitable number of carbon atoms, for example from 3 to 30 carbon atoms, and the parent hydrocarbon systems are stable. Bicyclic, tricyclic or quadracyclic alkyl groups are fused, bridged and/or simply linked via a single bond. Cycloalkyl groups can be saturated or contain one or more double bonds within the ring system. In particular they can be saturated or contain one double bond within the ring system. In unsaturated cycloalkyl groups the double bonds can be present in any suitable position. Monocycloalkyl residues are, for example, cyclopropyl, cyclobutyl, cyclopentyl, cyclopentenyl, cyclohexyl, cyclohexenyl, cycloheptyl, cycloheptenyl, cyclooctyl, cyclononyl, cyclodecyl, cycloundecyl, cyclododecyl or cyclotetradecyl, which can also be substituted, for example by $C_1$-$C_4$ alkyl. Examples of substituted cycloalkyl groups are 4-methylcyclohexyl and 2,3-dimethylcyclopentyl. Examples of parent structures of bicyclic ring systems are norbornane, bicyclo[2.2.1]heptane, bicyclo[2.2.2]octane and bicyclo[3.2.1]octane.

As used herein, the term "aryl" embraces an aromatic group which is a single ring or multiple rings fused, bridged or linked together via single bond. When formed of multiple rings, at least one of the constituent rings is aromatic. In an embodiment, aryl substituents include phenyl, indanyl, biphenyl and naphthyl.

The term "halo" means the halogens fluorine, chlorine, bromine or iodine.

The term "heterocyclo" as used herein embraces saturated and partially unsaturated heteroatom-containing cyclic groups, where the heteroatoms are selected from nitrogen, sulfur and oxygen. The heterocyclo groups are either monocyclic, bicyclic, tricyclic or quadracyclic, provided they have a suitable number of atoms, for example from 3 to 30 atoms, and are stable. A bicyclic, tricyclic or quadraheterocyclo group can be fused, bridged and/or simply linked via a single bond. Examples of saturated heterocyclo groups include saturated 3 to 6-membered heteromonocyclic groups containing 1 to 4 nitrogen atoms (e.g. pyrrolidinyl, imidazolidinyl, piperidino, piperazinyl, etc.); saturated 3 to 6-membered heteromonocyclic groups containing 1 to 2 oxygen atoms and 1 to 3 nitrogen atoms (e.g. morpholinyl, etc.); saturated 3 to 6-membered heteromonocyclic groups containing 1 to 2 sulfur atoms and 1 to 3 nitrogen atoms (e.g., thiazolidinyl, etc.). Examples of partially unsaturated heterocyclo groups include dihydrothiophene, dihydropyran, dihydrofuran and dihydrothiazole.

The term "heteroaryl" as used herein embraces fully unsaturated or aromatic heterocyclo groups. The heteroaryl groups are either monocyclic, bicyclic, tricyclic or quadracyclic, provided they have a suitable number of atoms, for example from 3 to 30 atoms, and are stable. A bicyclic, tricyclic or quadraheteroaryl groups are fused, bridged and/or simply linked via a single bond. Examples of heteroaryl groups, include unsaturated 3 to 6 membered heteromonocyclic groups containing 1 to 4 nitrogen atoms, for example, pyrrolyl, pyrrolinyl, imidazolyl, pyrazolyl, pyridyl, pyrimidyl, pyrazinyl, pyridazinyl, triazolyl (e.g., 4H-1,2,4-triazolyl, 1H-1,2,3-triazolyl, 2H-1,2,3-triazolyl, etc.) tetrazolyl (e.g. 1H-tetrazolyl, 2H-tetrazolyl, etc.), etc.; unsaturated condensed heterocyclo groups containing 1 to 5 nitrogen, oxygen and/or sulfur atoms, for example, indolyl, isoindolyl, indolizinyl, benzimidazolyl, quinolyl, isoquinolyl, indazolyl, benzotriazolyl, tetrazolopyridazinyl (e.g., tetrazolo[1,5-b]pyridazinyl, etc.), benzofuran, benzothienyl, benzopyran, etc.; unsaturated 3 to 6-membered heteromonocyclic groups containing an oxygen atom, for example, pyranyl, furyl, etc.; unsaturated 3 to 6-membered heteromonocyclic groups containing a sulfur atom, for example, thienyl, etc.; unsaturated 3- to 6-membered heteromonocyclic groups containing 1 to 2 oxygen atoms and 1 to 3 nitrogen atoms, for example, oxazolyl, isoxazolyl, oxadiazolyl (e.g., 1,2,4-oxadiazolyl, 1,3,4-oxadiazolyl, 1,2,5-oxadiazolyl, etc.) etc.; unsaturated condensed heterocyclo groups containing 1 to 2 oxygen atoms and 1 to 3 nitrogen atoms (e.g. benzoxazolyl, benzoxadiazolyl, etc.); unsaturated 3 to 6-membered heteromonocyclic groups containing 1 to 2 sulfur atoms and 1 to 3 nitrogen atoms, for example, thiazolyl, thiadiazolyl (e.g., 1,2,4-thiadiazolyl, 1,3,4-thiadiazolyl, 1,2,5-thiadiazolyl, etc.) etc.; unsaturated condensed heterocyclo groups containing 1 to 2 sulfur atoms and 1 to 3 nitrogen atoms (e.g., benzothiazolyl, benzothiadiazolyl, etc.) and the like.

As used herein, the term "high molecular weight" will depend on the type of polymer, but will generally denote molecular weights in excess of about 10 kDa.

As used herein, the term "direct heteroarylation" or "direct arylation" means that none of the monomers used in the heteroarylation or arylation process comprises a sacrificial organometallic functionality at the position of the coupling. Heteroarylation occurs when the monomers comprise at least one heteroaryl. Arylation occurs when all of the monomers are aryl. Organometallic refers to compounds which have an organic group bonded to a metal or metalloid through a carbon-metal bond. A non-limiting example of an organometallic is an organotin compound such as frequently encountered in Stille Coupling reactions.

As used herein, "under conditions for the direct arylation or heteroarylation" refers to the reaction conditions used to effect the coupling of aryl and/or heteroaryl monomers in the presence of one or more ligands and one or more catalysts as used herein. In an embodiment, these conditions comprise, consist of or consist essentially of the combining of the one or more monomers, ligands and catalysts under an inert atmosphere and optionally with an inert solvent, followed by heating. In an embodiment, the one or more monomers, ligands and catalysts and optional solvent are heated to a temperature of about 50° C. to about 200° C., or about 100° C. to about 150° C. In an embodiment an inert organic solvent is used to substantially dissolve the one or more monomers, ligands and catalysts.

The term "inert solvent" as used herein refers to any solvent or mixture of solvents in which the reagents in a chemical reaction are substantially soluble, at least to the extent to allow the chemical reaction, and which does not interfere with or inhibit the chemical reaction. The selection of a suitable inert solvent is well within the skill of a person in the art.

The expression "hydrogen that is activated for direct arylation or heteroarytion reactions" as used here in refers to hydrogen atoms on an aryl or heteroaryl group that, due to the specific structure or substitution patterns of the aryl or heteroaryl group, are reactive under direct arylation or heteroarylation conditions. By "reactive under direct arylation or heteroarylation conditions" it is meant to participate in the reaction with the catalyst(s) and ligand(s) to result in bond formation between the carbon to which the activated hydrogen is attached and a carbon to which an "X" group is attached on a second aryl or heteroaryl group. A hydrogen is activated, for example, by attaching an electron withdrawing group at a position alpha to the carbon atom containing the activated hydrogen. Non-limiting examples of electron withdrawing groups are carbonyl-containing functional groups (C(O)—R), cyano and nitro. wherein R is alkyl, cycloalkyl or O-alkyl. Alternatively, a heteroatom, such as O or S, may be located alpha to the carbon atom containing the activated hydrogen. The term "substituted" as used herein, means that a hydrogen atom of the designated moiety is replaced with a specified substituent, provided that the substitution results in a stable or chemically feasible compound. Non-limiting examples of substituents include halogen (F, Cl, Br, or I) for example Br, CN, C(O)—R and alkyl groups, wherein R is alkyl, cycloalkyl or O-alkyl.

The term "suitable" as used herein means that the selection of the particular compound or conditions would depend on the specific synthetic manipulation to be performed, and the identity of the molecule(s) to be transformed, but the selection would be well within the skill of a person trained in the art. All process/method steps described herein are to be conducted under conditions sufficient to provide the product shown. A person skilled in the art would understand that all reaction conditions, including, for example, reaction solvent, reaction time, reaction temperature, reaction pressure, reactant ratio and whether or not the reaction should be performed under an anhydrous or inert atmosphere, can be varied to optimize the yield of the desired product and it is within their skill to do so.

The expression "proceed to a sufficient extent" as used herein with reference to the reactions or process steps disclosed herein means that the reactions or process steps proceed to an extent that conversion of the starting material or substrate to product is maximized. Conversion may be maximized when greater than about 5, 10, 15, 20, 25, 30, 35, 40, 45, 50, 55, 60, 65, 70, 75, 80, 85, 90, 95 or 99% of the starting material or substrate is converted to product.

Further, the definitions and embodiments described in particular sections are intended to be applicable to other embodiments herein described for which they are suitable as would be understood by a person skilled in the art. For example, in the following passages, different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

Methods for Preparing Polymers

In one of its embodiments, the present disclosure includes a method for preparing a polymer comprising:
  (a) treating one or more monomers, one or more catalysts and one or more ligands under conditions for the direct arylation or heteroarylation of the at least one monomer to provide the polymer; and
  (b) isolating the polymer.

In another embodiment the present disclosure includes a method for preparing a polymer comprising:

(a) treating
    (i) a monomer of Formula (I) and a monomer of Formula (II):

and

(ii) one or more monomers of Formula (III):

or (iii) a monomer of Formula (III) and a monomer of Formula (IV):

and

in the presence of one or more catalysts and one or more ligands under conditions for the direct arylation or heteroarylation of the monomer of Formula (I) and monomer of Formula (II) to provide a polymer comprising repeating units of Formula (V):

for the direct arylation or heteroarylation of the monomer of Formula (III) to provide a polymer comprising repeating units of Formula (VI):

or for the direct arylation or heteroarylation of the monomer of Formula (III) and monomer of Formula (IV) to provide a random polymer comprising repeating units of Formula (VII):

wherein

H* is a hydrogen that is activated for direct arylation or heteroarylation reactions;

$X^1$, $X^2$, $X^3$ and $X^4$ are independently selected from leaving groups for direct arylation or heteroarylation reactions; and $A^1$, $A^2$, $A^3$ and $A^4$ are independently selected from aryl and heteroaryl; and (b) isolating the polymer.

In an embodiment of the disclosure, the method further comprises, prior to isolating the polymer, adding an end capping reagent to the polymer. End capping reagents are monomers, such as monomers of Formula I, that do no comprise a leaving group for direct arylation or heteroarylation reactions.

In an embodiment, the leaving groups for direct arylation and heteroarylation are selected from bromine and iodine. In a further embodiment, the leaving group is bromine.

In an embodiment of the disclosure, aryl is selected from phenyl, biphenyl, naphthyl and indanyl. In another embodiment, aryl is phenyl.

It is an embodiment of the present disclosure that $A^1$, $A^2$, $A^3$ and $A^4$ are independently selected heteroaryl. In a further embodiment, heteroaryl comprises at least one thienyl group. In a further embodiment, the at least one thienyl group is fused to a 5-membered or 6-membered heterocyclo group. In a further embodiment, the heteroaryl comprises a linear chain of 2, 3 or 4 thienyl groups. In another embodiment, heteroaryl comprises an oxindole group, an indigo group or isoindigo group.

In yet another embodiment, the heteroaryl group is selected from:

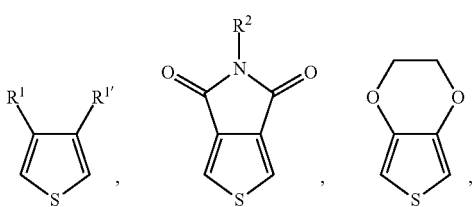

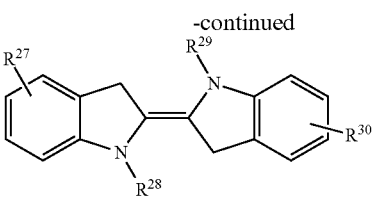

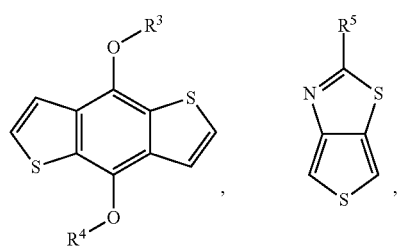

Wherein $R^1$, $R^{1'}$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$ and $R^{30}$ are independently selected from H, CN and $C_{1-30}$alkyl. In an embodiment, $R^1$, $R^{1'}$, $R^2$, $R^3$, $R^4$, $R^5$, $R^6$, $R^7$, $R^8$, $R^9$, $R^{10}$, $R^{11}$, $R^{12}$, $R^{12}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$ and $R^{30}$ are independently selected from $C_{1-30}$alkyl.

In an embodiment of the disclosure, the one or more ligands are trialkyl or triaryl phosphines, in which the alkyl and aryl groups are substituted or unsubstituted, or the corresponding phosphonium salts, or complexes thereof with metals such as palladium. Examples of substituents on the alkyl and aryl groups are $C_{1-6}$alkyl, $OC_{1-6}$alkyl and $N(C_{1-6}alkyl)_2$. Examples of phosphonium salts are $HBF_4$ salts. In a further embodiment of the disclosure, the one or more ligands are selected from: $P(t-Bu)_3HBF_4$, $P(Cy)_3 HBF_4$, $P(t-Bu)_2MeHBF_4$, $P(o-tol)_3$,.

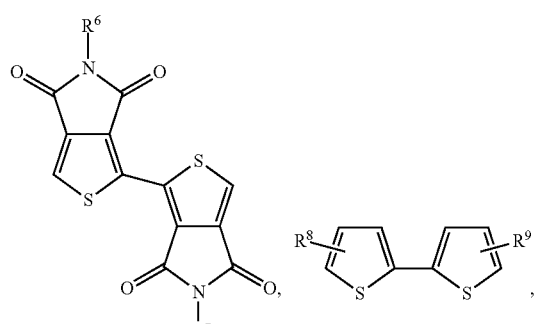

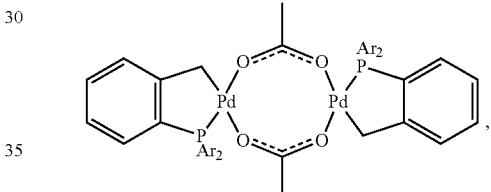

Ar = o-tolyl

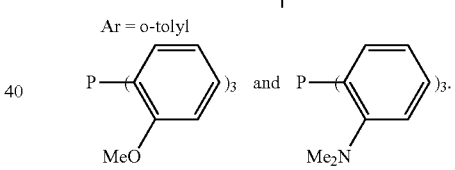

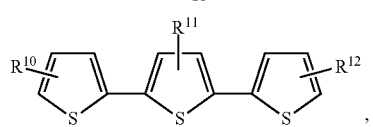

In an embodiment of the disclosure, the catalyst is a palladium (II) catalyst. In a further embodiment, the palladium catalyst is Pd(OAc)(o-Tol) or $Pd(OAc)_2$.

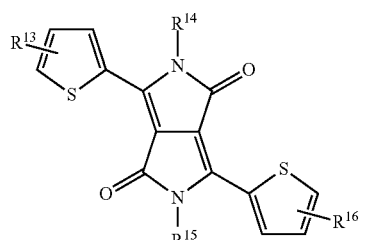

The methods of preparing polymers of the present disclosure are performed using direct arylation (if all monomers comprise only aryl groups) or heteroarylation (in at least one of the monomers comprise and heteroaryl group) conditions. In the polymerization reactions, bonds are formed between atoms in the aryl or heteroaryl groups. As noted above, arylation and heteroarylation conditions comprise, consist of, or consist essentially of reacting the one or more monomers, one or more ligands and one or more catalysts under an inert atmosphere, typically in an inert solvent (although a person skilled in the art would appreciate that the reaction could be performed without solvent, for example, if one of the reactants is a liquid in which the other reactants are soluble), and with heating. Inert atmosphere includes, for example, under nitrogen or argon. Heating temperatures will vary depending on the reactants, however, will generally be about 50° C. to about 200° C., or about 100° C. to about 150° C. Reaction times will also vary depending on the reactants, but can be determined using methods known in the art, for example, by following the

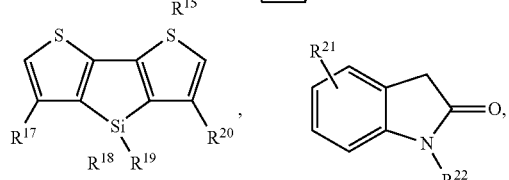

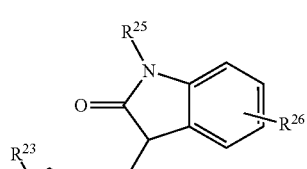

and

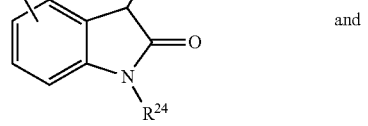

reaction progress by thin layer chromatography (TLC) or nuclear magnetic resonance (NMR) spectroscopy, and monitoring the disappearance of starting materials and/or formation of product. Reactions will be complete when a sufficient amount of the product is formed. Reaction solvents, temperatures and times are parameters that are readily selected by a person of skill in the art.

The amount and ratio of monomers used in the methods of the application will depend on the desired polymeric structure. If more than one monomer is present, each will be used in an amount that corresponds to the desired ratio of monomers in the final polymer.

In an embodiment the one or more catalysts are used in an amount of about 0.1 mol % to about 5 mol % based on the amount of monomers used. In a further embodiment, the one or more catalysts are used in an amount of about 1 mol % to about 3 mol %, or about 2 mol %, based on the amount of monomers used.

In an embodiment the one or more ligands are used in an amount of about 5 mol % to about 20 mol % based on the amount of monomers used. In a further embodiment, the one or more catalysts are used in an amount of about 7 mol % to about 10 mol %, or about 8 mol %, based on the amount of monomers used.

In a further embodiment, the method of the disclosure also includes the addition of one or more mild bases along with the one or more monomers, one or more catalysts and one or more ligands under conditions for the direct arylation or heteroarylation of the at least one monomer to provide the polymer. In an embodiment, the one or more mild bases are an inorganic mild base, such as, for example, $Cs_2CO_3$.

In an embodiment of the present disclosure, the methods further comprise adding an end-capping reagent after step (a) prior to isolating the polymer. To add the end-capping reagent, it is an embodiment that one or more monomers, ligands and catalysts that have been treated under direct arylation or heteroarylation conditions are cooled and the end-capping reagent added and the resulting mixture reheated for a time sufficient for the end-capping procedure to be completed, for example about 30 minutes to about 2 hours. In an embodiment, the end-capping reagent is a monomer used in the polymerization reaction but that does not comprising a leaving group.

The polymers of the present disclosure may be isolated using methods known in the art. In an embodiment, the polymers are isolated by cooling the reaction mixture following by precipitation, extraction, and/or chromatography.

Representative, non-limiting examples of methods of preparing specific polymers of the disclosure are described below.

Synthesis of Copolymer P1

Figure 2:
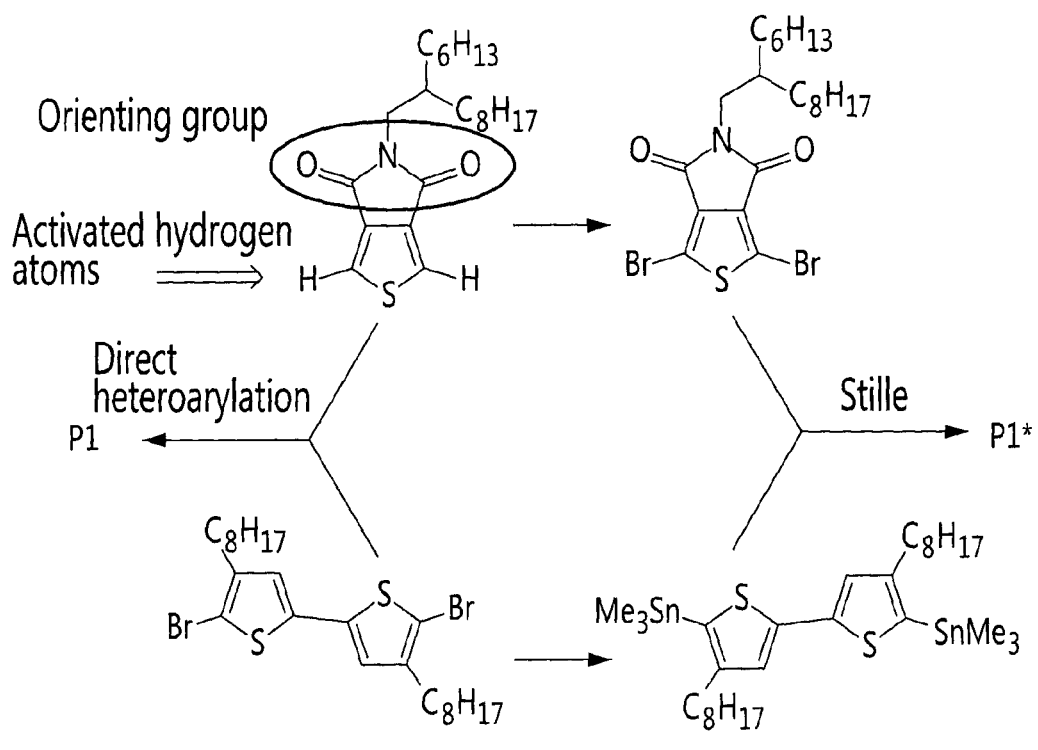
FIG. 2 is a general schematic illustration of the synthesis of copolymer P1 by both Stille and direct heteroarylation polymerization reactions.

As shown in FIG. 2, copolymer P1 was synthesized by both Stille and direct heteroarylation polymerization reactions. This copolymer is an analog of other TPD-based copolymers recently reported in highly efficient plastic solar cells[6c,9] and field-effect transistors.[7] Stille polymerization was carried out following known literature procedures (yield of 71% for the soluble fraction in chloroform). In agreement with previous polystyrene-calibrated SEC data reported for similar copolymers,[6c,7,9] Stille-polymerized P1* shows a $M_n$ of only 9 kDa. This relatively low average molecular weight is likely due to losses of some functional groups during the Stille polymerization.

In order to prepare P1 by means of direct heteroarylation polycondensation, several reaction conditions were tested (Table 1). The optimal reaction conditions were obtained using ligand (L) 1 and catalyst (Cat) 1. For the synthesis of P1, palladium acetate (2) is not as efficient as catalyst (1). It is surmised that this is probably due to the higher thermal stability of the Hermann catalyst.[5a] The temperature, time, solvent, and concentration were kept constant.[3a-h,5a-c] A high $M_n$ of 56 kDa (PDI of 2.6) and a yield of 96% (soluble fraction in chloroform) was obtained for reaction R1. Additional examples of polymerizations of TPD-based monomers using the same catalytic system are disclosed herein below in the experimental section.

Figure 3A:
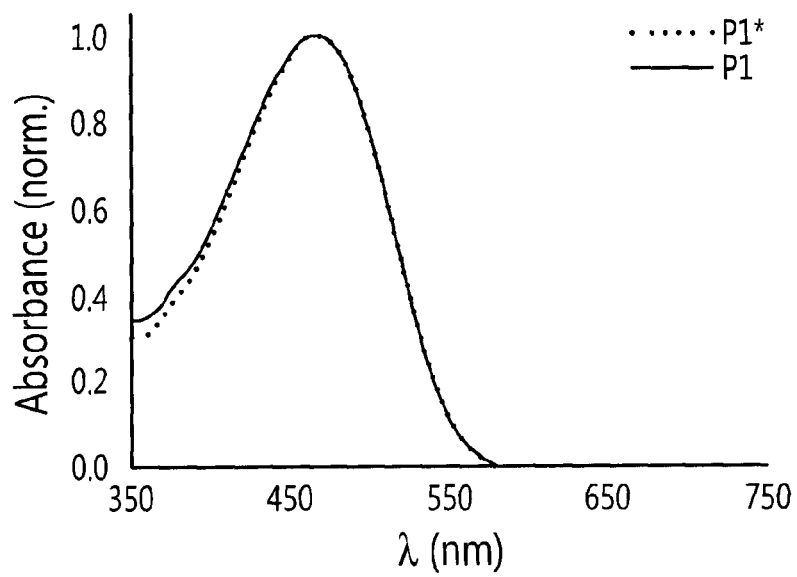
FIG. 3 is an illustration of the UV/Vis absorption spectra of P1 and P1*: a) in a chloroform solution; and b) in the solid state, in accordance with an embodiment of the present disclosure.
Figure 3B:
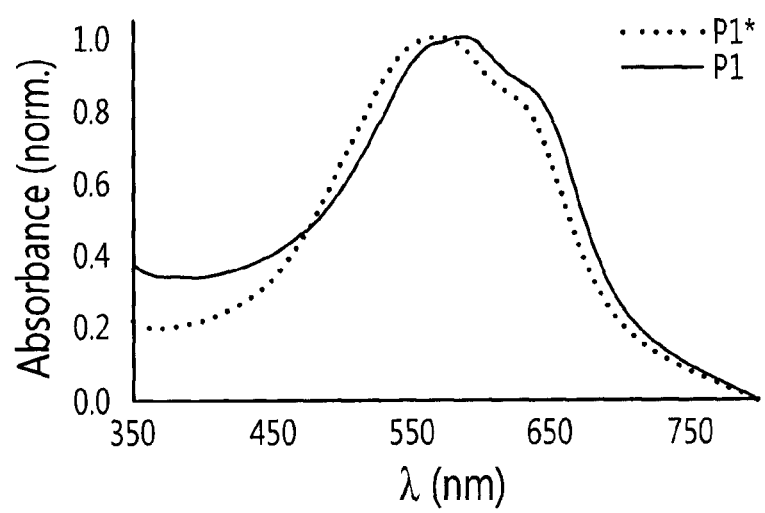

Various spectroscopic methods were utilized in order to further characterize the polymers. For instance, the UV-vis absorption spectra of P1 and P1* exhibit similar features (FIG. 3a) with an absorption maximum at 470 nm in chloroform solution. This absorption maximum is in good agreement with previous data reported for similar alternating copolymers.[7,9] On the other hand, the solid-state UV-vis absorption spectra are slightly different (FIG. 3b). The absorption maximum of P1 (598 nm) is red shifted by approximately 26 nm compared to P1* (572 nm). Apart the absorption maxima, these UV-vis absorption spectra are quite similar; showing a vibronic fine structure and a bandgap of about 1.75 eV. This small difference for the UV-vis spectra is likely a direct result of the different molecular weights and/or a slightly different morphology in the solid state.

Figure 4:
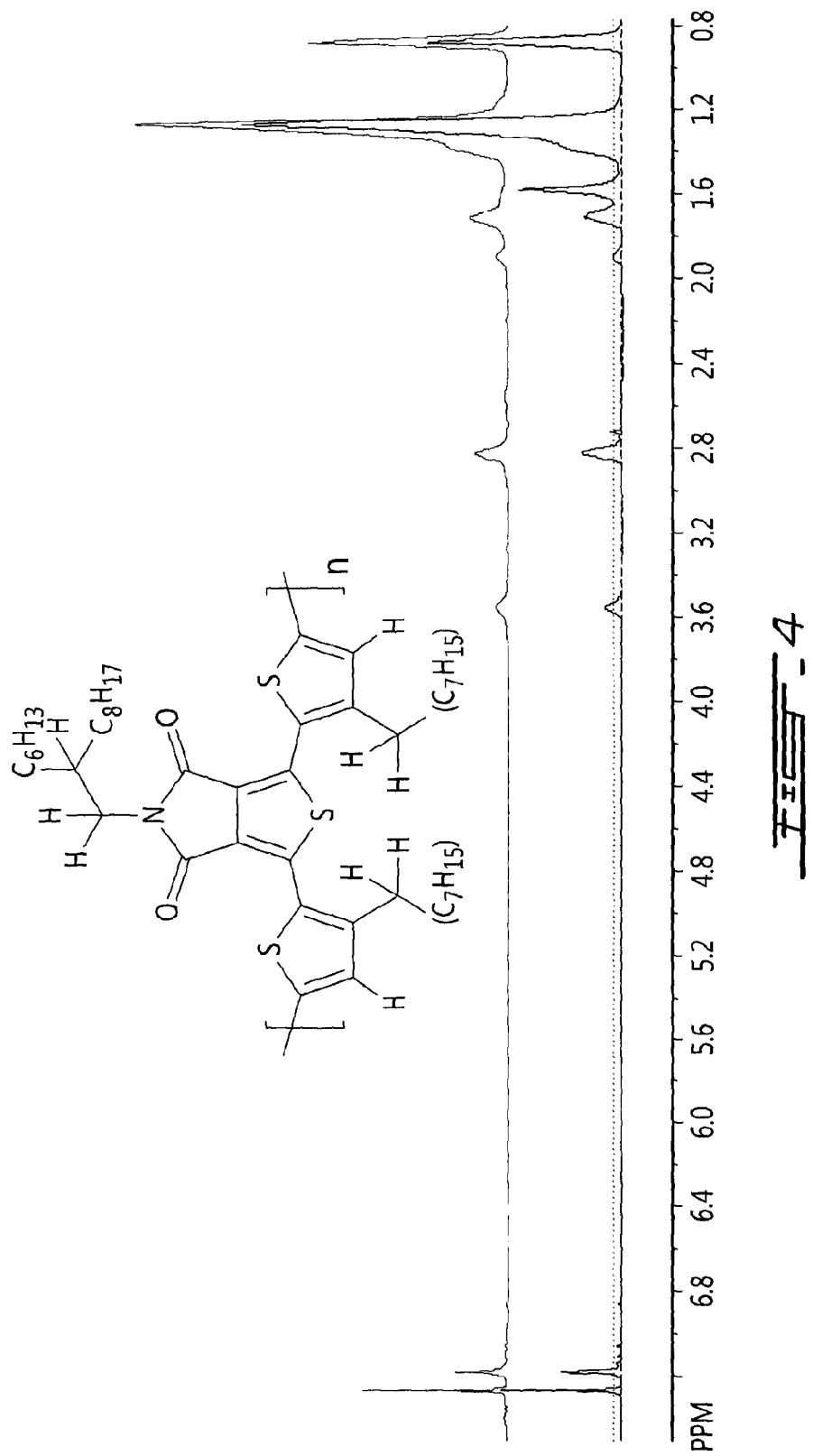
FIG. 4 is an illustration of the $^1$H NMR spectra of P1 (top) and P1* (lower) in CDCl$_3$ in accordance with an embodiment of the present disclosure.

The $^1H$ NMR spectra confirmed that both P1 and P1* correspond to an alternating copolymer (FIG. 4). These $^1H$ NMR spectra are substantially similar to those previously reported by Marks et al.[7] for analogous polymers, the only difference being the alkyl side-chains. As previously reported, different small peaks can be observed for P1* around 6.8-7.1, 3.5, and 2.7 ppm, which are likely due to the end-groups. Not surprisingly, such extra peaks are barely observed for the high molecular weight P1 copolymer. Moreover, for both P1 and P1*, a small broad peak (with a relative integration of about 2%) can be observed near 2.55 ppm, which may be tentatively related to some end groups and/or the presence of some bithiophene-bithiophene couplings (a side reaction), leading to so-called head-to-head couplings.[10] This extra and broad peak can also be observed in some $^1H$ NMR spectra reported by Marks et al. for similar copolymers.

Figure 5:
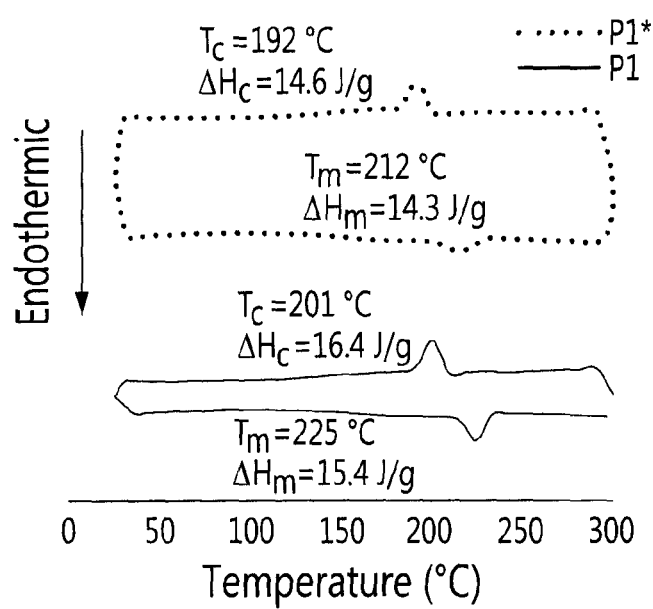
FIG. 5 is an illustration of the DSC thermograms for P1 and P1* in accordance with an embodiment of the present disclosure.
Figure 6A:
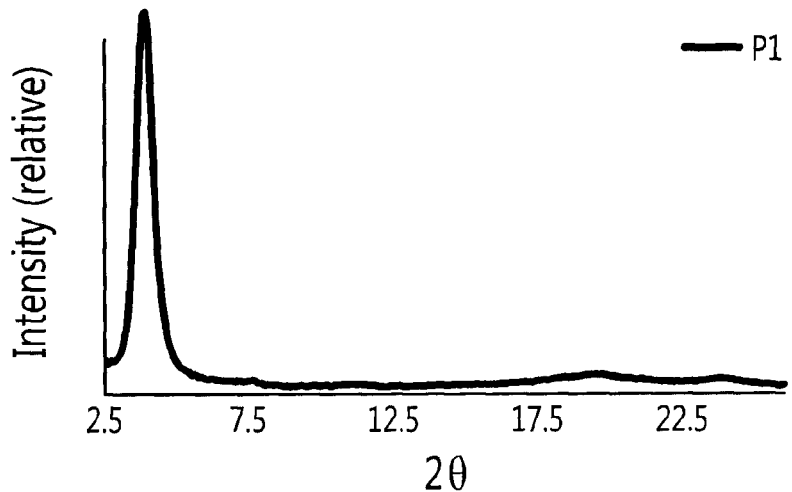
FIG. 6 is an illustration of the X-ray diffraction patterns for P1 (FIGS. 6a) and P1* (FIG. 6b) in accordance with an embodiment of the present disclosure.
Figure 6B:
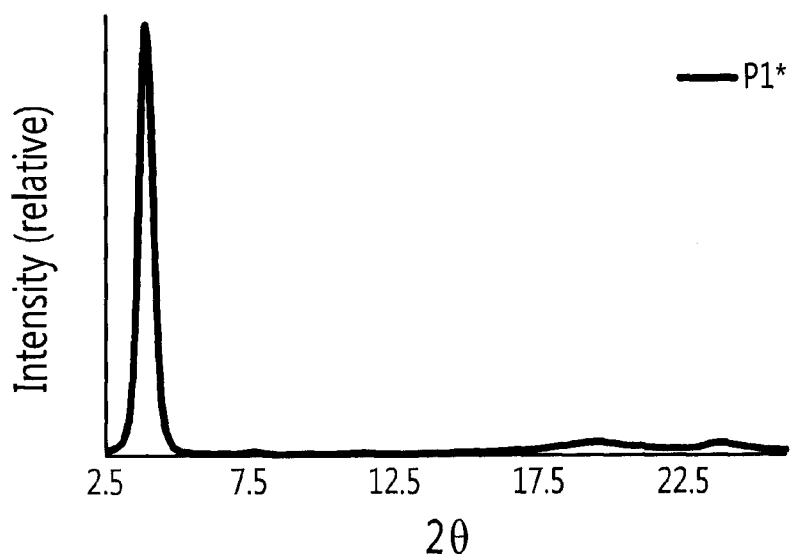
Figure 7:
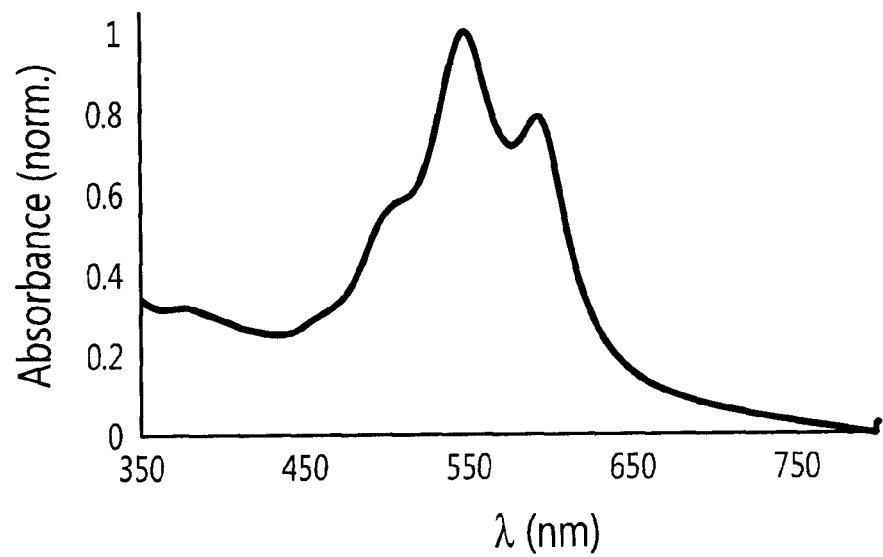
FIG. 7 is an illustration of the UV-vis absorption spectrum of P2 in the solid state in accordance with an embodiment of the present disclosure.
Figure 8:
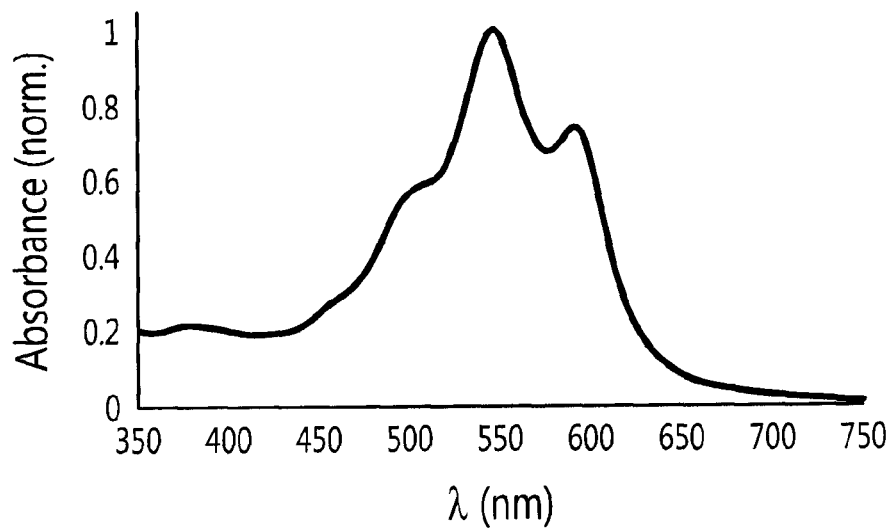
FIG. 8 is an illustration of the UV-vis absorption spectrum of P3 in the solid state in accordance with an embodiment of the present disclosure.
Figure 9:
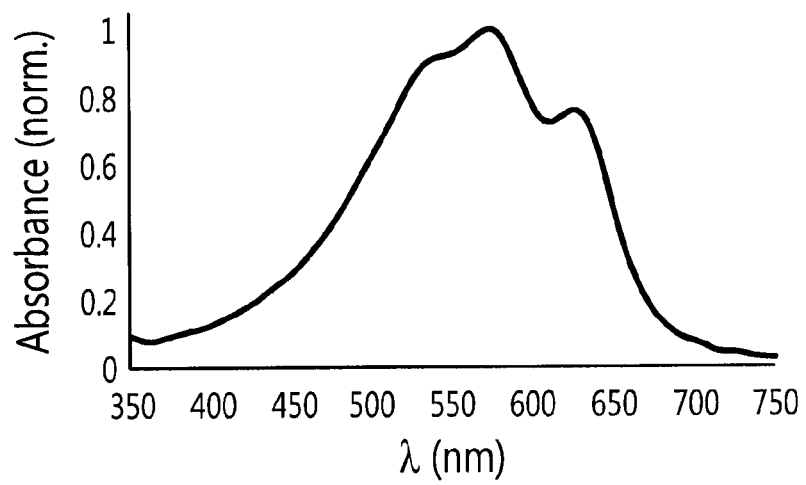
FIG. 9 is an illustration of the UV-vis absorption spectrum of P4 in the solid state in accordance with an embodiment of the present disclosure.
Figure 10B:
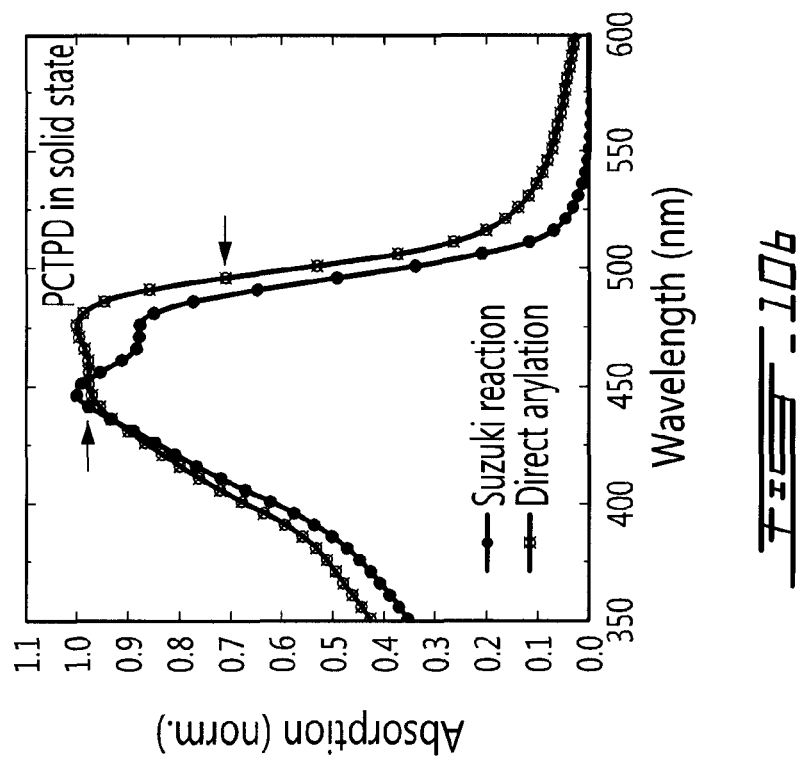
FIG. 10 is an illustration of the UV-vis absorption spectra of PCTPD synthesized by Suzuki and direct arylation reaction, in CHCl₃ solution (a) and in the solid state (b), in accordance with an embodiment of the present disclosure.
Figure 10A:
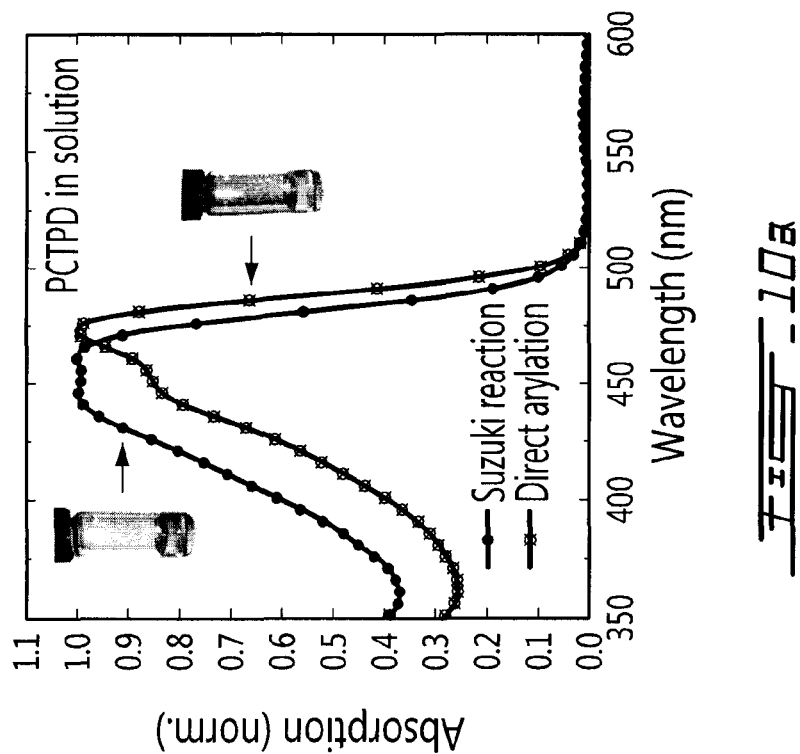
Figure 11:
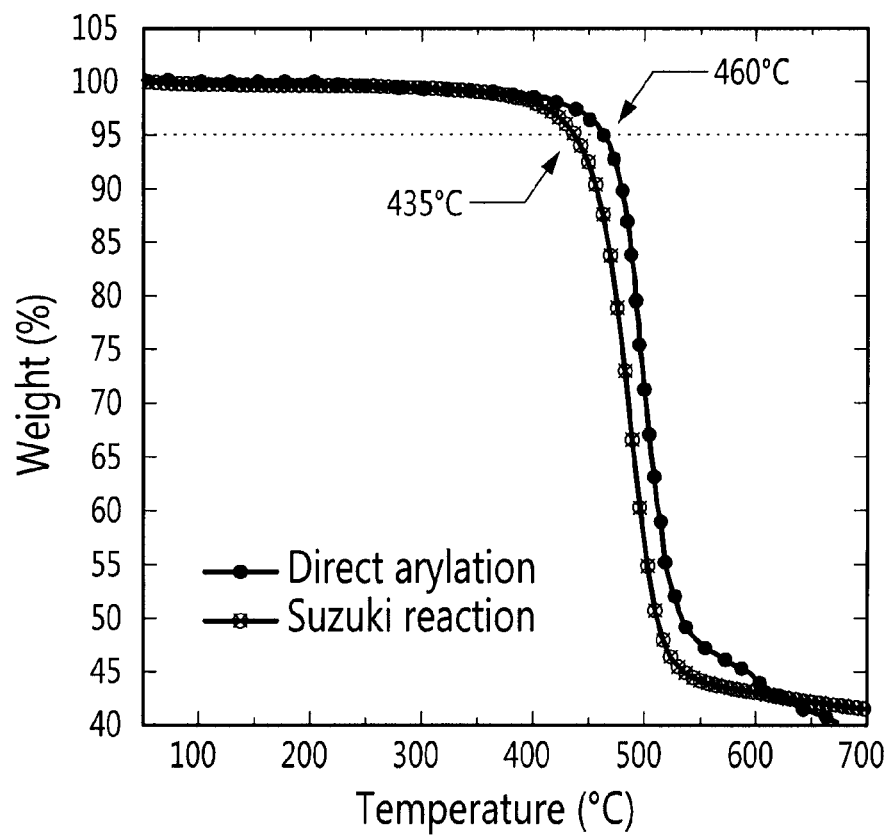
FIG. 11 is an illustration of the TGA curve for PCTPD synthesized by Suzuki and by direct arylation reaction (heating rate of 20 K/min.), in accordance with an embodiment of the present disclosure.

To further validate the structural regularity of these alternating copolymers, thermal and X-ray analyses were performed. The DSC thermograms of both P1 and P1* present some well-defined crystallisation and melting peaks (FIG. 5). The enthalpies of crystallisation ($\Delta H_c$) and melting ($\Delta H_m$) are slightly higher for P1 ($\Delta H_c$=16.4 J/g and $\Delta H_m$=15.4 J/g) than for P1* ($\Delta H_c$=14.6 J/g and $\Delta H_m$=14.3 J/g) which indicates a more important degree of crystallinity for P1. The higher melting point for P1 also indicates a better stability of the crystal, which is probably related to the higher molecular weight. The XRD diffraction patterns (FIG. 6) show similar features for both polymers, indicative that P1 and P1* are similarly organized in the solid state. Consequently, the red-shifted solid-state optical spectrum of P1 (FIG. 3b) should be mainly related to a higher molecular weight.

Synthesis of Copolymers P5, P6-P8, P9-P20, P21, P22-29, P30-33, P34-36 and P37-39

As shown in Scheme 1 hereinbelow, copolymer P5 was synthesized by both Stille cross-coupling and direct heteroarylation polymerization reactions. Polymers P6-P8 were prepared by direct heteroarylation polymerization reactions (c.f. Scheme 20). Polymers P9-P20 were prepared by direct heteroarylation polymerization reactions (c.f. Experimental section). The synthesis of polymer P21 by direct heteroarylation is illustrated in Scheme 2. The synthesis polymers P22-29 by direct heteroarylation is illustrated in Scheme 3.

The synthesis polymers P30-33 by direct heteroarylation is illustrated in Scheme 21. The synthesis polymers P34-36 by direct heteroarylation is illustrated in Scheme 22. The synthesis polymers P37-39 by direct heteroarylation is illustrated in Schemes 23-25.
Scheme 1
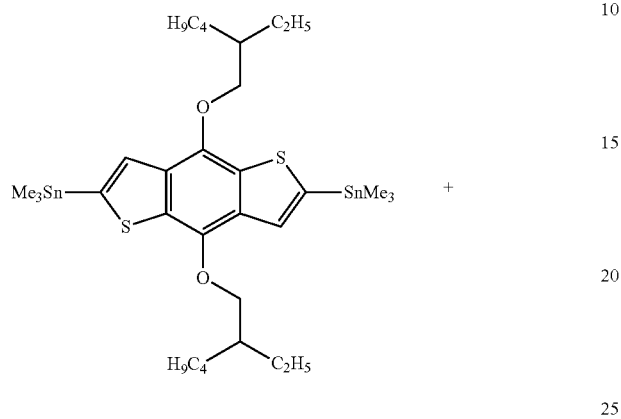
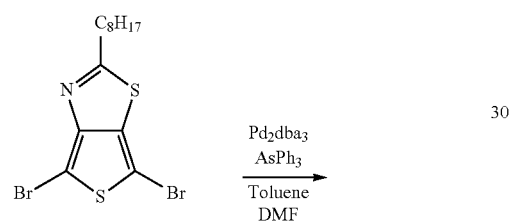
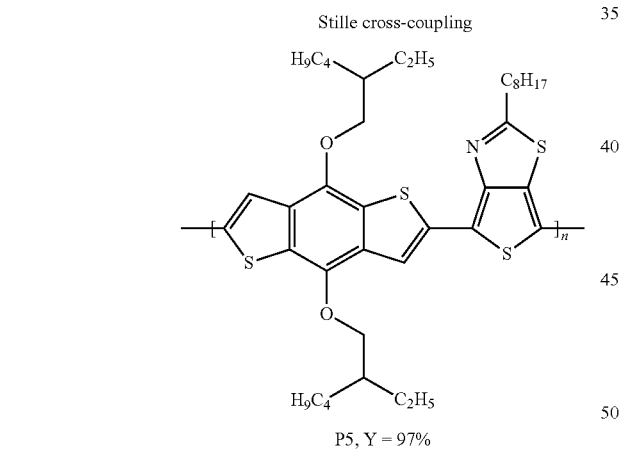
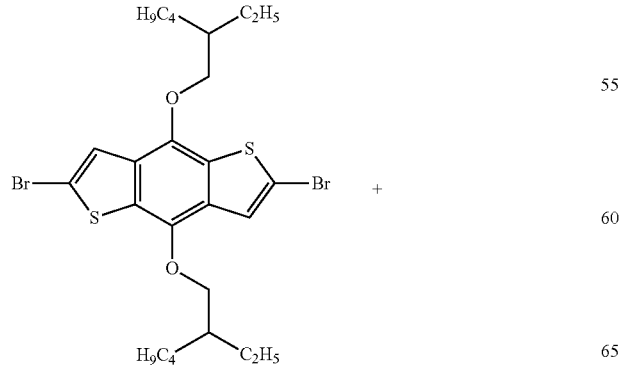
-continued
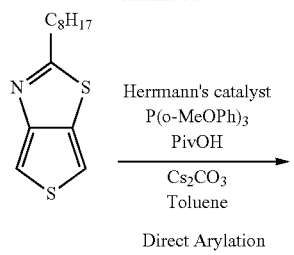
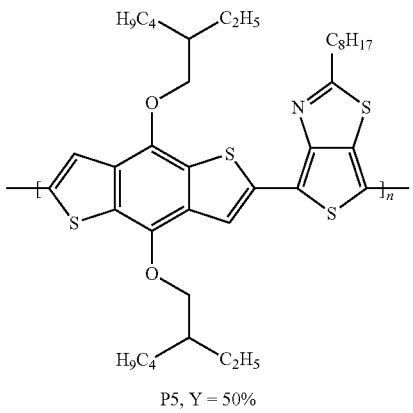
Scheme 2
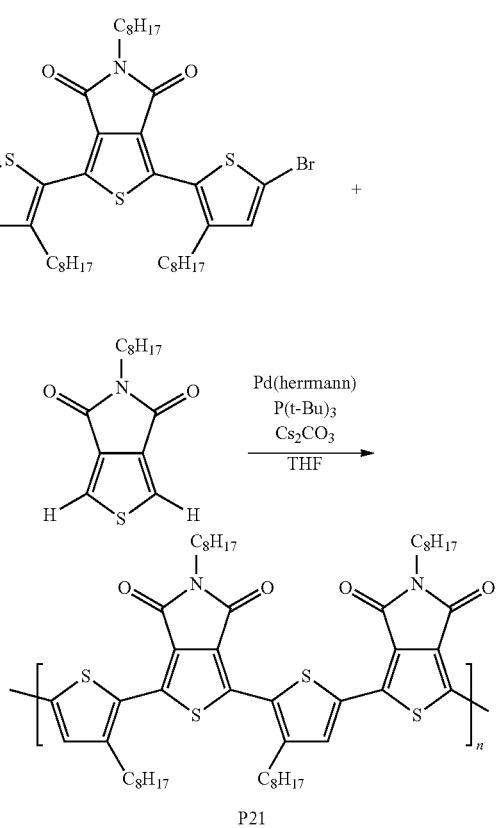

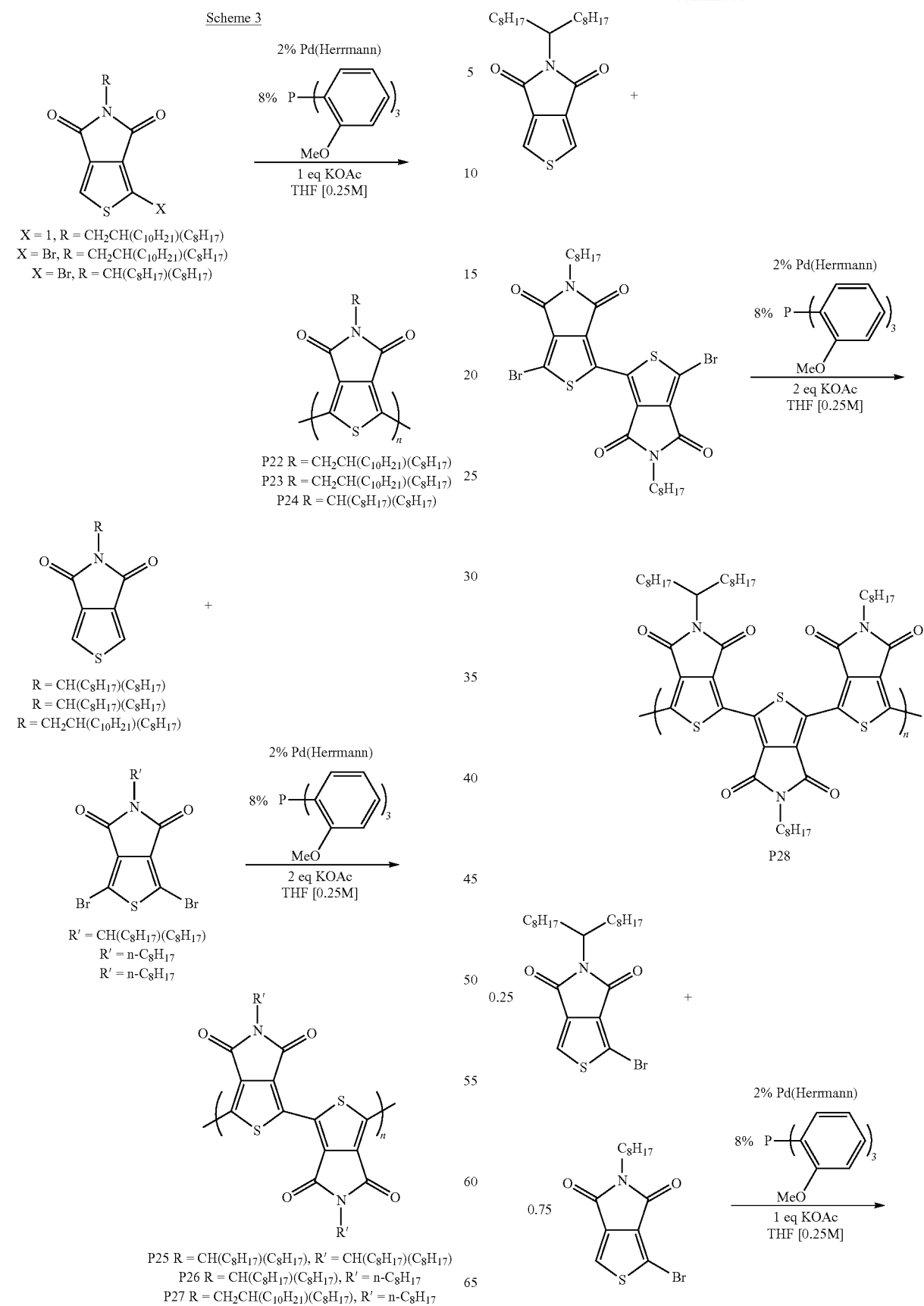

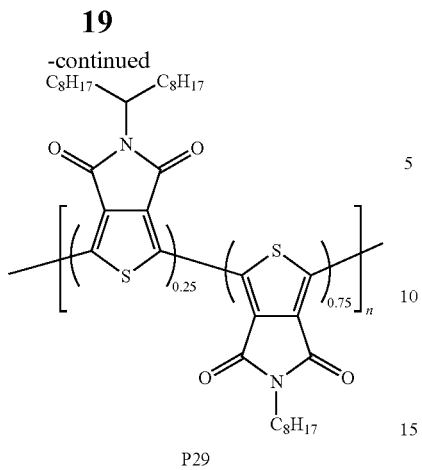

P29

Figures 12A, 12B:
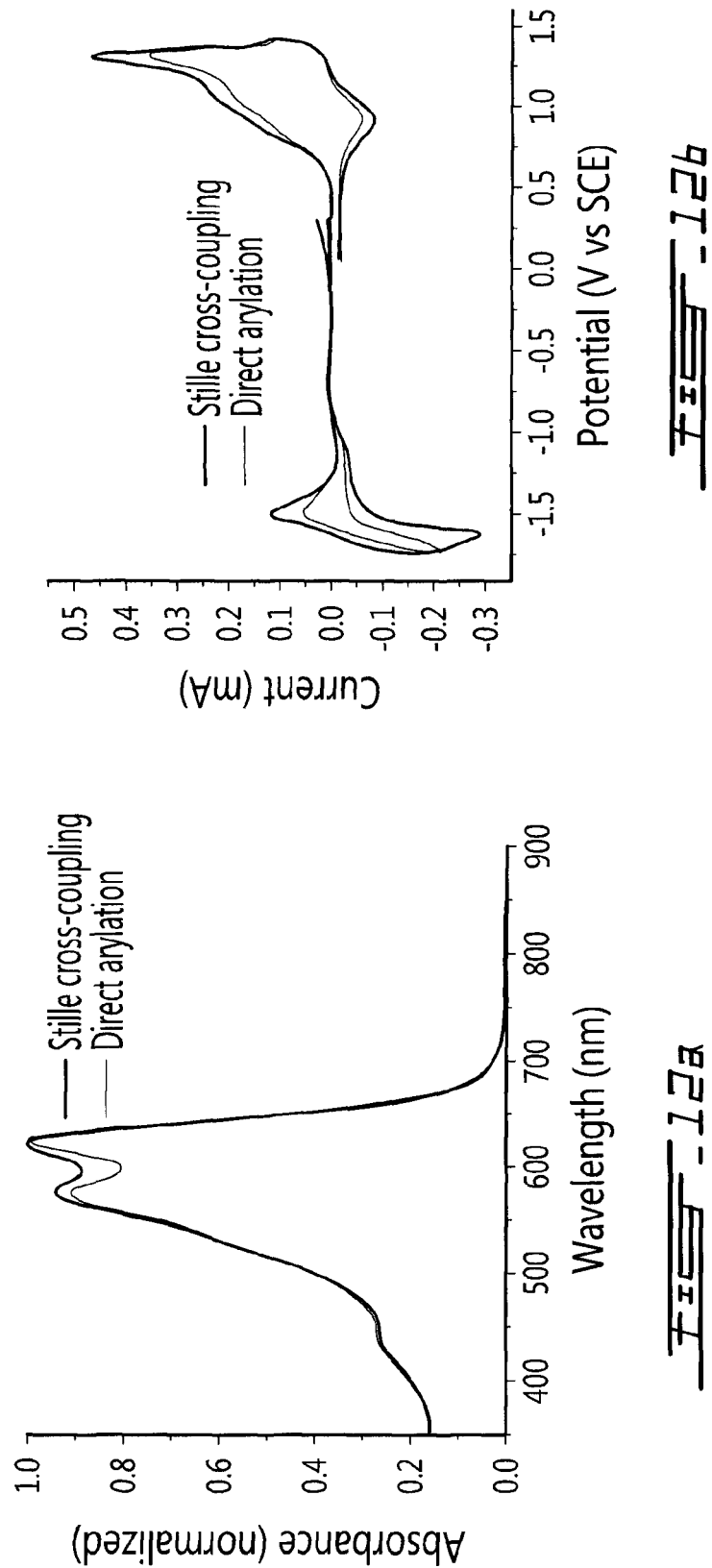
FIG. 12 is an illustration of the UV-vis absorption spectrum of P5 synthesized by both Stille cross-coupling and direct arylation polymerization reaction (A); and a cyclic voltammogram illustrating the reduction potential of P5 (B), in accordance with an embodiment of the present disclosure.
Figures 13A, 13B, 13C, 13D, 13E, 13F, 13G, 13H, 13I:
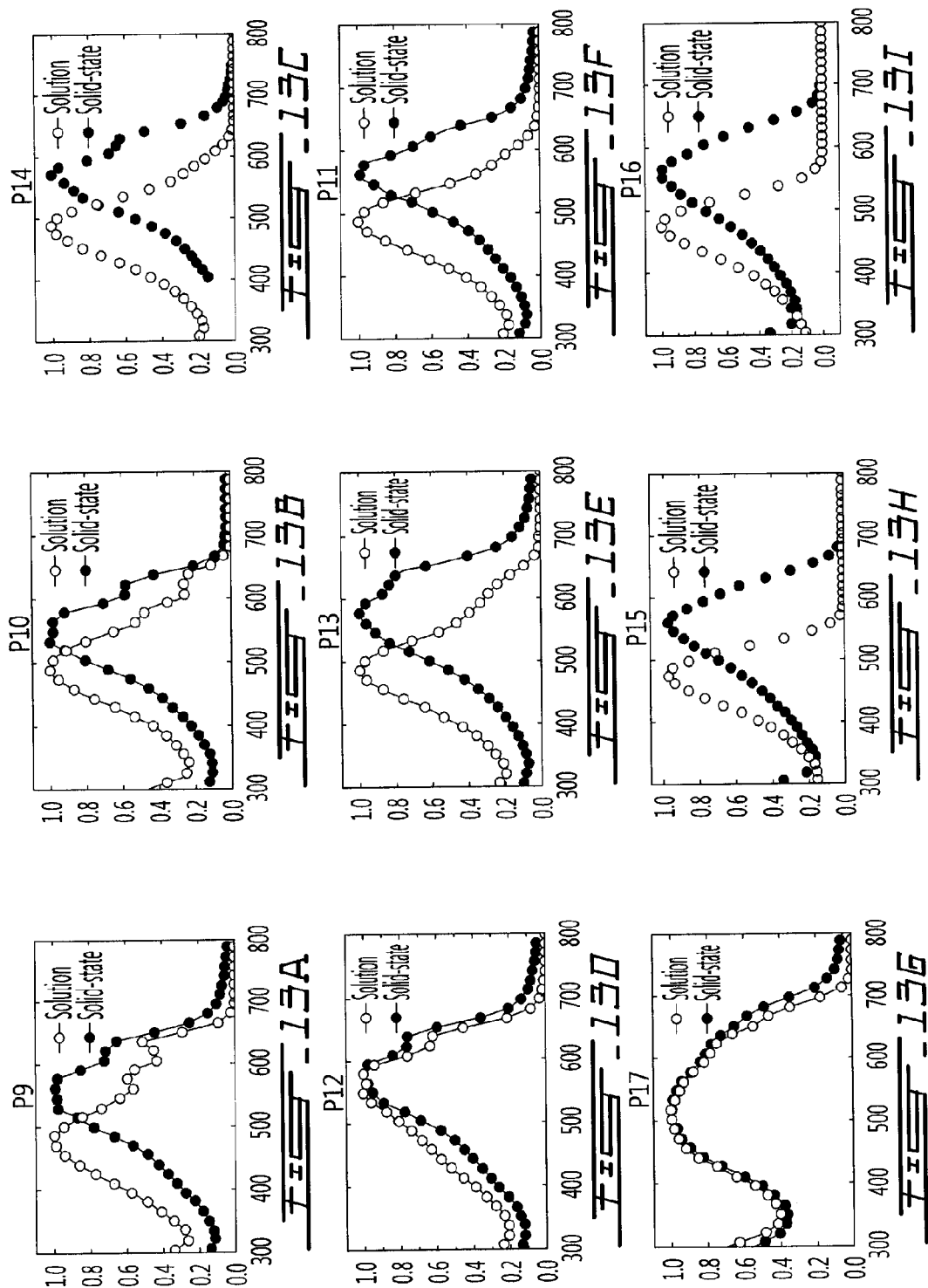
FIG. 13 is an illustration of the UV-vis absorption spectra for polymers P9-P17 synthesized by direct arylation reaction in both solution and in the solid state, in accordance with an embodiment of the present disclosure.
Figure 14:
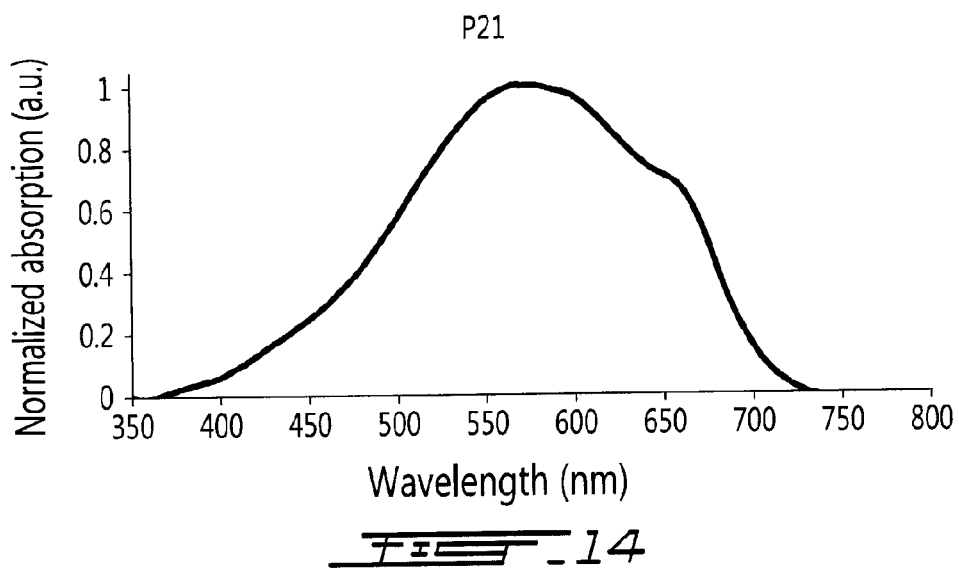
FIG. 14 is an illustration of the UV-vis absorption spectrum of P21 synthesized by direct arylation reaction, in accordance with an embodiment of the present disclosure.
Figure 15:
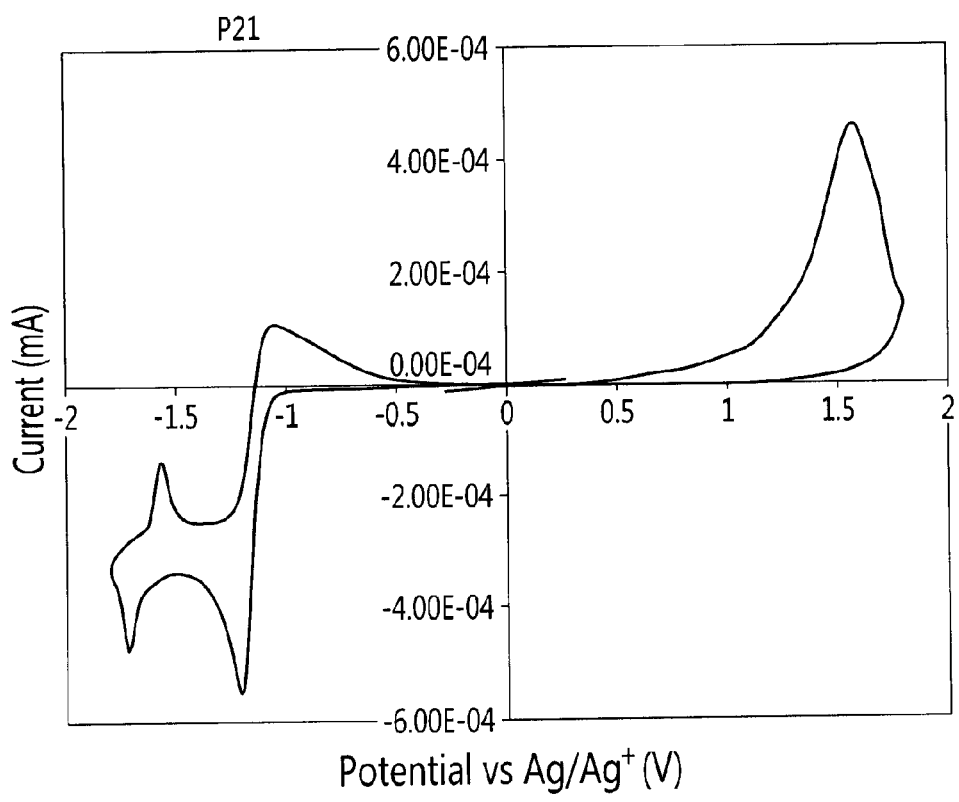
FIG. 15 is an illustration of a cyclic voltammogram illustrating the reduction potential of P21, in accordance with an embodiment of the present disclosure.
Figure 16:
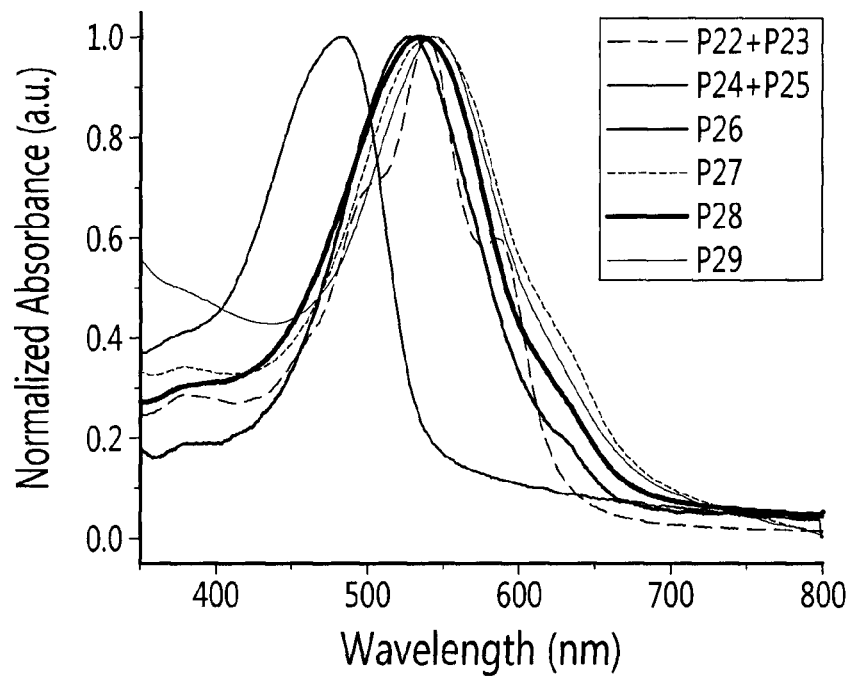
FIG. 16 is an illustration of the UV-vis absorption spectra in CHCl₃ solution for P22-29 synthesized by direct arylation reaction, in accordance with an embodiment of the present disclosure.
Figure 17:
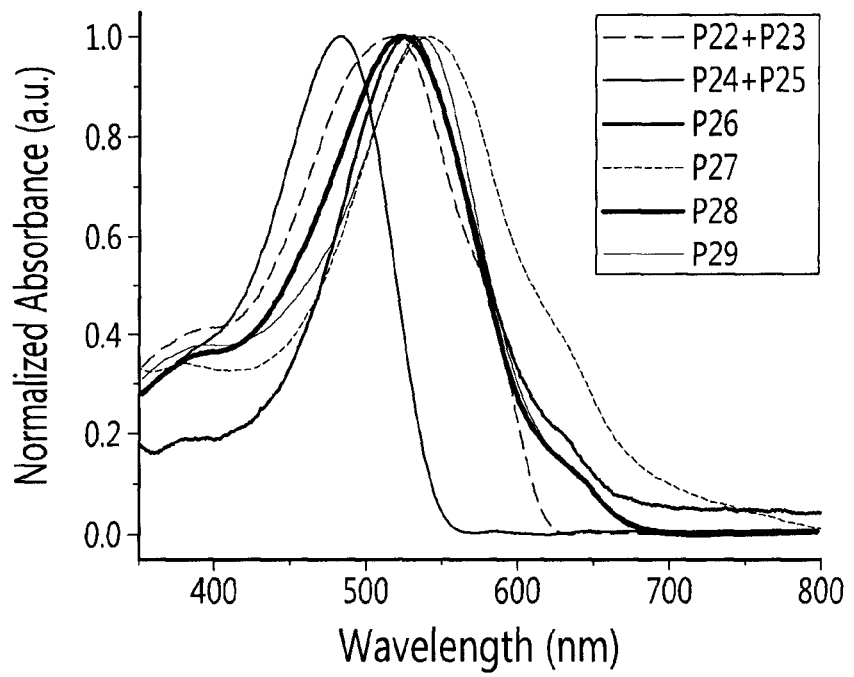
FIG. 17 is an illustration of the solid state UV-vis absorption spectra for P22-29 synthesized by direct arylation reaction, in accordance with an embodiment of the present disclosure.
Figure 18A:
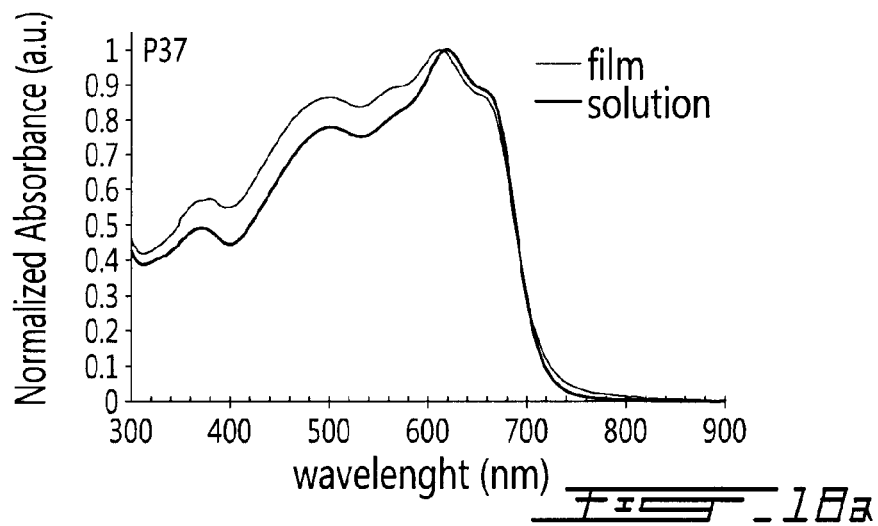
FIG. 18 is an illustration of the UV-vis absorption spectra of P37-39 in thin films and in a chloroform solution, in accordance with an embodiment of the present disclosure.
Figure 18B:
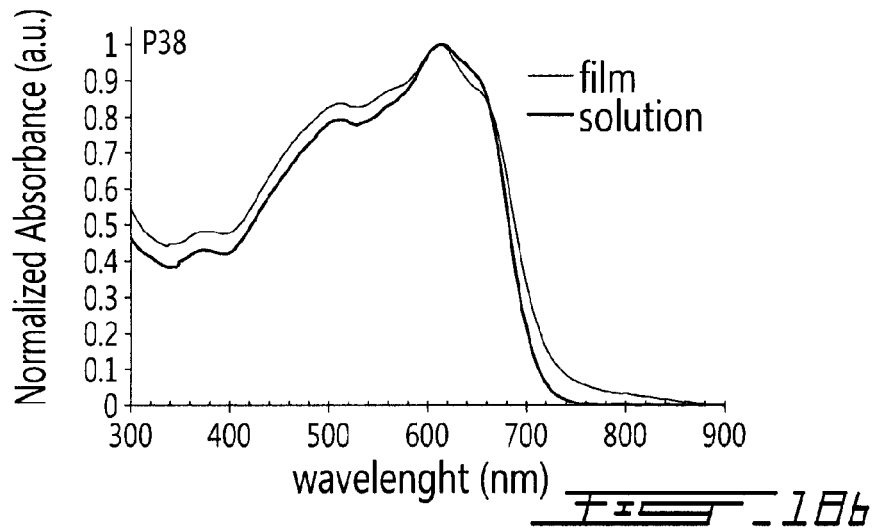
Figure 18C:
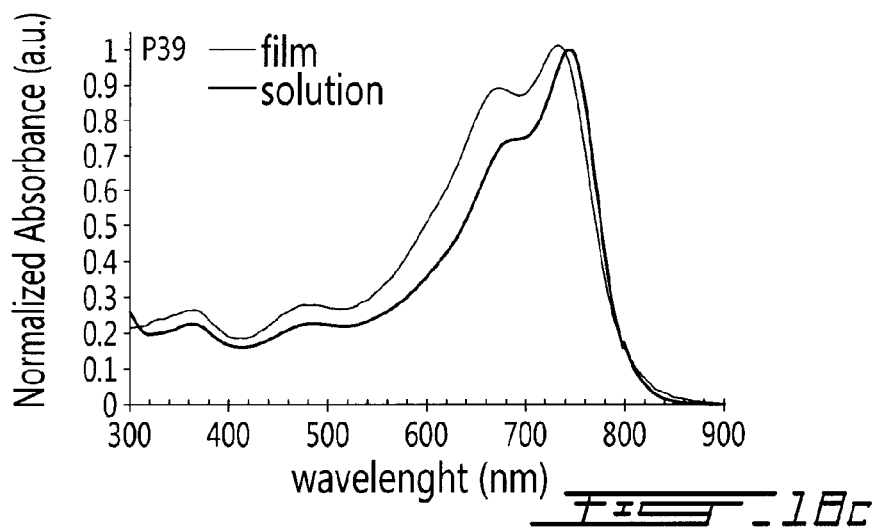
Figure 19A:
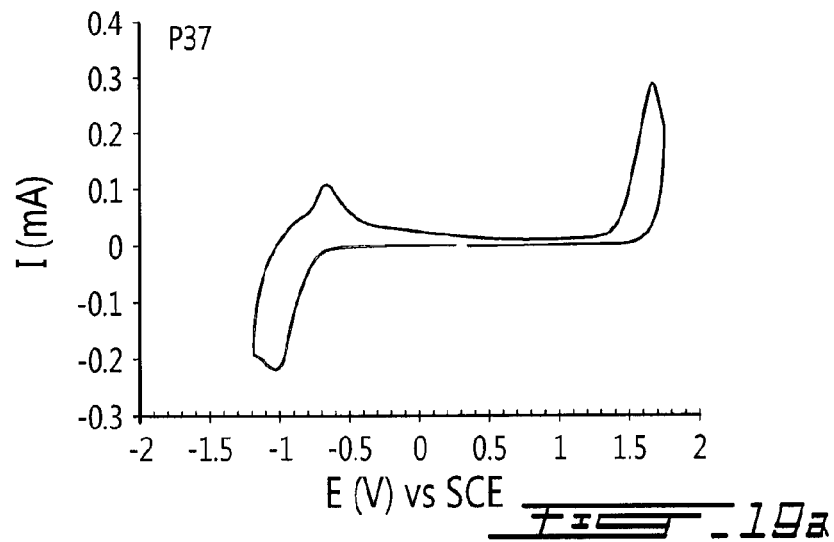
FIG. 19 is an illustration of cyclic voltammograms illustrating the reduction potential of isoindigo copolymers P37-39, in accordance with an embodiment of the present disclosure.
Figure 19B:
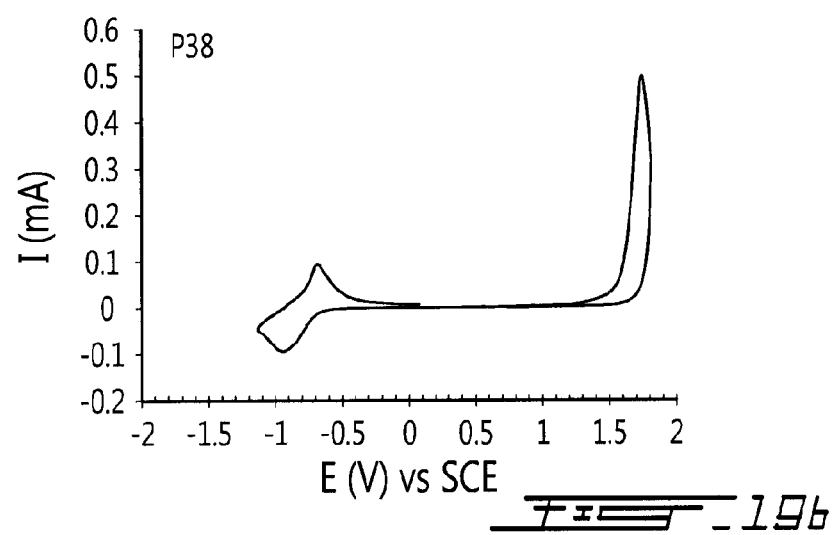
Figure 19C:
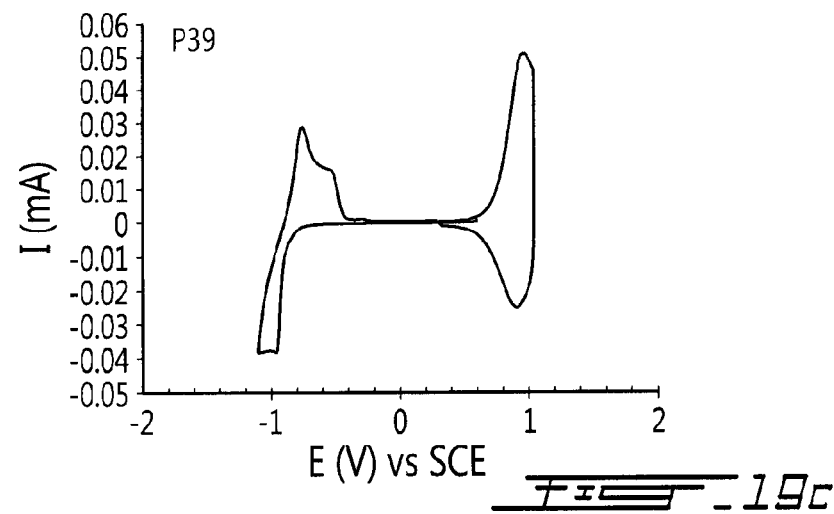

Various spectroscopic methods were utilized in order to further characterize P5 (FIG. 12). The number average molecular weight ($M_n$), weight average molecular weight ($M_w$) and polydispersity index ($I_p$) for P5 as obtained by both Stille cross-coupling and direct heteroarylation polymerization, are illustrated in Table 2. Various optical and electronic properties for polymers P9-P18 are illustrated in Table 3. Various physical, optical and electronic properties for polymer P21 are illustrated in Table 4. Various physical, thermal, spectroscopic and electrochemical properties for polymers P22-29 are illustrated in Tables 5 and 6.

The monomers can be prepared using methods available in the art. Exemplary methods for the preparation of various intermediates and monomers (2-18, 29-31) to be used in the direct heteroarylation polycondensation reactions, in accordance with an embodiment of the present disclosure, is illustrated herein below in Schemes 4-16.

Synthesis of Intermediate 3

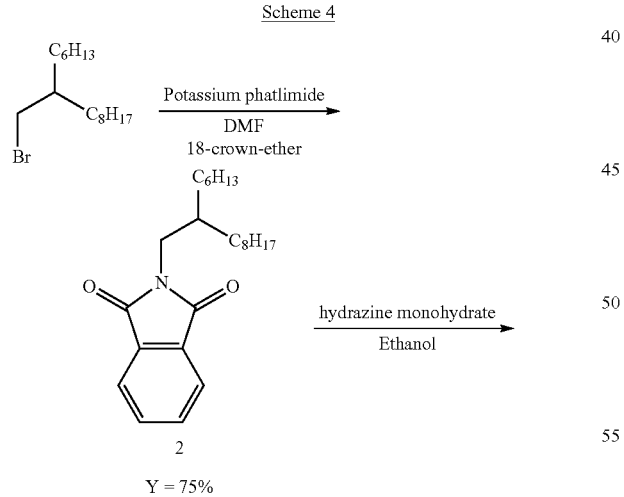

Synthesis of Monomer 4

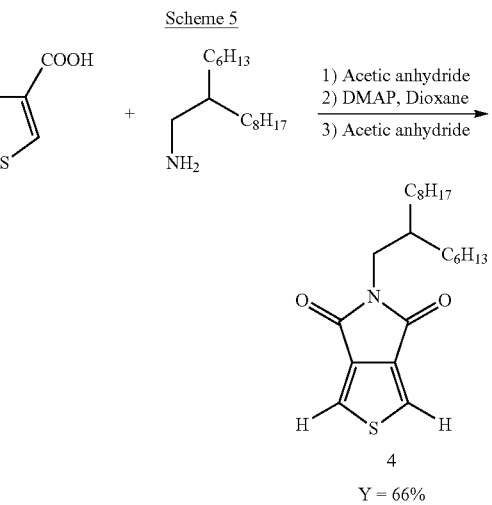

Synthesis of Monomer 6

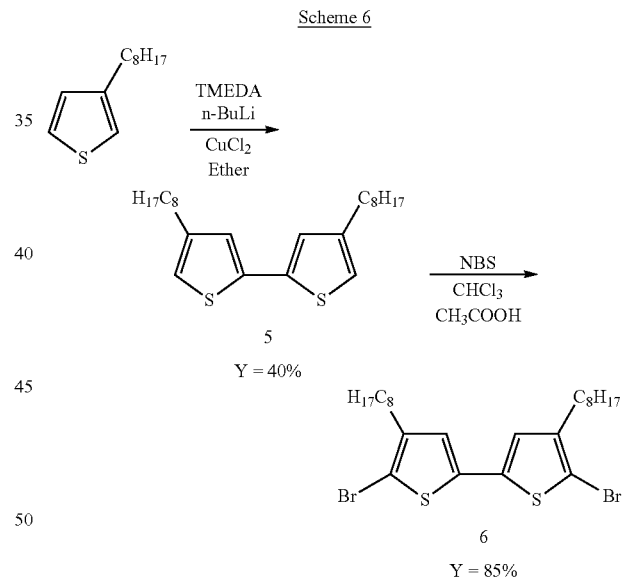

Synthesis of Monomer 7

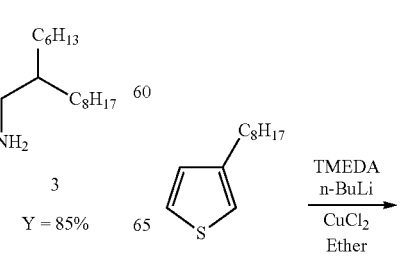

-continued
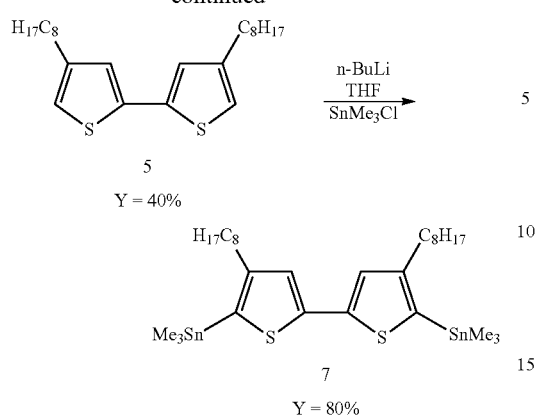
Synthesis of Monomer 8
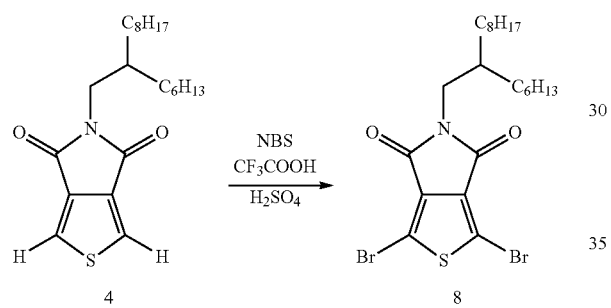
Synthesis of Monomer 9
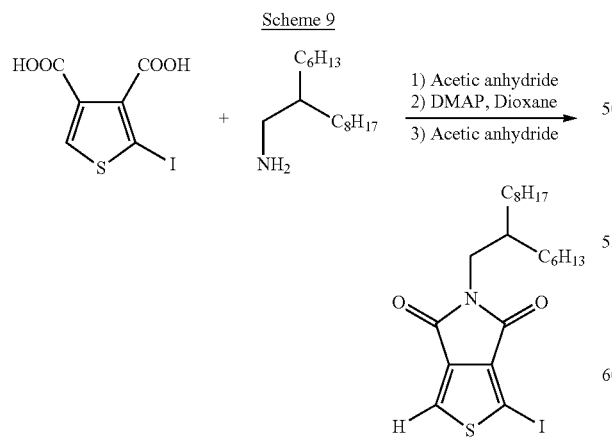
Synthesis of Monomer 10
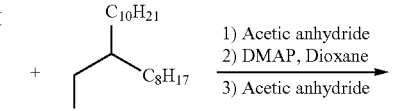
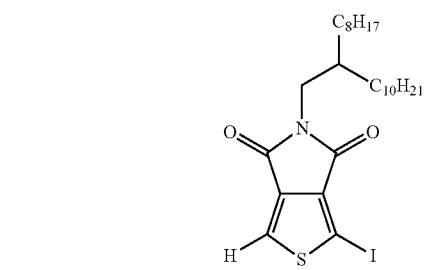
Synthesis of Monomer 12
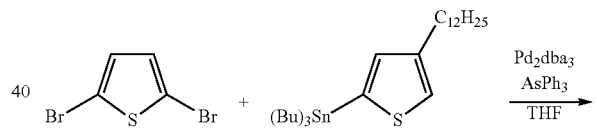
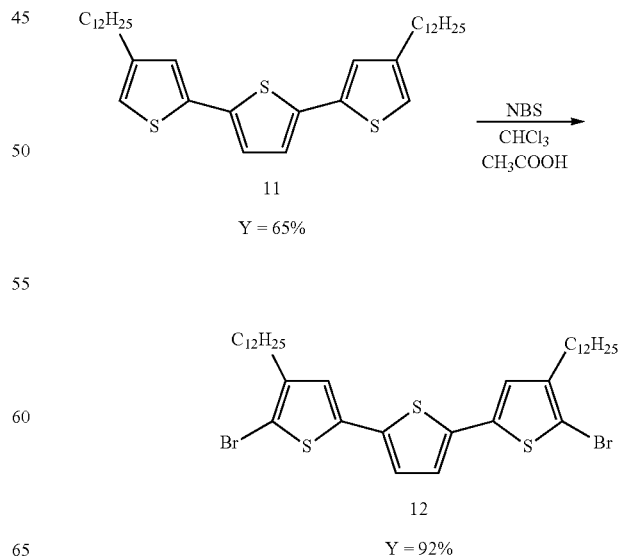

Synthesis of Monomer 13
Scheme 12
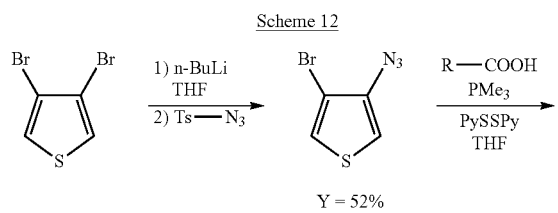
Y = 52%
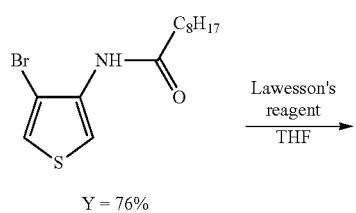
Y = 76%
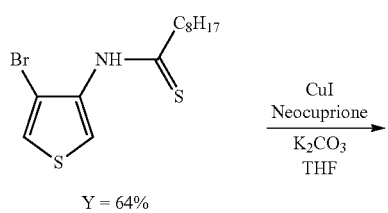
Y = 64%
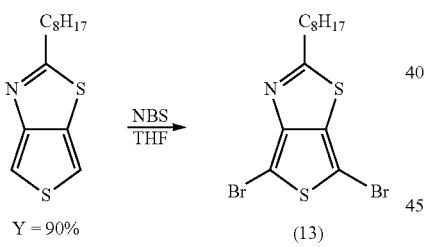
Y = 90%    (13)
Y = 78%
Synthesis of Monomers 14–16
Scheme 13
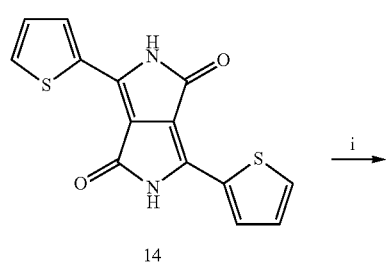
14
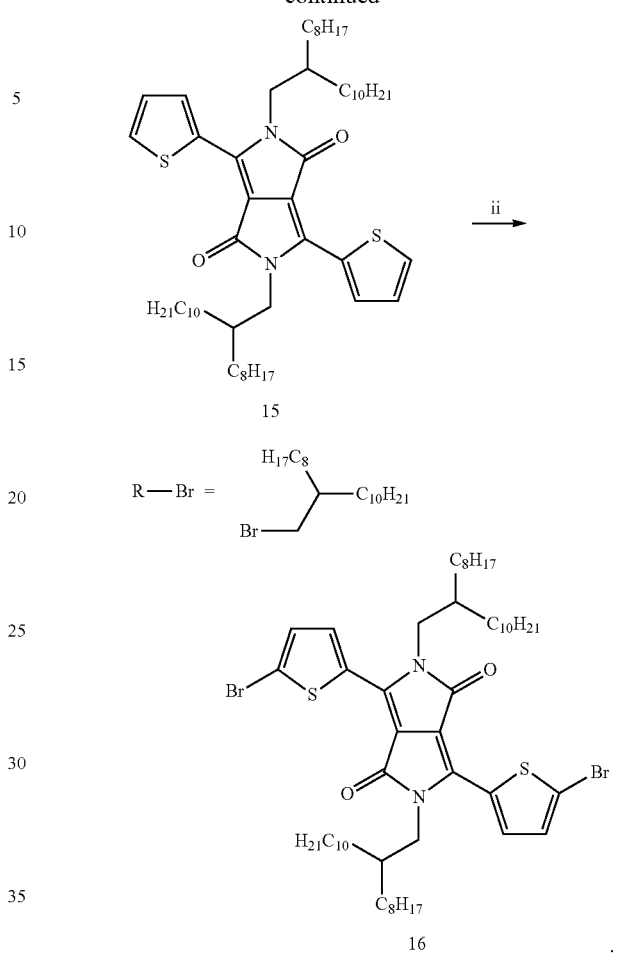
15
16
i) R—Br, K$_2$CO$_3$, DMF, 80° C. for 48 h, 16% yield;
ii) NBS, CHCl$_3$, 25° C. for 24 h, 95% yield.
Synthesis of Monomers 17 and 18
Scheme 14
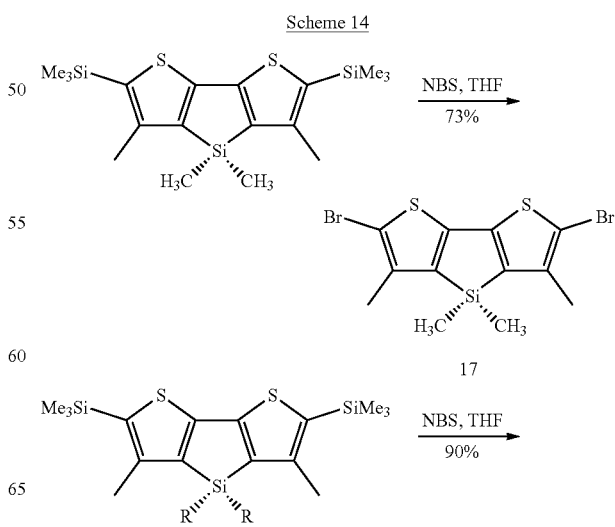
17

-continued
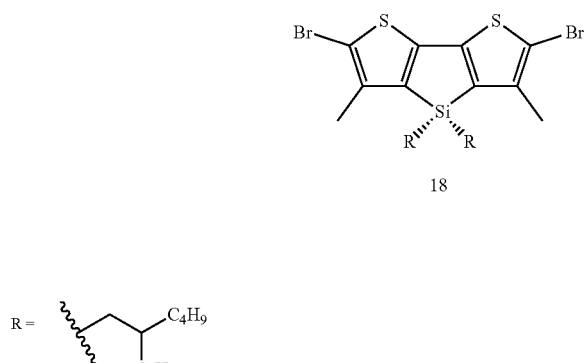
Synthesis of Monomer 29
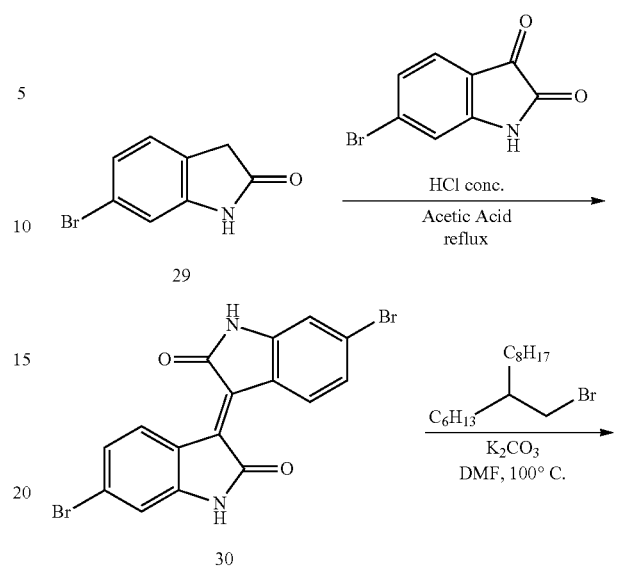
-continued
Scheme 15
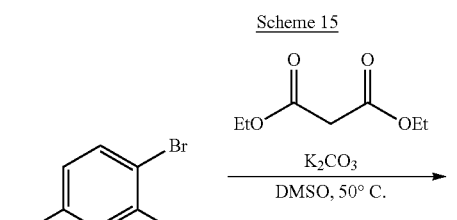
Synthesis of Monomers 30 and 31
Scheme 16
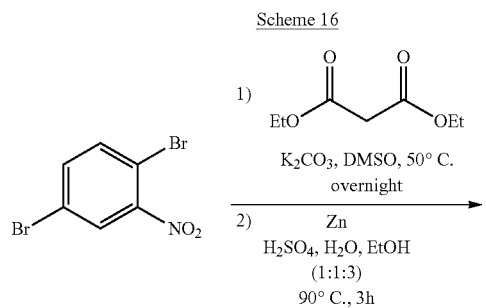
Additional monomers (19-28), in accordance with an embodiment of the present disclosure, are illustrated hereinbelow in Schemes 17, 18 and 19.
Scheme 17
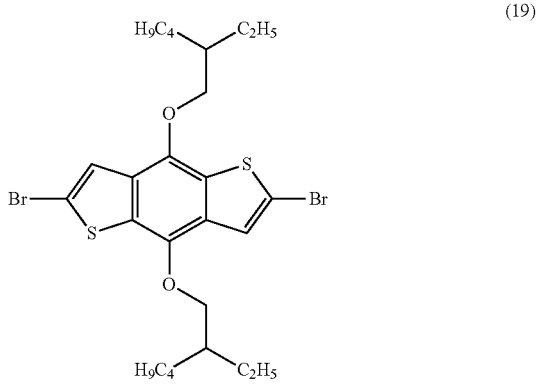

-continued
(20)
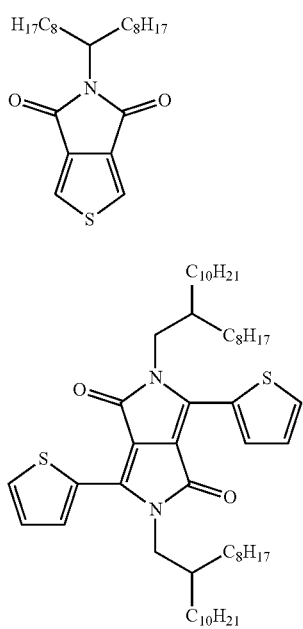
(21)
(22)
Scheme 18
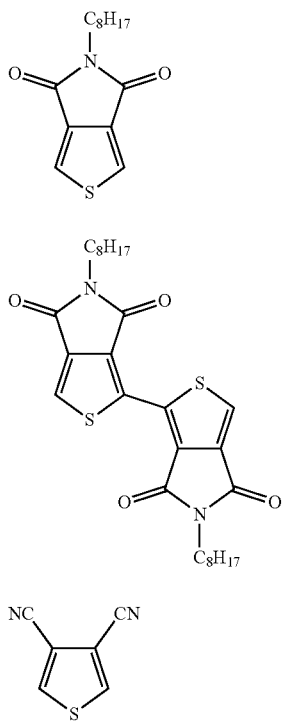
-continued
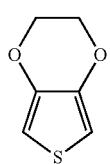
Scheme 19
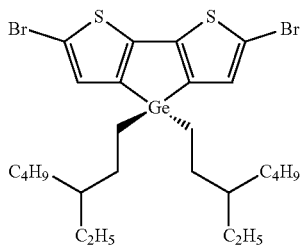
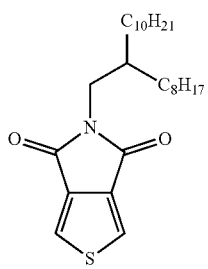
The synthesis of additional copolymers P6-P8 by direct heteroarylation is illustrated hereinbelow in Scheme 20.
Scheme 20
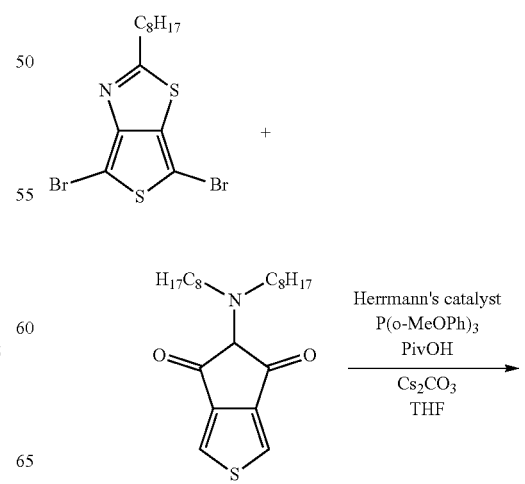

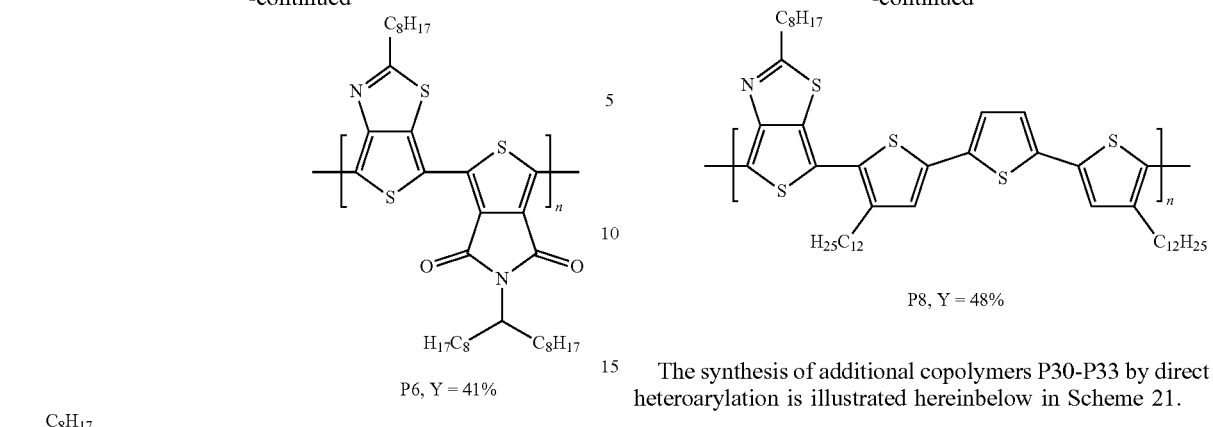
P6, Y = 41%
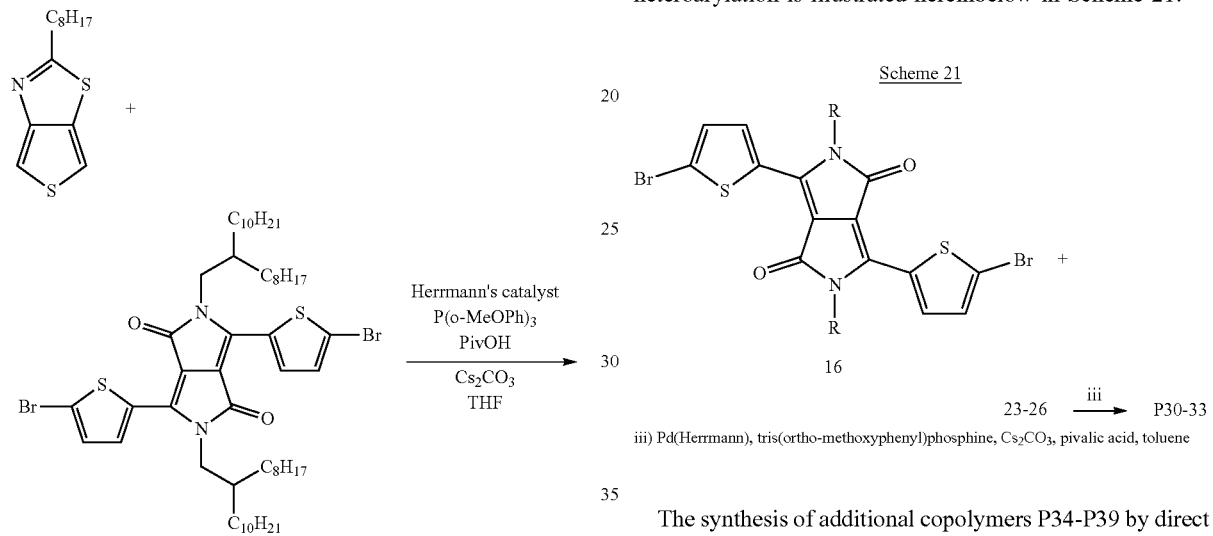
P7, Y = 60%
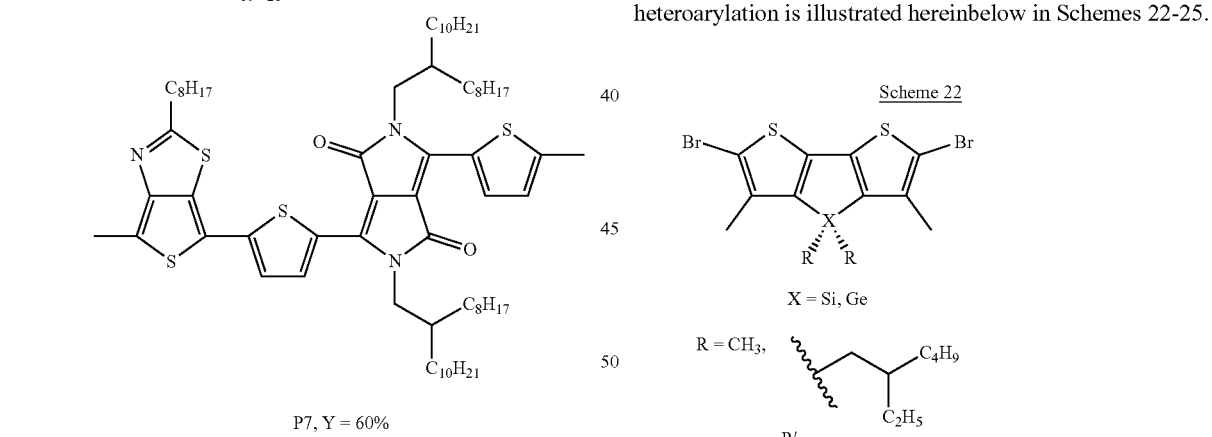
P8, Y = 48%
The synthesis of additional copolymers P30-P33 by direct heteroarylation is illustrated hereinbelow in Scheme 21.
Scheme 21
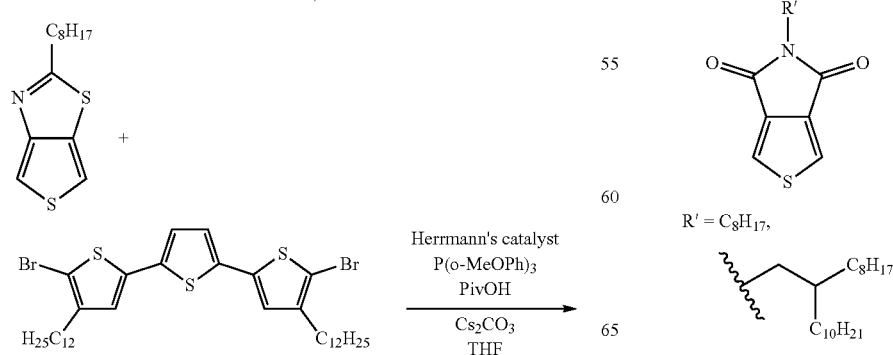
23-26 →(iii)→ P30-33
iii) Pd(Herrmann), tris(ortho-methoxyphenyl)phosphine, Cs$_2$CO$_3$, pivalic acid, toluene
The synthesis of additional copolymers P34-P39 by direct heteroarylation is illustrated hereinbelow in Schemes 22-25.
Scheme 22

Scheme 23

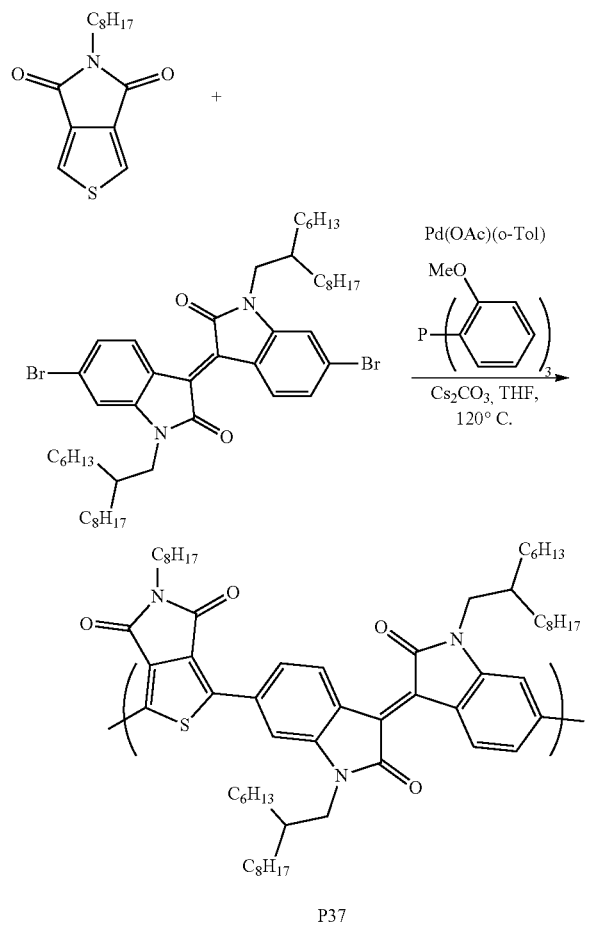

P37

Scheme 24

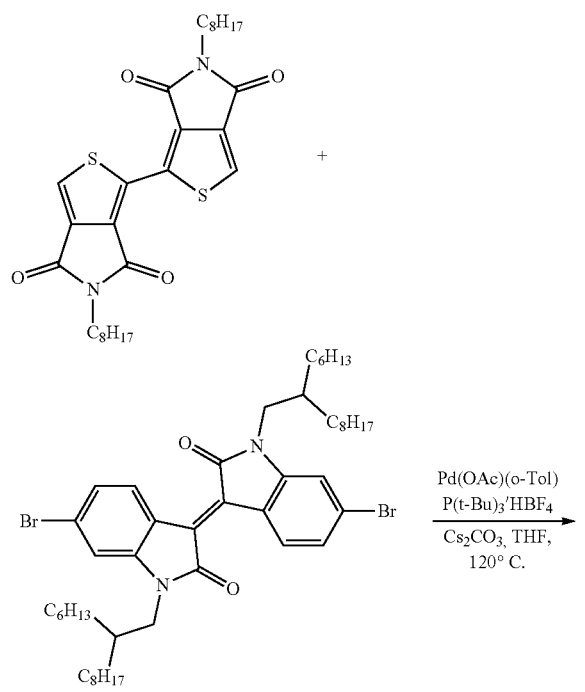

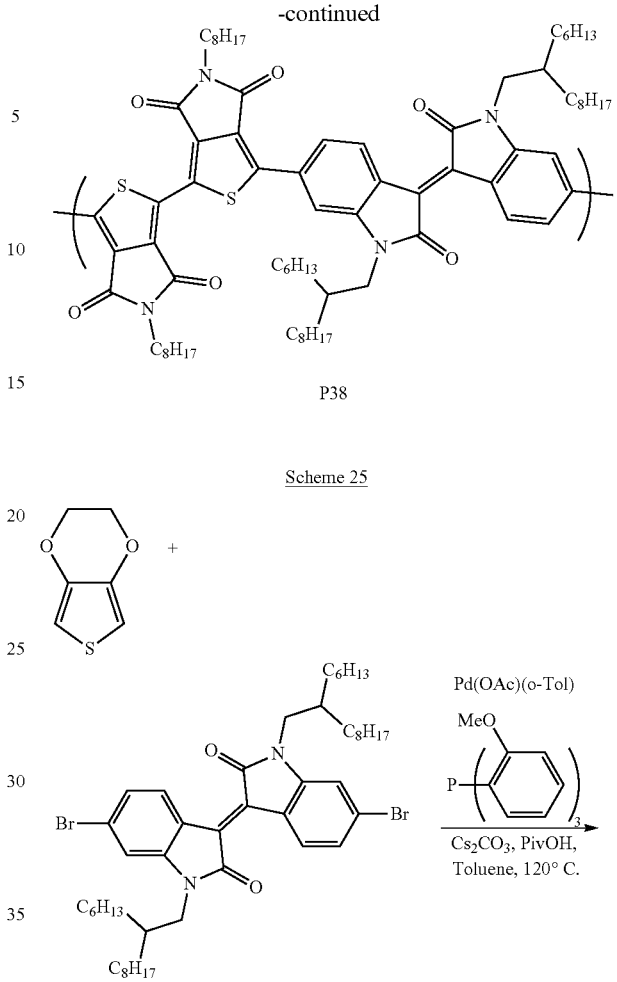

P38

Scheme 25

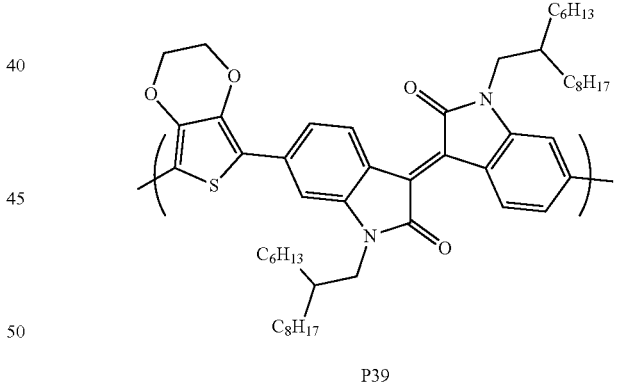

P39

Various physical, thermal, spectroscopic and electrochemical properties for P37-39 are illustrated in Tables 7.

Polymers of the Disclosure

Using the method of the present disclosure, certain novel polymers are prepared. Therefore, the present disclosure also includes novel polymers prepared using the methods of the disclosure.

In an embodiment of the disclosure, the present disclosure includes a polymer comprising repeating units of the Formulae (V), (VI) or (VII):

-[A$^1$-A$^2$]-          (V);

-[A$^3$]-          (VI); or

-[A$^3$-A$^4$]-          (VII), wherein

A¹, A², A³ and A⁴ are independently selected from aryl and heteroaryl; and the polymers were prepared using direct arylation or heteroarylation conditions.

It is an embodiment of the present disclosure that A¹, A², A³ and A⁴ are independently selected heteroaryl. In a further embodiment, heteroaryl comprises at least one thienyl group. In a further embodiment, the at least one thienyl group is fused to a 5-membered or 6-membered heterocyclo group. In a further embodiment, the heteroaryl comprises a linear chain of 2, 3 or 4 thienyl groups. In another embodiment, heteroaryl comprises an oxindole group, and indigo or isoindigo group.

In yet another embodiment, A¹, A², A³ and A⁴ are independently selected from:

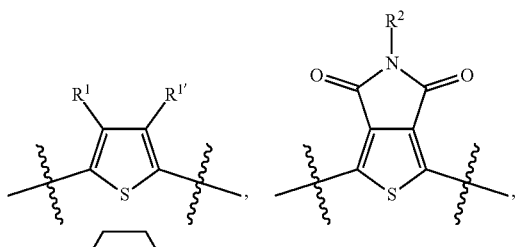

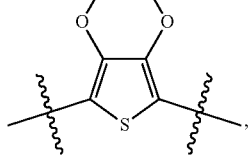

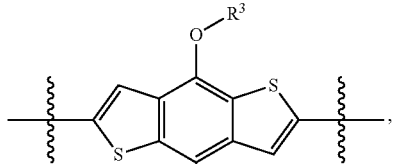

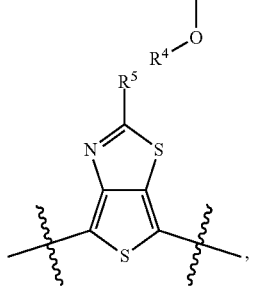

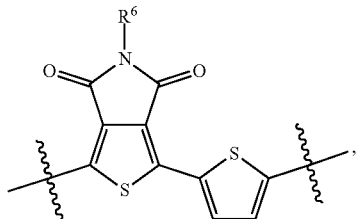

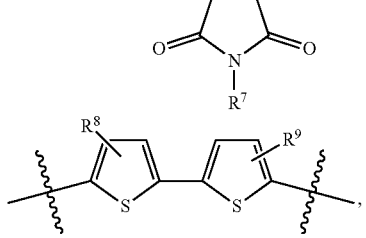

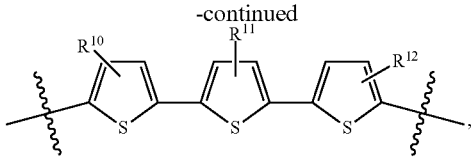

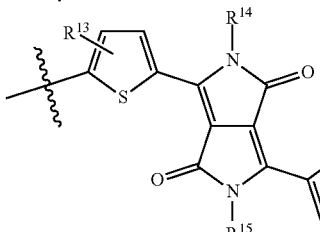

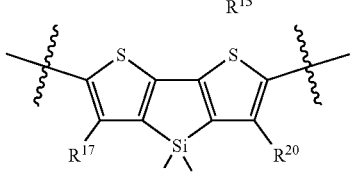

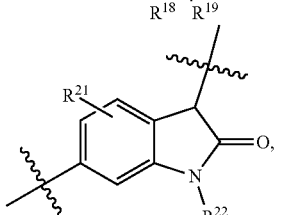

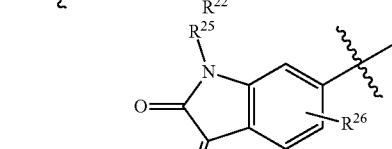

and

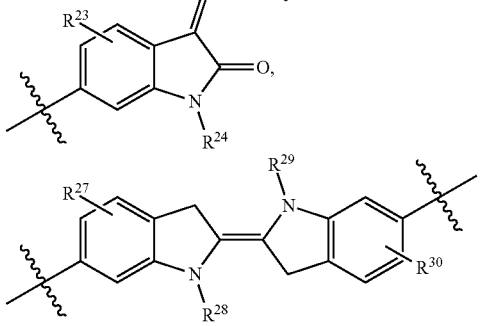

wherein $R^1$, $R^{1'}$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$ and $R^{30}$ are independently selected from H, CN and $C_{1-30}$alkyl and ⁕ denotes the point of attachment with the adjacent "A" group. In an embodiment, $R^1$, $R^{1'}$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$ and $R^{30}$ are independently selected from $C_{1-30}$alkyl.

In an embodiment of the disclosure, at least one of A¹, A², A³ and A⁴ is independently selected from phenyl, biphenyl, naphthyl and indanyl, in particular, phenyl.

In an embodiment, the polymers of the disclosure are high molecular weight polymers. For example, the polymers prepared using the methods of the present disclosure have a higher molecular weight than corresponding polymers using alternative methods such as Stille coupling reactions. In a further embodiment, the polymers of the present disclosure do not comprise metals that are used in alternative methods, such as tin used in the Stille coupling reactions.
In a further embodiment of the disclosure, there is included a polymer selected from the group consisting of:
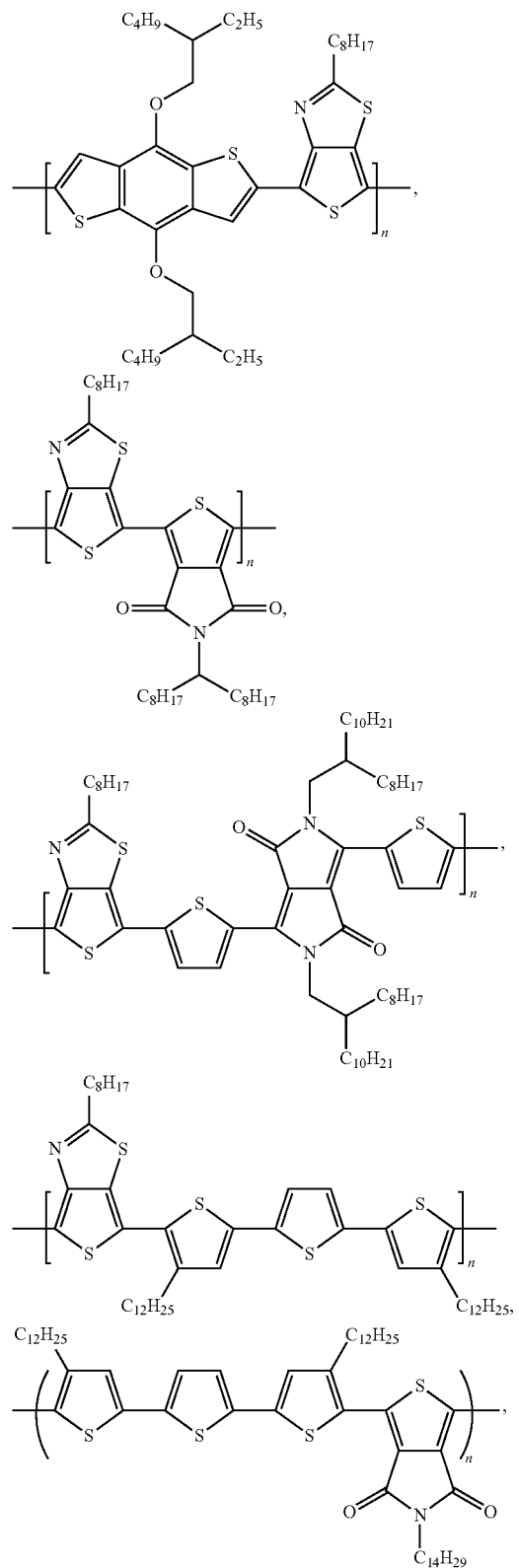
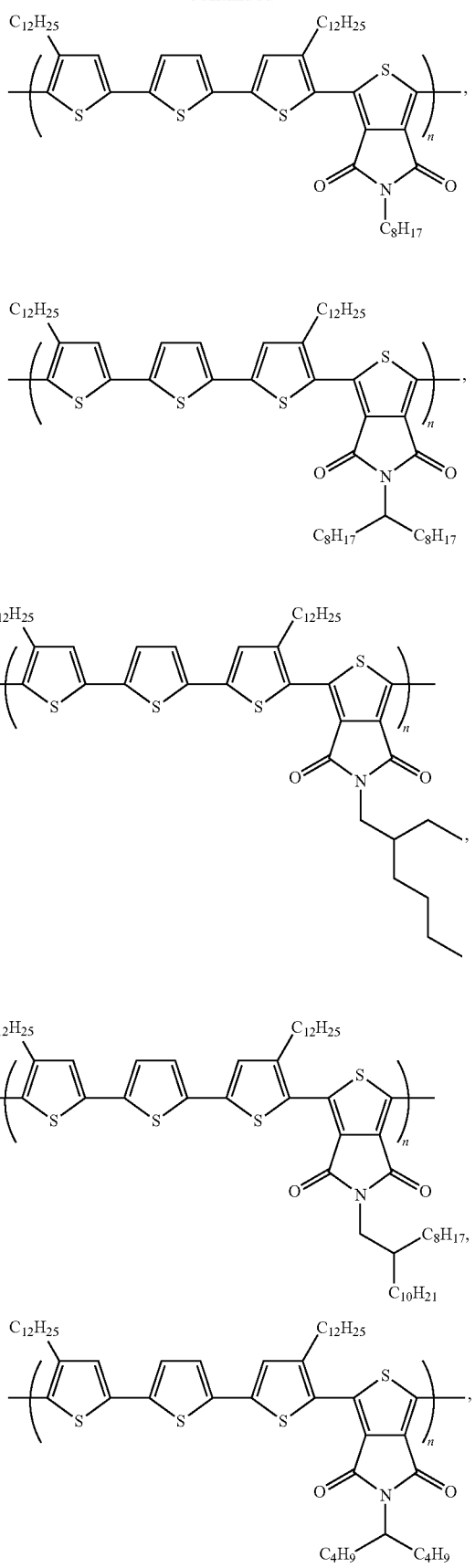

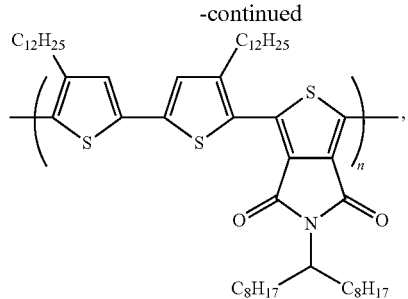
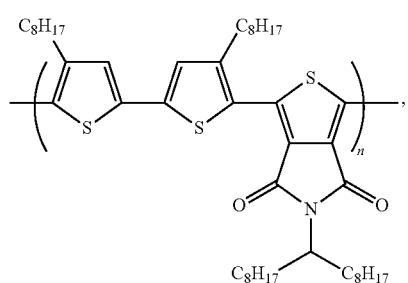
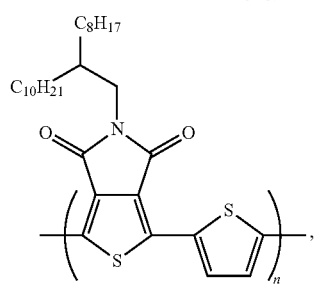
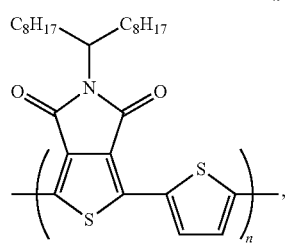
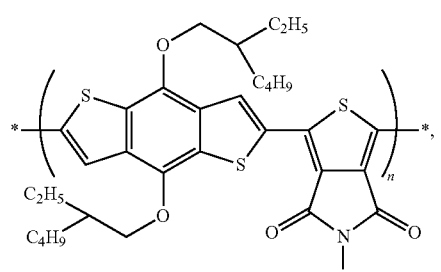
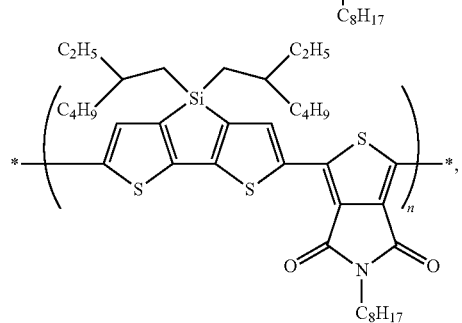
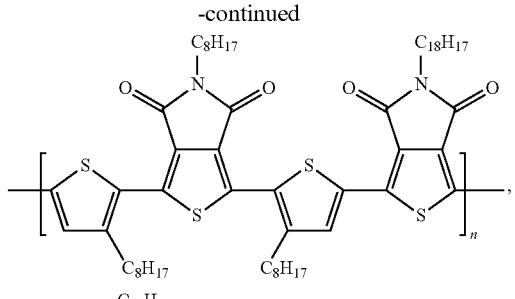
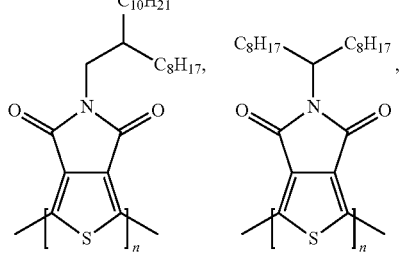
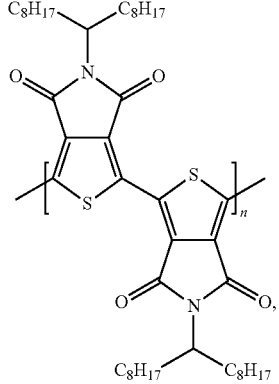
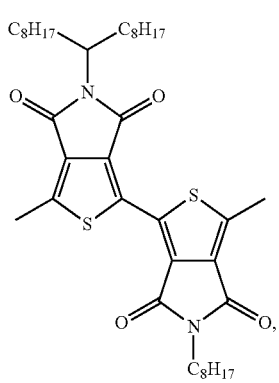
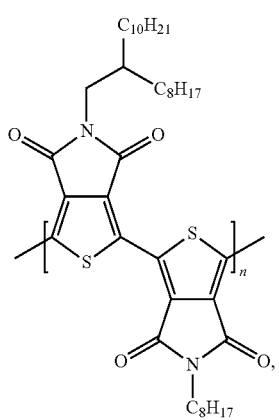

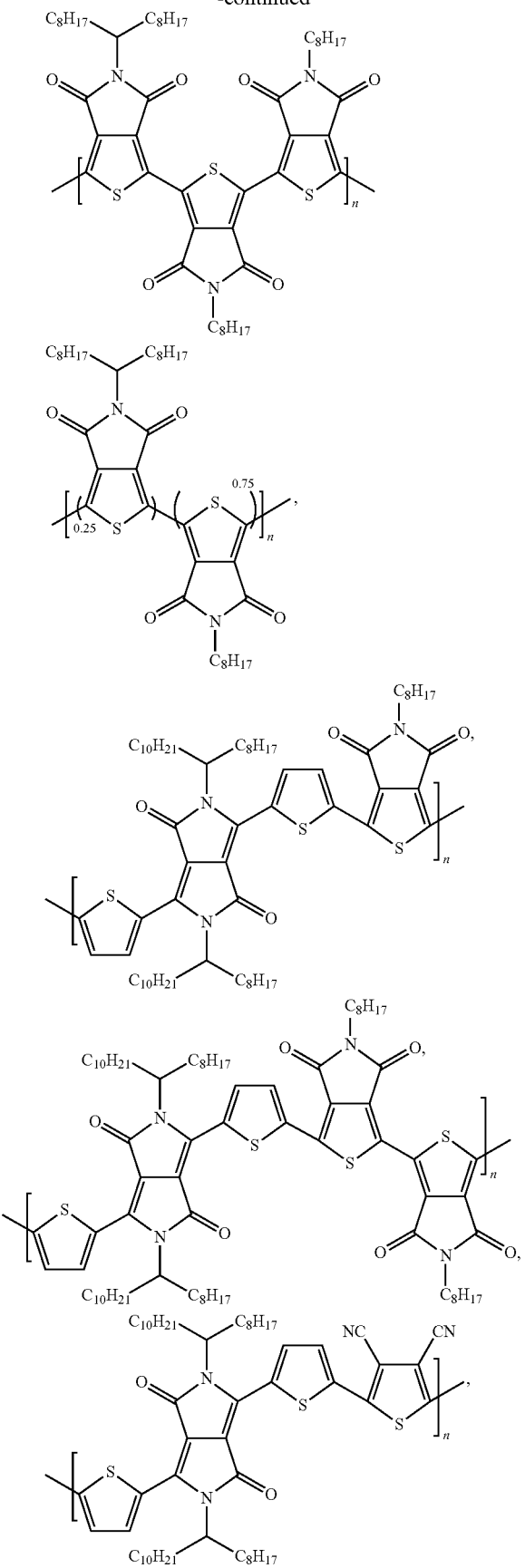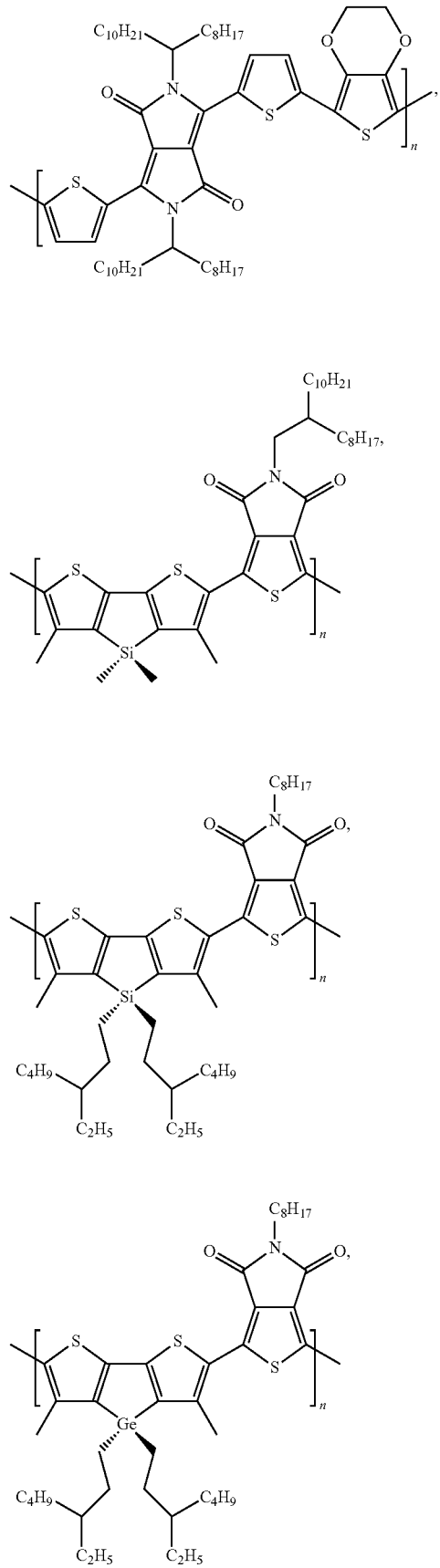

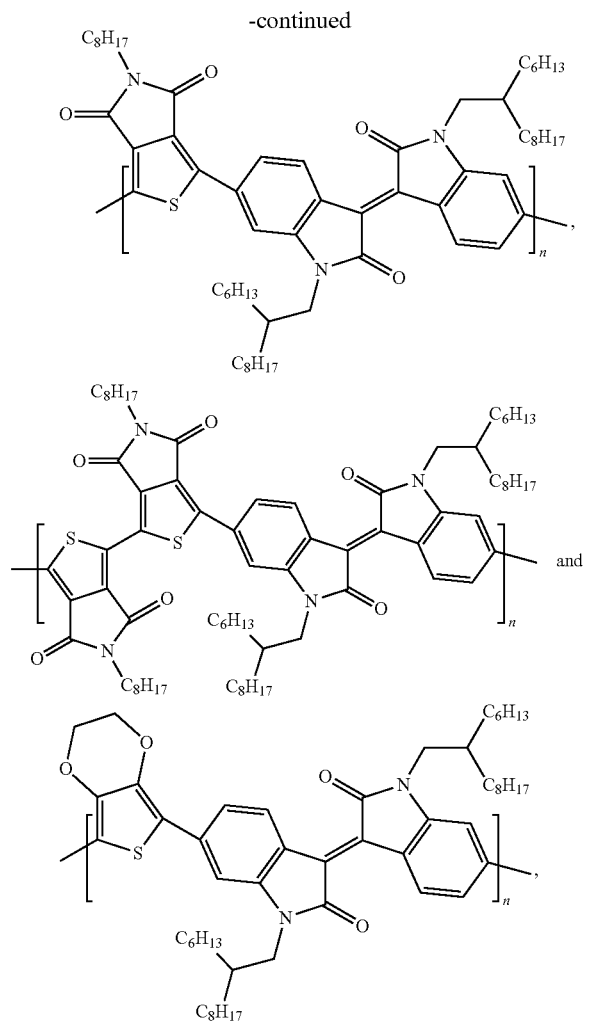

wherein n is the number of repeating units in the polymer chain. In an embodiment n ranges from 10 to 100.

EXPERIMENTAL

A number of examples are provided herein below illustrating the preparation of high molecular weight TPD-based polymers, TTZ-based polymers, DPP-based polymers and isoindigo-based polymers by direct heteroarylation polycondensation reactions. The following non-limiting examples are illustrative of the present disclosure.

Materials

Chemicals: Thiophene-3,4-dicarboxylic acid was bought from Frontier Scientific and all other starting organic compounds and organometallic compounds were purchased from Aldrich, TCI, Puyang Huicheng and used without any further purification. The reaction solvents were distilled under inert atmosphere prior to use (THF from sodium/benzophenone, acetonitrile from CaH$_2$); all other solvents were usually ACS grade. 2,7-Bis(4',4',5',5'-tetramethyl-1',3',2'-dioxaborolan-2'-yl)-N-9'-heptadecanylcarbazole, 1-iodo-5-octyl-4H-thieno[3,4-c]pyrrole-4,6(5H)-dione, 5-octyl[3,4-c]pyrrole-4,6-dione, 5-dodecyl[3,4-c]pyrrole-4,6-dione, 5-(2-Octyldodecyl)thieno[3,4]pyrrole-4,6-dione, 2-Hexyldecan-1-amine (compound 3, Scheme 4), 5,5'-dibromo-4,4'-dioctyl-2,2'-bithiophene (compound 6, Scheme 6), 4,4'-dioctyl-5,5'-bis(trimethylstannyl)-2,2'-bithiophene (compound 7, Scheme 7), 1,3-dibromo-5-(2-Hexyldecyl)thieno[3,4]pyrrole-4,6-dione (compound 8, Scheme 8), Tris-(o-dimethylaminophenyl)phosphine, trans-di(μ-acetato)-bis[α(di-o-tolylphosphino)benzyl]dipalladium(II), 2-iodothiophene-3,4-dicarboxylic acid, bromooxindole and isoindigo were prepared according to known literature procedures. All the monomers were carefully purified prior to use in the polymerization reactions.

Instrumentation/Characterization: $^1$H and $^{13}$C NMR spectra were recorded using a Varian AS400 in deuterated chloroform or acetone solution at 298° K. Number-average ($M_n$) and weight-average ($M_w$) molecular weights were determined by size exclusion chromatography (SEC) using a Varian Instrument PL120 with Styrene-DVB gel columns in CHCl$_3$ at 25° C. For the calibration curve, a series of monodisperse polystyrene standards (Shodex) were used. Thermogravimetric analysis (TGA) measurements were carried out using a Mettler Toledo TGA SDTA 851e apparatus (heating rate of 20° C./min under nitrogen flow) and the temperature of degradation ($T_d$) corresponds to a 5% weight loss. Differential scanning calorimetry (DSC) analyses were performed using a Mettler Toledo DSC823e instrument, calibrated with ultrapure indium, at a scanning rate of 20° C./min under a nitrogen flow. Glass transition temperatures ($T_g$) were determined using a scanning rate of 20° C./min under a nitrogen flow. UV-vis-NIR absorption spectra were recorded using a Varian Cary 500 and dropcast films on glass plates were utilized for solid-state measurements. Optical bandgaps were determined from the onset of the absorption band. Cyclic voltammograms (CV) were recorded on a Solartron 1287 potentiostat using platinum wires as the working electrode and counter-electrode at a scan rate of 50 mV/s. The reference electrode was Ag/Ag$^+$ (0.1 M of AgNO$_3$ in acetonitrile) and the electrolyte was a solution of 0.1 M of tetrabutylammonium tetrafluoborate in dry acetonitrile. Under these conditions, the oxidation potential of Ferrocene was 0.09 V versus Ag/Ag$^+$, whereas the oxidation potential of Ferrocene was 0.41 V versus SCE. The HOMO and LUMO energy levels were determined from the oxidation and reduction onsets (where the current differs from the baseline) assuming that the SCE electrode is −4.7 eV from vacuum. Small-angle X-ray diffraction (SAXD) spectra were obtained using an X-ray diffractometer (Siemens/Bruker, Kristalloflex 760 generator, three cycle goniometer, Hi-Star area detector with GADDS software) using a graphite monochromatized copper radiation (Kα=1.5418 Å). The operation power was 40 kV, 20 mA and the collimator was 0.8 mm in diameter. The samples were inserted in 0.01 mm thin walled glass capillary tubes (1.0 mm diameter).

Synthesis of
5-(2-Hexyldecyl)thieno[3,4]pyrrole-4,6-dione (4)

A solution of thiophene-3,4-dicarboxylic acid (5.00 g, 29.04 mmol) in acetic anhydride (270 mL) was stirred at 75° C. over a period of 2 hours. The solvent was removed and to the crude product was subsequently added dioxane (250 mL), DMAP (3.56 g, 43.76 mmol) and 2-hexyldecan-1-amine (3) (9.45 g, 43.46 mmol). The resulting solution was stirred at 55° C. over a period of 20 hours. Acetic anhydride (160 mL) was then added and the reaction mixture was stirred for an additional 4 hours at 80° C. The reaction was subsequently quenched with water (300 mL) and was extracted with dichloromethane (4×40 mL). The combined organic layers were dried with MgSO$_4$ and evaporated to dryness to yield a dark oil. The crude product was purified by column chromatography using dichloromethane/hexane (1:2) as the eluent to afford the title product as a white oil (7.30 g, yield: 66%). $^{1}$H NMR (400 MHz, CDCl$_3$) δ 7.81 (s, 2H), 3.52 (d, 2H, J=7.5 Hz), 1.83 (m, 1H), 1.40-1.15 (m, 24H), 0.87 (m, 6H); $^{13}$C NMR (100 MHz, CDCl$_3$) δ 163.2, 136.9, 125.7, 43.0, 37.1, 32.12, 32.04, 31.7, 30.2, 29.87 (two peaks overlap), 29.78, 29.53, 26.48, 26.45, 22.90, 22.87, 14.36, 14.33 ppm.

Synthesis of 1-Iodo-5-(2-hexyldecyl)thieno[3,4] pyrrole-4,6-dione (9)

A solution of 2-iodothiophene-3,4-dicarboxylic acid (7) (10.26 g, 29.04 mmol) in acetic anhydride (270 mL) was stirred at 75° C. over a period of 2 hours. The solvent was removed and to the crude product was added dioxane (250 mL), DMAP (3.56 g, 43.76 mmol) and 2-hexyldecan-1-amine (10.49 g, 43.46 mmol). The resulting solution was subsequently stirred at 55° C. over a period of 20 hours. Acetic anhydride (160 mL) was then added and the reaction mixture was stirred for an additional 4 hours at 80° C. The reaction was subsequently quenched with water (300 mL) and was extracted with dichloromethane (4×40 mL). The combined organic layers were dried with MgSO$_4$ and evaporated to dryness to yield a dark slurry. The crude product was purified by column chromatography using dichloromethane/hexane (1:2) as the eluent to afford the title product as a white solid (6.30 g, yield: 43%). $^{1}$H NMR (400 MHz, CDCl$_3$) δ 7.84 (s, 1H), 3.47 (d, 2H, J=7.2 Hz), 1.81 (m, 1H), 1.40-1.15 (m, 24H), 0.85 (m, 6H); $^{13}$C NMR (100 MHz, CDCl$_3$) δ 162.9, 161.3, 139.6, 137.8, 131.4, 74.6, 43.1, 37.1, 32.16, 32.14, 31.7, 30.2, 29.88, 29.84, 29.79, 29.59, 29.54, 26.51, 22.93, 22.92 (two peaks overlap), 14.38 ppm.

Synthesis of 1-Iodo-5-(2-octyldodecyl)thieno[3,4] pyrrole-4,6-dione (10)

A solution of 2-iodothiophene-3,4-dicarboxylic acid (10.26 g, 29.04 mmol) in acetic anhydride (270 mL) was stirred at 75° C. over a period of 2 hours. The solvent was removed and to the crude product was added dioxane (250 mL), DMAP (3.56 g, 43.76 mmol) and 2-octyldodecan-1-amine (12.93 g, 43.46 mmol). The resulting solution was subsequently stirred at 55° C. over a period of 20 hours. Acetic anhydride (160 mL) was then added and the reaction mixture was stirred for an additional 4 hours at 80° C. The reaction was subsequently quenched with water (300 mL) and was extracted with dichloromethane (4×40 mL). The combined organic layers were dried with MgSO$_4$ and evaporated to dryness to yield a dark slurry. The crude product was purified by column chromatography using dichloromethane/hexane (1:2) as the eluent to afford the title product as a white solid (7.31 g, yield: 45%). $^{1}$H NMR (400 MHz, CDCl$_3$) δ 7.84 (s, 1H), 3.47 (d, 2H, J=7.2 Hz), 1.81 (m, 1H), 1.40-1.15 (m, 28H), 0.85 (m, 6H); $^{13}$C NMR (100 MHz, CDCl$_3$) δ 162.9, 161.3, 139.6, 137.8, 131.4, 74.6, 43.1, 37.1, 32.16, 32.14, 31.7, 30.2, 29.88 (two peaks overlap), 29.84 (two peaks overlap), 29.79 (two peaks overlap), 29.59 (two peaks overlap), 29.54 (two peaks overlap), 26.51, 22.93, 22.92, 14.38 ppm.

Synthesis of 4,4"-didodecyl-2,2':5',2"-terthiophene (11)

2-(Tributylstannyl)-4-dodecylthiophene (0.75 g, 1.39 mmol) and 2,5-dibromothiophene (0.12 g, 0.46 mmol) were dissolved in dry THF (5 mL). The mixture was subsequently degassed. Pd$_2$ dba$_3$ (0.016 g, 4% mol) and AsPh$_3$ (22 mg, 16% mol) were then added and the resulting mixture refluxed over a period of 5 h. After cooling to room temperature, the solvent was evaporated and the crude compound purified by column chromatography (silica gel) using hexanes as the eluent. The product was further purified by precipitation from cold acetone to afford the title product as a light yellow solid (0.177 g, 65% yield). $^{1}$H NMR (400 MHz, CDCl$_3$) δ 7.03 (s, 2H), 7.01 (s, 2H), 6.80 (s, 2H), 2.58 (t, 4H, J=7.8 Hz), 1.66-1.57 (m, 4H), 1.37-1.17 (m, 36H), 0.89 (t, 6H, J=7.4 Hz); $^{13}$C NMR (100 MHz, CDCl$_3$) δ 144.40, 137.02, 136.56, 125.19, 124.14, 119.28, 32.19, 30.76, 30.64, 29.93, 29.92, 29.91, 29.86, 29.73, 29.63, 29.57, 22.96, 14.39.

Synthesis of 5,5"-dibromo-4,4"-didodecyl-2,2':5',2"-terthiophene (12)

4,4"-Didodecyl-2,2':5',2"-terthiophene (11) (0.147 g, 0.25 mmol) was dissolved in a chloroform/acetic acid mixture (2:1) (9 mL) and cooled to 0° C. NBS (0.090 g, 0.507 mmol) was added in one portion and the reaction mixture was subsequently stirred in the dark over a period of 1 h at 0° C. The reaction was then quenched by adding water. The organic phase was separated and subsequently washed with a saturated NaOH solution, dried over MgSO$_4$ and evaporated. The title product was obtained as a yellow solid (0.171 g, 92%). $^{1}$H NMR (400 MHz, CDCl$_3$) δ 6.95 (s, 2H), 6.84 (s, 2H), 2.54 (t, 4H, J=7.7 Hz), 1.64-1.55 (m, 4H), 1.39-1.18 (m, 36H), 0.89 (t, 6H, J=7.4 Hz); $^{13}$C NMR (100 MHz, CDCl$_3$) δ 143.27, 136.57, 135.92, 124.70, 124.42, 108.18, 32.20, 29.96, 29.93, 29.89, 29.84, 29.68, 29.64, 29.49, 22.98, 14.41.

Synthesis of N-(4-bromothiophenyl)-3-nonanamide (Scheme 12)

In a round bottom flask equipped with an addition funnel, 2-azido-3-bromothiophene (4.0 g, 19.6 mmol) was dissolved in anhydrous THF (160 mL). PySSPy (0.864 g, 3.92 mmol) and nonanoic acid (3.10 g, 19.6 mmol) were then added to the solution. The mixture was subsequently cooled to 0° C. and trimethylphosphine (60.4 mmol, 60.4 mL of a 1.0 M solution in Toluene) was added dropwise to the solution at 0° C. Following the addition, the reaction mixture was stirred overnight at room temperature. The reaction mixture was then extracted with a saturated solution of sodium bicarbonate and AcOEt. The organic fractions were dried over MgSO$_4$ and evaporated under reduced pressure. The crude product was purified by flash chromatography on silica using a mixture of 90/10 hexane/AcOEt to obtain 4.92 g of the desired product as white powder (Yield: 79%). $^{1}$H NMR (400 MHz, CDCl$_3$, ppm): δ 7.90 (d, J=3.6 Hz, 1H); 7.54 (s, 1H, NH); 7.22 (d, J=3.6 Hz, 1H); 2.41 (t, J=7.6 Hz, 2H); 1.73 (m, 2H); 1.30 (m, 10H); 0.88 (t, J=7.0 Hz, 3H); $^{13}$C NMR (100 MHz, CDCl$_3$, ppm): δ 170.85; 132.77; 121.50; 110.59; 103.28; 37.45; 32.06; 29.56; 29.45; 29.37; 25.75; 22.89; 14.35.

Synthesis of N-(4-bromothiophenyl)-3-nonanamide (Scheme 12)

In a round bottom flask equipped with a condenser, N-(4-bromothiophenyl)-3-nonanamide (5.25 g, 16.5 mmol) was dissolved in anhydrous THF (200 mL). Lawesson's reagent (10.0 g, 24.7 mmol) was then added to the solution. The reaction was refluxed overnight and then extracted with AcOEt and a 10% NaOH solution. The organic fractions were dried over MgSO$_4$ and evaporated under reduced pressure. The crude product was purified by flash chromatography on silica in a mixture of 95/5 hexane/AcOEt to obtain 3.52 g of the desired product as a yellow oil (Yield: 64%). $^1$H NMR (400 MHz, CDCl$_3$, ppm): δ 8.97 (d, J=3.6 Hz, 1H); 7.26 (d, J=3.6 Hz, 1H); 2.84 (t, J=7.6 Hz, 2H); 1.84 (m, 2H); 1.26 (m, 10H); 0.87 (t, J=7.0 Hz); $^{13}$C NMR (100 MHz, CDCl$_3$, ppm): δ 202.49; 133.57; 121.52; 114.21; 104.96; 49.24; 31.85; 29.59; 29.35; 29.18; 28.86; 22.69; 14.19.

Synthesis of 2-octylthieno[3,4-d]thiazole (Scheme 12)

In a round bottom flask equipped with a condenser, N-(4-bromothiophenyl)-3-nonanamide (3.5 g, 10.5 mmol) was dissolved in anhydrous THF (150 mL). Copper (I) iodide (0.100 g, 0.52 mmol), neocuproine (0.218 g, 1.05 mmol) and potassium carbonate (2.17 g, 15.7 mmol) were then quickly added to the stirring solution. The reaction mixture was refluxed overnight and then extracted with AcOEt and water. The organic fractions were dried over MgSO$_4$ and evaporated under reduced pressure. The crude product was purified by flash chromatography on silica in a mixture of 90/10 hexane/AcOEt to obtain 2.37 g of the desired product as a yellow oil (Yield: 90%). $^1$H NMR (400 MHz, CDCl$_3$, ppm): δ 7.45 (d, J=2.6 Hz, 1H); 7.16 (d, J=2.6 Hz, 1H); 2.98 (t, J=7.6 Hz, 2H); 1.84 (m, 2H); 1.36 (m, 10H); 0.88 (t, J=7.0 Hz, 3H); $^{13}$C NMR (100 MHz, CDCl$_3$, ppm): δ 179.16; 160.17; 134.36; 109.97; 109.61; 35.59; 32.05; 29.49; 29.37; 29.15; 22.89; 14.35.

Synthesis of 4,6-dibromo-2-octylthieno[3,4-d]thiazole (13) (Scheme 12)

To a solution of 2-octylthieno[3,4-d]thiazole (0.590 g, 23.3 mmol) in THF (80 mL) was added n-bromosuccinimide (NBS) (0.870 g, 48.9 mmol). The reaction mixture was allowed to stir at room temperature overnight. The reaction mixture was then quenched with water, extracted with diethyl ether, dried with anhydrous MgSO$_4$ and concentrated under reduced pressure. The crude product was purified by flash chromatography using 90/10 hexanes/AcOEt to obtain 0.743 g of the title compound as an orange oil (Yield: 82%). $^1$H NMR (400 MHz, CDCl$_3$, ppm): δ 2.97 (t, J=7.6 Hz, 2H); 1.81 (m, 2H); 1.34 (m, 10H); 0.88 (t, J=7.0 Hz, 3H); $^{13}$C NMR (100 MHz, CDCl$_3$, ppm): δ 180.69; 156.92; 135.91; 95.58; 94.49; 35.86; 32.02; 29.44; 29.36; 29.32; 29.30; 22.88; 14.35.

Synthesis of 5-(9-heptadecanyl)-4H-thieno[3,4-c]pyrrole-4,6(5H)-dione

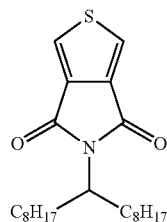

A solution of thiophene-3,4-dicarboxylic acid (2.5 g, 14.52 mmol) in acetic anhydride (60 mL) was stirred for 4 h at 140° C. The reaction mixture was then concentrated to yield thiophene-3,4-dicarboxylic anhydride as a brown solid which was used without further purification. The anhydride was dissolved in toluene (90 mL), followed by the addition of 9-heptadecanamine (3.7 g, 14.52 mmol). The reaction mixture was subsequently refluxed overnight. The reaction mixture was then allowed to cool to room temperature and was subsequently concentrated. The reaction mixture was dissolved in thionyl chloride (SOCl$_2$) (80 mL) and refluxed over a period of 4.5 hours. The reaction mixture was cooled and concentrated to dryness. The residue was purified by column chromatography using methylene dichloride:hexanes (3:7) as the eluent to afford the title compound as a beige solid (2.2 g, Yield: 39%). $^1$H NMR (400 MHz, CDCl3, ppm) δ: 7.78 (s, 2H), 4.10 (hept, 1H), 2.10-1.95 (m, 2H), 1.71-1.60 (m, 2H), 1.33-1.18 (m, 24H), 0.85 (t, 6H); $^{13}$C NMR (100 MHz, CDCl3, ppm) δ: 163.27, 136.69, 125.47, 52.95, 32.04, 29.67, 29.52, 29.45, 26.89, 22.86, 14.32.

Synthesis of 5-(nonan-5-yl)-5H-thieno[3,4-c]pyrrole-4,6-dione

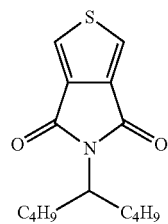

A solution of thiophene-3,4-dicarboxylic acid (2.5 g, 14.52 mmol) in acetic anhydride (60 mL) was stirred for 4 h at 140° C. The reaction mixture was concentrated to yield thiophene-3,4-dicarboxylic anhydride as a brown solid which was used without further purification. The anhydride was dissolved in toluene (90 mL), followed by the addition of nonan-5-amine (2.08 g, 14.52 mmol). The reaction mixture was subsequently refluxed overnight. The reaction mixture was then allowed to cool to room temperature and was subsequently concentrated. The resulting mixture was dissolved in thionyl chloride (SOCl$_2$) (80 mL) and refluxed over a period of 4.5 hours. The reaction mixture was cooled down and concentrated to dryness. The residue was purified by column chromatography using methylene dichloride:hexanes (3:7) as the eluent to afford the title compound as a beige solid (1.7 g, yield: 30%). $^1$H NMR (400 MHz, CDCl3, ppm) δ: 7.73 (s, 2H), 4.02 (hept, 1H), 2.12-1.93 (m, 2H), 1.63-1.51 (m, 2H), 1.26-1.04 (m, 12H), 0.72 (t, 6H); $^{13}$C NMR (100 MHz, CDCl3, ppm) δ: 163.28, 136.69, 125.53, 52.98, 32.22, 29.05, 22.61, 14.21.

Synthesis of Monomer 15

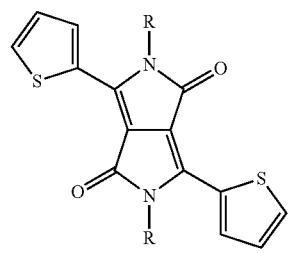

Monomer 14 (3.00 g, 10 mmol) and potassium carbonate (4.15 g, 30 mmol) were dissolved in 100 mL of dry DMF in a 250 mL three neck round bottom flask. The solution was heated to 50° C. and 1-bromo-2-octyldodecane (11.26 g, 30 mmol) was added dropwise over a period of 2 hours. The reaction mixture was stirred at 80° C. for 48 hours. After reaching ambient temperature, the reaction mixture was filtered under vacuum using a 2 inch pad of silica to remove unreacted starting material. A chloroform portion was added and the organic phase was washed several times with water (6×250 mL) to remove the residual DMF. The solvent was dried using magnesium sulfate, filtered and then removed under reduced pressure to afford a crude purple product. Using a small silica gel column, a drypack of the crude was flushed with methanol to remove impurities. Further purification with a silica gel column using hexanes:chloroform (8:1) as the eluent lead to the desired product (1.65 g, 16% yield). M/Z calculated 860.6287 found 860.6278; $^1$H NMR (CDCl$_3$, 400 MHz, ppm) δ: 8.88 (d, J=3.4 Hz, 2H), 7.62 (d, J=4.8 Hz, 2H), 7.27 (m, 2H), 4.01 (d, J =7.7 Hz, 4H), 1.90 (m, 2H), 1.21 (m, 64H), 0.87 (m, 12H); $^{13}$C NMR (CDCl$_3$, 100 MHz, ppm) δ: 161.97, 140.65, 135.46, 130.69, 130.07, 128.62, 108.15, 46.44, 37.96, 32.15, 32.11, 31.39, 31.17, 30.24, 29.88, 29.87 (m), 29.79, 29.73, 29.59, 29.53, 26.43, 26.41, 22.93, 22.90, 14.36, 14.35.

Synthesis of Monomer 16

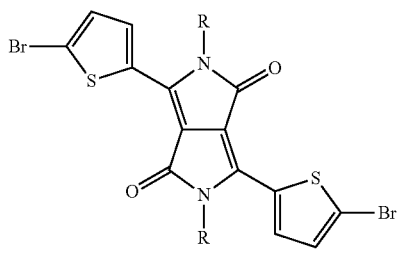

Monomer 15 (1.30 g, 1.51 mmol) was dissolved in 30 mL of chloroform in a 100 mL flask. After shielding the flask from light using an aluminum foil, N-bromosuccinimide (0.56 g, 3.18 mmol) was added in portions and the reaction mixture was left to stir overnight. The solution was dropped in 100 mL of water and extracted with chloroform (3×50 mL). The solvent was subsequently dried using magnesium sulfate, filtered and then removed under reduced pressure. A short silica plug using chloroform as the eluent affords the desired compound as a purple product (1.47 g, 95% yield). M/Z calculated 1016.4493 found 1016.4487; $^1$H NMR (CDCl$_3$, 400 MHz, ppm) δ: 8.63 (d, J=4.1 Hz, 2H), 7.21 (d, J=4.2 Hz, 2H); 3.91 (d, J=7.6 Hz, 4H); 1.55 (s, 2H); 1.25 (m, 64H), 0.87 (m, 12H); $^{13}$C NMR (CDCl$_3$, 100 MHz, ppm) δ: 161.61, 139.63, 135.55, 131.64, 131.37, 119.17, 108.18, 46.56, 37.98, 32.16, 32.12, 31.38, 30.21, 29.88 (m), 29.79, 29.73, 29.60, 29.53, 26.40, 22.93, 22.91, 14.37, 14.36.

Synthesis of Monomer 17

N-bromosuccinimide (317 mg, 1.78 mmol) was added in one portion to a solution of the dithienosilole substrate (399 mg, 0.89 mmol) in THF (6 mL) and the reaction mixture stirred under an atmosphere of N$_2$ over a period of 1.5 hours. The reaction mixture was subsequently quenched with water and extracted with dichloromethane (4×10 mL). The combined extracts were washed with water, dried with anhydrous MgSO$_4$, filtered and the solvent removed in vacuo. The product was purified by chromatography (SiO$_2$, 5% Et$_3$N in hexanes) to provide a yellow solid, which was recrystallized in hexanes (267 mg, 73%). $^1$H NMR (Acetone-d$_6$, 399.78 MHz) δ: 2.21 (s, $^1$J$_{CH}$=128.1 Hz, $^2$J$_{SiH}$= 39.7 Hz, 6H, ArCH$_3$), 0.42 (s, $^1$J$_{CH}$=116.5 Hz, $^2$J$_{SiH}$=37.9 Hz, 6H, ArCH$_3$) ppm; $^{13}$C NMR (Acetone-d$_6$, 100.52 MHz) δ: 146.5, 142.3, 139.7, 108.4, 15.4 (ArCH$_3$), −4.8 ppm (SiCH$_3$).

Synthesis of Monomer 18

N-bromosuccinimide (78 mg, 0.44 mmol) was added in one portion to a solution of dithienosilole substrate (126 mg, 0.21 mmol) in THF (2.1 mL) and the reaction mixture stirred under an atmosphere of N$_2$. The reaction was monitored by TLC and an additional amount of NBS (4 mg, 0.021 mmol) was added after 20 hours. Following an additional 2 hours, the reaction mixture was quenched with water and extracted with hexanes (4×10 mL). The combined extracts were washed with water, dried with anhydrous MgSO$_4$, filtered and the solvent removed in vacuo. The product was purified by chromatography (SiO$_2$, hexanes) to provide a yellow oil (114 mg, 90%). $^1$H NMR (Acetone-d$_6$, 499.92 MHz) δ: 2.28 (t, $^1$J=3.2 Hz, 6H), 1.27-0.73 (m, 34H), ppm; $^{13}$C NMR (Acetone-d$_6$, 125.72 MHz) δ: 147.2, 143.6 ($^1$J$_{SiC}$=67.3 Hz), 140.0 ($^2$J$_{SiC}$=3.6 Hz), 109.0 ($^2$J$_{SiC}$=23.9 Hz), 36.9, 36.1, 36.09, 22.6, 17.6, 16.0 (t, $^1$J=6.8 Hz), 14.3, 11.24, 11.2 Hz.

Synthesis of Monomer 29

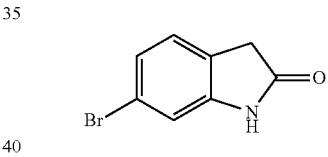

2,5-Dibromonitrobenzene (15.0 g, 53.4 mmol) was mixed with potassium carbonate anhydrous (73.8 g, 534 mmol) in dry DMSO (80 mL) under a nitrogen atmosphere. The reaction mixture was heated to 50° C. and a solution of diethylmalonate (44.3 g, 267 mmol) in DMSO (40 mL) was added dropwise over a period of one hour. The reaction mixture was left to react for 18 h after which it was extracted with diethyl ether and the combined organic phases washed with water. After removal of the solvents, the intermediate compound diethyl 2-(4-bromo-2-nitrophenyl)malonate was obtained as a light yellow oil mixed with diethyl malonate as an impurity. This mixture was directly used without further purification and was solubilized in a mixture of water (110 mL), sulfuric acid (110 mL) and ethanol (330 mL) and heated to reflux. Zinc powder (35 g, 534 mmol) was then slowly added to the reaction mixture. The mixture was left to react over a period of one hour prior to the slow addition of a second portion of zinc powder (35 g, 534 mmol). The reaction mixture was left to react for two hours followed by it being transferred into water (1.5 L). The product was left to crystallize overnight after which it was filtered. The white solid obtained was washed with water to yield pure 6-bromooxindole (29) (9.75 g, yield =86%). M.P.=214-216° C.; $^1$H NMR (400 MHz, DMSO-d$_6$, ppm) δ: 10.50 (s, 1H), 7.15 (d, J=8.0 Hz, 1H), 7.10 (dd, J$^1$=8.0 Hz, J$^2$=1.8 Hz, 1H), 6.94 (d, J=1.8 Hz, 1H); $^{13}$C NMR (100 MHz, DMSO-d$_6$, ppm) δ:

176.26, 145.41, 126.21, 125.28, 123.66, 119.90, 111.86, 35.41; HRMS (ESI) (M+H)+: Calcd: 210.9633. Found: 210.9632.

Synthesis of Monomer 30

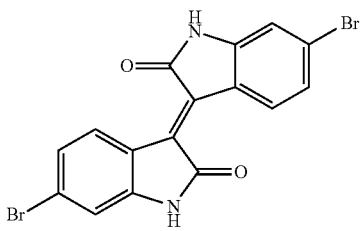 [SMILES: O=C1Nc2cc(Br)ccc2/C1=C1\C(=O)Nc2cc(Br)ccc21]

6-Bromooxindole (29) (5.14 g, 24.3 mmol) and commercially available 6-bromoisatin (5.50 g, 24.3 mmol) were solubilised in acetic acid (160 mL). Hydrochloric acid (12 M, 1.2 mL) was added and the mixture was refluxed over a period of 26 hours. The reaction mixture was then dropped into water (1 L) and filtered. The resulting brown solid was washed with water, methanol and ethyl acetate and subsequently triturated in ethyl acetate for an hour (250 mL). The desired product was obtained as a dark brown solid after filtration (9.24 g, 91%). M.P.=>400° C.; $^1$H NMR (400 MHz, DMSO-$d_6$, ppm) δ: 11.10 (s, 2H), 8.99 (d, $J^1$=8.8 Hz, 1H), 7.19 (dd, $J^1$=8.8 Hz, $J^2$=1.9 Hz, 2H), 6.99 (d, J=1.9 Hz, 2H); HRMS (ESI) (M+H)$^+$: Calcd: 417.8953. Found: 417.8938.

Synthesis of Monomer 31

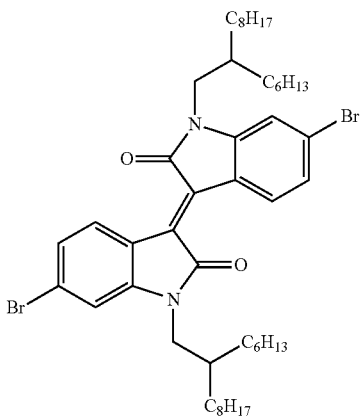

6,6'-Dibromoisoindigo (30) (3.65 g, 8.68 mmol) and anhydrous potassium carbonate (6.00 g, 43.4 mmol) were mixed in dry DMF (175 mL) and the reaction mixture heated to 100° C. under a nitrogen atmosphere. 2-Hexyl-1-bromodecane (7.95 g, 26.0 mmol) was then added and the resulting red solution was left to react over a period of 22 hours. The reaction mixture was then poured into water and extracted with dichloromethane. The combined organic phases were washed with brine, dried with sodium sulfate and subsequently evaporated under reduced pressure to yield the crude product as a red oil. The crude product was purified over a short silica column using hexanes as a first eluent and then a mixture of hexanes/dichloromethane (1:1) as a second eluent. The resulting red oil solidified after several days. This product was further purified by column chromatography over silica gel, first using methanol as the eluant to remove an oily by-product which could be observed by thin film chromatography, and by further eluting with dichloromethane. Any residual silica was removed by solubilizing the product in dichloromethane followed by vacuum filtration. The desired product was finally obtained as a red solid (6.21 g, yield=82%). M.P.=50-52° C.; $^1$H NMR (400 MHz, CDCl$_3$, ppm) δ: 9.06 (d, J=8.9 Hz, 2H), 7.16 (dd, $J^1$=8.9 Hz, $J^2$=1.5 Hz, 2H), 6.89 (d, J=1.5 Hz, 2H), 1.88 (d, J=7.3 2H), 3.74 (m, 1H), 1.85 (m, 2H), 1.2-1.4 (m, 48H), 0.86 (t, J=6.4 Hz, 12H); $^{13}$C NMR (100 MHz, DMSO-$d_6$, ppm) δ: 168.08, 146.19, 132.54, 131.06, 126.66, 125.08, 120.38, 111.51, 67.98, 44.68, 36.09, 31.88, 31.91, 31.51, 29.99, 29.65, 29.55, 29.30, 26.37, 26.34, 22.67, 22.64, 14.12, 14.09; HRMS (ESI)(M+H)$^+$: Calcd: 866.3961. Found: 866.3935.

Synthesis of Polymers (P1-P4) by Direct Heteroarylation Polycondensation (n Varies Between 10-200)

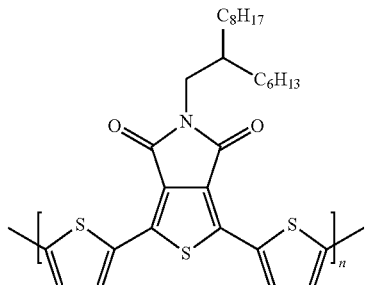

P1

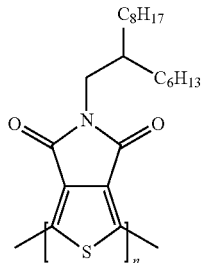

P2

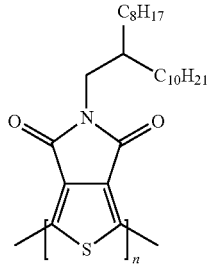

P3

-continued

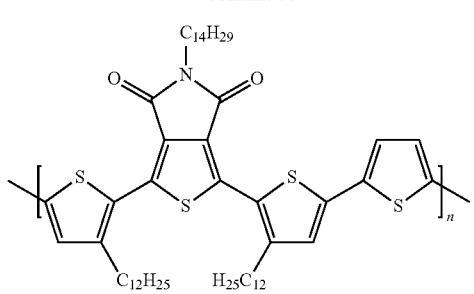

P4

Synthesis of P1

5-(2-hexyldecyl)-5H-thieno[3,4-c]pyrrole-4,6-dione (4) (94.4 mg, 0.25 mmol), 5,5'-dibromo-4,4'-dioctyl-2,2'-bithiophene (128.1 mg, 0.25 mmol), trans-di(μ-acetato)bis[o-(di-o-tolyl-phosphino)benzyl]dipalladium(II) (4.71 mg, 2% mol) (catalyst), ligand (7.04 mg, 8% mol) and $Cs_2CO_3$ (162.9 mg 0.50 mmol) were put in a Biotage microwave vial (size 2 to 5 mL) with a magnetic stirring bar. The vial was sealed with a cap and then purged with nitrogen to remove the oxygen. Dry THF (1 mL; purged with $N_2$) was added and the reaction mixture was heated using an oil bath at 120° C. (reaction under pressure). At the end of the reaction time, the reaction mixture was cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions using acetone, followed by hexanes removed catalytic residues and low molecular weight materials. The polymers were then extracted with chloroform. The solvent was reduced to about 10 mL and the mixture was poured into cold methanol. The resulting precipitate was filtered. P1 was obtained in 96% yield of soluble fraction in $CHCl_3$; $M_n$ of 56 kDa.

Synthesis of P2

1-Iodo-5-(2-hexyldecyl)thieno[3,4]pyrrole-4,6-dione (9) (100.00 mg, 0.20 mmol), trans-di(μ-acetato)bis[o-(di-o-tolyl-phosphino)benzyl]dipalladium(II) (3.71 mg, 2% mol) (catalyst), ligand (5.60 mg, 8% mol), $Cs_2CO_3$ (65.16 mg 0.20 mmol) and silver acetate (33.30 mg, 0.20 mmol) were put in a Biotage microwave vial (size 2 to 5 mL) with a magnetic stirring bar. The vial was sealed with a cap and then purged with nitrogen to remove the oxygen. Dry THF (0.8 mL; purged with $N_2$) was added and the reaction mixture was heated using an oil bath at 120° C. (reaction under pressure). After 22 hours of reaction time, the reaction mixture was cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions using acetone, followed by hexanes removed catalytic residues and low molecular weight materials. The polymers were then extracted with chloroform. The solvent was reduced to about 10 mL and the mixture was poured into cold methanol. The resulting precipitate was filtered. P2 was obtained in 81% yield of soluble fraction in $CHCl_3$; $M_n$ of 11 kDa.

Synthesis of P3

1-Iodo-5-(2-octyldodecyl)thieno[3,4]pyrrole-4,6-dione (10) (100.00 mg, 0.18 mmol), trans-di(μ-acetato)bis[o-(di-o-tolyl-phosphino)benzyl]dipalladium(II) (3.34 mg, 2% mol) (catalyst), ligand (5.04 mg, 8% mol), $Cs_2CO_3$ (58.64 mg 0.18 mmol) and silver acetate (29.97 mg, 0.18 mmol) were put in a Biotage microwave vial (size 2 to 5 mL) with a magnetic stirring bar. The vial was sealed with a cap and then purged with nitrogen to remove the oxygen. Dry THF (0.7 mL; purged with $N_2$) was added and the reaction mixture was heated using an oil bath at 120° C. (reaction under pressure). After 22 hours of reaction time, the reaction was cooled and the corresponding 5-alkylthieno[3,4-c]pyrrole-4,6-dione (50 mg in 1 mL) was added as a capping agent. The solution was subsequently heated again at 120° C. over a period 1 hour to complete the end-capping procedure. After an additional hour of reaction time, the whole mixture was cooled to room temperature and poured into cold methanol (500 mL). The resulting precipitate was filtered. Soxhlet extractions using acetone, followed by hexanes removed catalytic residues and low molecular weight materials. The polymers were then extracted with chloroform. The solvent was reduced to about 10 mL and the mixture was poured into cold methanol. The resulting precipitate was filtered. P3 was obtained in 55% yield of soluble fraction in $CHCl_3$; $M_n$ of 23 kDa.

Synthesis of P4

5-(tetradecyl)-5H-thieno[3,4-c]pyrrole-4,6-dione (41.86 mg, 0.121 mmol), 5,5'''-dibromo-4,4'''-didodecyl-2,2':5',2''-terthiophene (90 mg, 0.121 mmol), trans-di(μ-acetato)bis[o-(di-o-tolyl-phosphino)benzyl]dipalladium(II) (2.28 mg, 2% mol) (catalyst), tris(o-methoxyphenyl)phosphine (3.41 mg, 8% mol) (ligand) and $Cs_2CO_3$ (79 mg 0.242 mmol) were put in a Biotage microwave vial (size 2-5 mL) with a magnetic stirring bar. The vial was sealed with a cap and then purged with nitrogen to remove the oxygen. Dry THF (0.5 mL; purged with $N_2$) was added and the reaction was heated with an oil bath at 120° C. (reaction under pressure) over a period of 20 h. After cooling to room temperature, the reaction mixture was poured into cold methanol (200 mL). The resulting precipitate was filtered. Soxhlet extractions using acetone followed by hexanes removed catalytic residues and low molecular weight materials. The polymers were then extracted with chloroform. The solvent was reduced to about 10 mL and the mixture was poured into cold methanol. P4 was obtained in 49% yield of soluble fraction in $CHCl_3$; $M_n$ of 15 kDa.

Synthesis of P1*

The experimental conditions were those as previously reported by Wei et al., for similar copolymers.[9] 1,3-Dibromo-5-(2-hexyldecyl)-5H-thieno[3,4-c]pyrrole-4,6-dione (8) (74.7 mg, 0.140 mmol), 4,4'-dioctyl-5,5'-bis(trimethylstannyl)-2,2'-bithiophene (7) (100.0 mg, 0.140 mmol), $Pd_2(dba)_3$ (2.6 mg, 2% mol), and $P(o-Tolyl)_3$ (6.8 mg, 16%) were put in a 15 mL round bottom flask which was subsequently purged with $N_2$. Dry chlorobenzene (5 mL; purged with $N_2$) was added and the mixture was stirred at 130° C. over a period of 48 h. Bromobenzene was then added to the reaction mixture followed by the addition of trimethylphenyltin as capping agent one hour later. After an additional hour of reaction time, the reaction mixture was cooled to room temperature and poured into cold methanol (500 mL). The resulting precipitate was filtered. Soxhlet extractions using acetone, followed by hexanes removed catalytic residues and low molecular weight materials. The polymers were then extracted with chloroform. The solvent was reduced to about 30 mL and the mixture was poured into cold methanol. P1* was obtained in 71% yield of soluble fraction in CHCl$_3$; M$_n$ of 9 kDa.

Synthesis of PCTPD by Direct Arylation Polycondensation (n Varies Between 10-200)

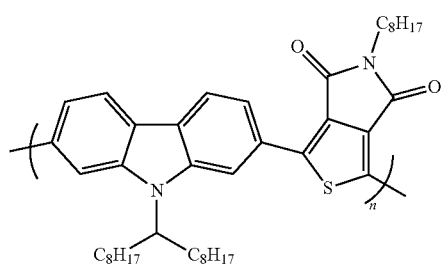

Poly[N-9-heptadecanyl-2,7-carbazole, 3-thiophene-5-octylthieno[3,4-c]pyrrole-4,6-dione] (PCTPD) was synthesized by direct arylation as follows: 5-(2-octyl)-5H-thieno [3,4-c]pyrrole-4,6-dione (94.4 mg, 0.25 mmol), N-9-heptadecanyl-2,7-dibromocarbazole (128.1 mg, 0.25 mmol), palladium acetate (catalyst, 5% mol), tris(2-methoxyphenyl) phosphine (ligand, 15.0% mol) and Cs$_2$CO$_3$ (162.9 mg 0.50 mmol) were added to a Biotage microwave vial (2-5 mL) with a magnetic stirring bar. The vial was sealed with a cap and then purged with nitrogen to remove the oxygen. Dry THF (1 mL; purged with N$_2$) was added and the reaction mixture was heated using an oil bath at 120° C. (reaction under pressure). After 48 hours of reaction time, the reaction mixture was cooled and the corresponding 5-alkylthieno[3, 4-c]pyrrole-4,6-dione was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The precipitate was filtered using a 0.45 µm nylon filter. Soxhlet extractions using acetone, followed by hexanes removed catalytic residues and low molecular weight materials. The polymers were then extracted with chloroform. The solvent was reduced to about 30 mL and the mixture was poured into cold methanol. The resulting purified polymer (dark-red) was obtained in 78% yield (130 mg) following vacuum-drying at 80° C. overnight. $^1$H NMR (400 MHz, CDCl$_3$, ppm) δ: 8.98 (br, 1H), 8.81 (br, 1H), 8.15 (br, 2H), 7.81 (br, 2H), 4.87 (br, 1H), 3.80 (br, 2H), 2.61 (br, 2H), 2.14 (br, 2H), 1.72 (br, 4H), 1.15-1.31 (br, 31H), 0.79 (br, 9H). M$_n$=34 kg/mol; $\overline{M}_w$=44 kg/mol; polydispersity=1.3.

Synthesis of P5 (Stille cross-coupling); poly[2,6-(4, 8-bis-(ethylhexyl-oxyl)benzo[1,2-b:4,5-b]]dithiophene)-alt-4,6-(2-n-octyl)thieno[4,4-d]thiazole]

In a 25 mL flask fitted with a condenser were added 2,6-bis(trimethyltin)-4,8-di(ethylhexyl-oxyl)benzo[1,2-b:4, 5-b']dithiophene (0.392 g, 0.508 mmol), 2-octyl-4,6-dibromo-thieno[3,4-d]thiazole (0.209 g, 0.508 mmol), Pd$_2$dba$_3$ (9.3 mg, 0.0102 mmol), AsPh$_3$ (12.5 mg, 0.0406 mmol), degassed toluene (0.5 mL) and degassed DMF (0.5 mL). The reaction mixture was vigorously stirred for 48 h at 110° C. After reaction completion, bromobenzene (5.3 µL, 0.05 mmol) was added, followed by the addition of trimethyl (phenyl)tin (one hour later) (9.1 µL, 0.05 mmol) and the reaction mixture heated for an additional hour. The reaction mixture was then cooled to room temperature and the polymer precipitated in methanol, filtered through a 0.45 µm nylon filter and washed using a Soxhlet apparatus with acetone, hexanes and then chloroform. The chloroform fraction was subsequently reduced to 20-30 mL and then precipitated in methanol, filtered through a 0.45 µm nylon filter and air-dried to give 0.341 g of the desired polymer. (Yield: 97%).

Synthesis of P5 (Direct Arylation); poly[2,6-(4,8-bis-(ethylhexyl-oxyl)benzo[1,2-b:4,5-b']dithiophene)-alt-4,6-(2-n-octyl)thieno[4,4-d]thiazole]

2,6-Dibromo-4,8-di(ethylhexyl-oxyl)benzo[1,2-b:4,5-b'] dithiophene (0.192 g, 0.318 mmol), 2-octylthieno[3,4-d] thiazole (0.0805 g, 0.318 mmol), trans-di(µ-acetato)bis[o-(di-o-tolyl-phosphino)benzyl]dipalladium(II) (5.9 mg, 2% mol), pivalic acid (9.7 mg, 30% mol), tris(2-methoxyphenyl) phosphine (9.05 mg, 8% mol) and cesium carbonate (238.0 mg 0.73 mmol) were put in a Biotage microwave vial (size 2 to 5 mL) equipped with a magnetic stirring bar. The vial was sealed with a cap and then purged with nitrogen to remove any oxygen. Toluene (2.1 mL) was added and the reaction mixture was heated with an oil bath at 120° C. (reaction under pressure) for 24 h. The reaction mixture was then cooled to room temperature and the polymer precipitated in methanol, filtered through a 0.45 µm nylon filter and washed using a Soxhlet apparatus with acetone, hexanes and then chloroform. The chloroform fraction was subsequently reduced to 20-30 mL and then precipitated in methanol, filtered through a 0.45 µm nylon filter and air-dried to give 0.111 g of the desired polymer. (Yield: 50%).

Synthesis of P6; poly[4,6-(2-octylthieno[3,4-d]thiazole)-alt-1,3-(5-(heptadecan-9-yl)-5H-thieno[3,4-c] pyrrole-4,6-dione)]

5-(Heptadecan-9-yl)-5H-thieno[3,4-c]pyrrole-4,6-dione (0.150 g, 0.38 mmol), 2-octyl-4,6-dibromo-thieno[3,4-d] thiazole (0.157 g, 0.38 mmol), trans-di(µ-acetato)bis[o-(di-o-tolyl-phosphino)benzyl]dipalladium(II) (7.2 mg, 2% mol), pivalic acid (11.7 mg, 30% mol), tris(2-methoxyphenyl) phosphine (10.7 mg, 4% mol) and cesium carbonate (250.0 mg 0.76 mmol) were put in a Biotage microwave vial (size 2 to 5 mL) equipped with a magnetic stirring bar. The vial was sealed with a cap and then purged with nitrogen to remove any oxygen. THF (1.5 mL) was added and the reaction was heated with using oil bath at 120° C. (reaction under pressure) for 24 h. The reaction mixture was then cooled to room temperature and the polymer precipitated in methanol, filtered through a 0.45 µm nylon filter and washed using a Soxhlet apparatus with acetone, hexanes and then chloroform. The chloroform fraction was reduced to 20-30 mL and then precipitated in methanol, filtered through a 0.45 µm nylon filter and air-dried to give 0.100 g of the desired polymer. (Yield: 77%).

Synthesis of P7; poly[4,6-(2-octylthieno[3,4-d]thiazole)-alt-3,6-bis(thiophen-5-yl)-2,5-bis(2-octyldodecyl)pyrrolo[3,4-d]pyrrole-1,4(2H,5H)-dione]

3,6-bis(5-bromothiophen-2-yl)-2,5-bis(2-octyldodecyl) pyrrolo[3,4-c]pyrrole-1,4(2H,5H)-dione (0.112 g, 0.109 mmol), 2-octylthieno[3,4-d]thiazole, (0.028 g, 0.109 mmol), trans-di(µ-acetato)bis[o-(di-o-tolyl-phosphino)benzyl]dipalladium(II) (1.8 mg, 2% mol), pivalic acid (3.1 mg, 30% mol), tris(2-methoxyphenyl)phosphine (2.8 mg, 4% mol) and cesium carbonate (74.9 mg 0.4 mmol) were put in a Biotage microwave vial (size 2 to 5 mL) equipped with a magnetic stirring bar. The vial was sealed with a cap and then purged with nitrogen to remove any oxygen. THF (1 mL) was added and the reaction mixture was heated using oil bath at 120° C. (reaction under pressure) for 24 h. The reaction mixture was subsequently cooled to room temperature and the polymer precipitated in methanol, filtered through a 0.45 μm nylon filter and washed using a Soxhlet apparatus with acetone, hexanes and then chloroform. The chloroform fraction was reduced to 20-30 mL and then precipitated in methanol, filtered through a 0.45 μm nylon filter and air-dried to give 0.072 g of the desired polymer. (Yield: 60%).

Synthesis of P9

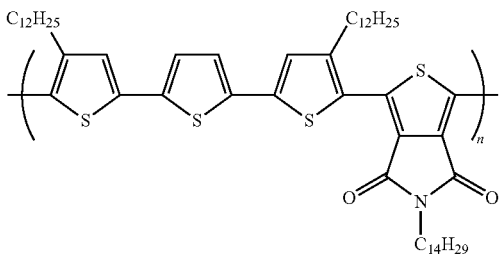

5-(Tetradecyl)-5H-thieno[3,4-c]pyrrole-4,6-dione (41.86 mg, 0.121 mmol), 5,5"-dibromo-4,4"-didodecyl-2,2':5',2"-terthiophene (90 mg, 0.121 mmol), trans-di(μ-acetato)bis[o-(di-o-tolyl-phosphino)benzyl]dipalladium(II) (2.28 mg, 4% mol), tris(o-methoxyphenyl)phosphine (3.41 mg, 8% mol) and Cs$_2$CO$_3$ (79 mg 0.242 mmol) were added in a Biotage microwave vial (2-5 mL) equipped with a magnetic stirring bar. The vial was sealed with a cap and then purged with nitrogen to remove any oxygen. THF (0.5 mL) was added and the reaction mixture was heated using an oil bath at 120° C. (reaction under pressure) for 20 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P9 was obtained in 49% yield of soluble fraction in CHCl$_3$ (M$_n$ of 10 kDa, M$_w$=16 kDa, PDI=1.52).

Synthesis of P10

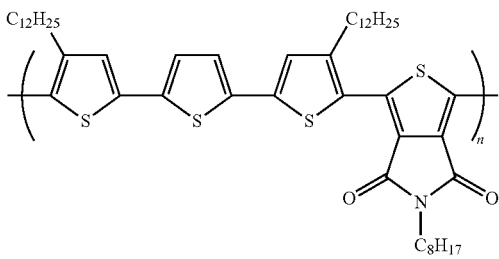

5-(Octyl)-5H-thieno[3,4-c]pyrrole-4,6-dione (32.1 mg, 0.121 mmol), 5,5"-dibromo-4,4"-didodecyl-2,2':5',2"-terthiophene (90 mg, 0.121 mmol), trans-di(μ-acetato)bis[o-(di-o-tolyl phosphino)benzyl]dipalladium(II) (2.28 mg, 4% mol), tris(o-methoxyphenyl)phosphine (3.41 mg, 8% mol) and Cs$_2$CO$_3$ (79 mg 0.242 mmol) were added in a Biotage microwave vial (2-5 mL) equipped with a magnetic stirring bar. The vial was sealed with a cap and then purged with nitrogen to remove any oxygen. THF (0.5 mL) was added and the reaction mixture was heated using an oil bath at 120° C. (reaction under pressure) for 20 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P10 was obtained in 49% yield of soluble fraction in CHCl$_3$ (M$_n$ of 10 kDa, M$_w$=13.6 kDa, PDI=1.31).

Synthesis of P11

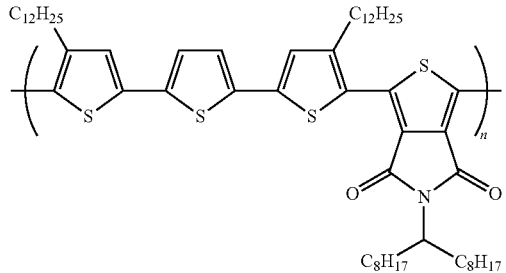

5-(9-Heptadecanyl)-4H-thieno[3,4-c]pyrrole-4,6-dione (118.5 mg, 0.303 mmol), 5,5'-dibromo-4,4'-didodecyl-2,2'-bithiophene (200 mg, 0.303 mmol), trans-di(μ-acetato)bis[o-(di-o-tolyl-phosphino)benzyl]dipalladium(II) (5.8 mg, 4% mol), tris(o-methoxyphenyl)phosphine (8.5 mg, 8% mol) and Cs$_2$CO$_3$ (197 mg 0.61 mmol) were added in a Biotage microwave vial (2-5 mL) equipped with a magnetic stirring bar. The vial was sealed with a cap and then purged with nitrogen to remove any oxygen. THF (1.25 mL) was added and the reaction mixture was heated using an oil bath at 120° C. (reaction under pressure) for 22 h. The reaction mixture was then cooled to room temperature and the polymer precipitated by pouring the mixture into cold methanol (300 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P11 was obtained in 94% yield of soluble fraction in CHCl$_3$ (M$_n$ of 48 kDa, M$_w$=110 kDA, PDI=2.3).

Synthesis of P12

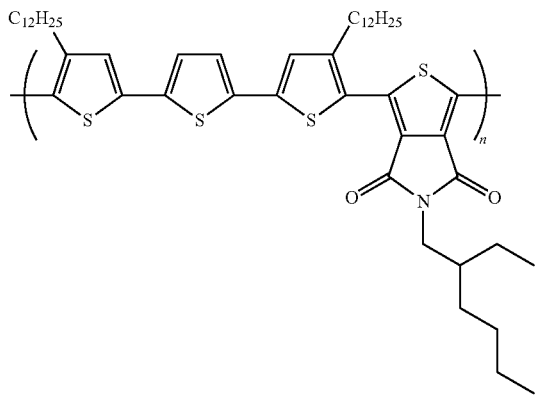

5-(2-Ethylhexyl)-5H-thieno[3,4-c]pyrrole-4,6-dione (32.13 mg, 0.121 mmol), 5,5"-dibromo-4,4"-didodecyl-2,2':5',2"-terthiophene (90 mg, 0.121 mmol), trans-di(μ-acetato)bis[o-(di-o-tolyl phosphino)benzyl]dipalladium(II) (2.28 mg, 4% mol), tris(o-methoxyphenyl)phosphine (3.41 mg, 8% mol) and $Cs_2CO_3$ (79 mg 0.242 mmol) were added in a Biotage microwave vial (2-5 mL) equipped with a magnetic stirring bar. The vial was sealed with a cap and then purged with nitrogen to remove any oxygen. THF (0.5 mL) was added and the reaction mixture was heated using an oil bath at 120° C. (reaction under pressure) for 20 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P12 was obtained in 35% yield of soluble fraction in $CHCl_3$ ($M_n$ of 9.7 kDa, $M_w$=12.6 kDa, PDI=1.3).

Synthesis of P13

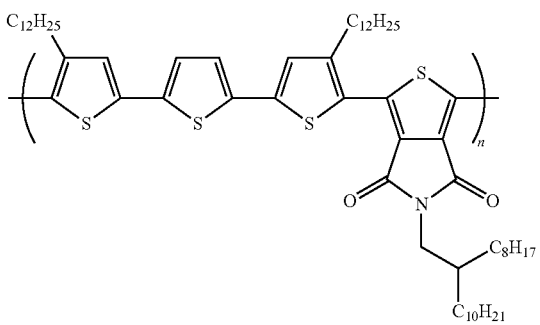

5(2-Octyldodecyl)thieno[3,4]pyrrole-4,6-dione (52.51 mg, 0.121 mmol), 5,5"-dibromo-4,4"-didodecyl-2,2':5',2"-terthiophene (90 mg, 0.121 mmol), trans-di(μ-acetato)bis[o-(di-o-tolyl phosphino)benzyl]dipalladium(II) (2.28 mg, 4% mol), tris(o-methoxyphenyl)phosphine (3.41 mg, 8% mol) and $Cs_2CO_3$ (79 mg 0.242 mmol) were added in a Biotage microwave vial (2-5 mL) equipped with a magnetic stirring bar. The vial was sealed with a cap and then purged with nitrogen to remove any oxygen. THF (0.5 mL) was added and the reaction mixture was heated with an oil bath at 120° C. (reaction under pressure) for 20 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P13 was obtained in 80% yield of soluble fraction in $CHCl_3$ ($M_n$ of 32 kDa, $M_w$=65.3 kDa, PDI=2.04).

Synthesis of P14

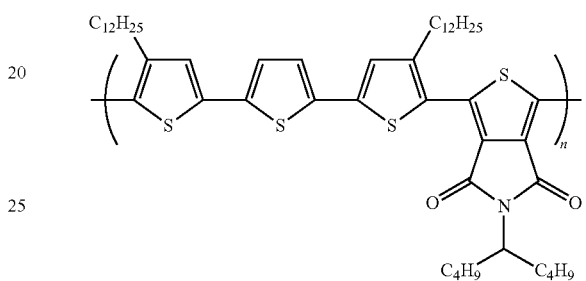

5-(Nonan-5-yl)-5H-thieno[3,4-c]pyrrole-4,6-dione (67.7 mg, 0.242 mmol), 5,5"-dibromo-4,4"-didodecyl-2,2':5',2"-terthiophene (180 mg, 0.242 mmol), trans-di(μ-acetato)bis[o-(di-o-tolyl phosphino)benzyl]dipalladium(II) (4.56 mg, 4% mol), tris(o-methoxyphenyl)phosphine (6.82 mg, 8% mol), $Cs_2CO_3$ (158 mg 0.484 mmol) and pivalic acid (7 mg, 30% mol) were added in a Biotage microwave vial (2-5 mL) equipped with a magnetic stirring bar. The vial was sealed with a cap and then purged with nitrogen to remove any oxygen. THF (1.0 mL) was added and the reaction mixture was heated using an oil bath at 120° C. (reaction under pressure) for 15 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P14 was obtained in 80% yield of soluble fraction in $CHCl_3$ ($M_n$ of 18 kDa, $M_w$=45 kDa, PDI=2.5).

Synthesis of P15

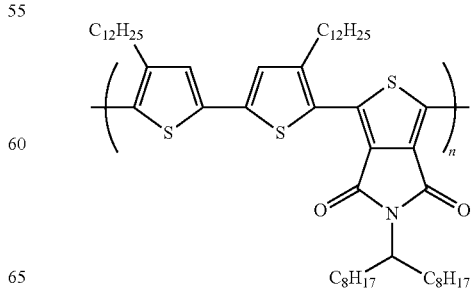

5-(9-Heptadecanyl)-4H-thieno[3,4-c]pyrrole-4,6(5H)-dione (118.5 mg, 0.303 mmol), 5,5'-dibromo-4,4'-didodecyl-2,2'-bithiophene (200 mg, 0.303 mmol), trans-di(μ-acetato)bis[o-(di-o-tolyl-phosphino)benzyl]dipalladium(II) (5.8 mg, 4% mol), tris(o-methoxyphenyl)phosphine (8.5 mg, 8% mol) and $Cs_2CO_3$ (197 mg 0.61 mmol) were added in a Biotage microwave vial (2-5 mL) equipped with a magnetic stirring bar. The vial was sealed with a cap and then purged with nitrogen to remove any oxygen. THF (1.25 mL) was added and the reaction mixture was heated with an oil bath at 120° C. (reaction under pressure) for 22 h. The reaction mixture was then cooled to room temperature and the polymer precipitated by pouring the mixture into cold methanol (300 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P15 was obtained in 94% yield of soluble fraction in $CHCl_3$ ($M_n$ of 50 kDa, $M_w$=103 kDa, PDI=2.06).

Synthesis of P16

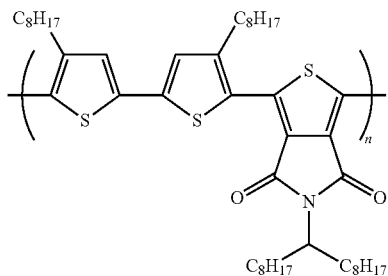

5-(9-Heptadecanyl)-4H-thieno[3,4-c]pyrrole-4,6(5H)-dione (107.7 mg, 0.273 mmol), 5,5'-dibromo-4,4'-dioctyl-2,2'-bithiophene (150 mg, 0.273 mmol), trans-di(μ-acetato)bis[o-(di-o-tolyl-phosphino)benzyl]dipalladium(II) (5.6 mg, 4% mol), tris(o-methoxyphenyl)phosphine (8.2 mg, 8% mol) and $Cs_2CO_3$ (180 mg 0.546 mmol) were added in a Biotage microwave vial (2-5 mL) equipped with a magnetic stirring bar. The vial was sealed with a cap and then purged with nitrogen to remove any oxygen. THF (1.22 mL) was added and the reaction mixture was heated using an oil bath at 120° C. (reaction under pressure) for 22 h. The reaction mixture was then cooled to room temperature and the polymer precipitated by pouring the mixture into cold methanol (300 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P16 was obtained in 94% yield of soluble fraction in $CHCl_3$ ($M_n$ of 47 kDa, $M_w$=98 kDa, PDI=2.08).

Synthesis of P17

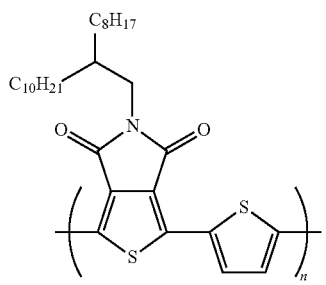

5-(2-Octyldodecyl)thieno[3,4]pyrrole-4,6-dione (108.4 mg, 0.25 mmol), 2,5-dibromothiophene (60.48 mg, 0.25 mmol), trans-di(μ-acetato)bis[o-(di-o-tolyl phosphino)benzyl]dipalladium(II) (5 mg, 4% mol), tris(o-methoxyphenyl)phosphine (7.3 mg, 8% mol) and $Cs_2CO_3$ (170 mg 0.5 mmol) were added in a Biotage microwave vial (2-5 mL) equipped with a magnetic stirring bar. The vial was sealed with a cap and then purged with nitrogen to remove any oxygen. THF (1.2 mL) was added and the reaction mixture was heated using an oil bath at 120° C. (reaction under pressure) for 20h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P17 was obtained in 71% yield of soluble fraction in $CHCl_3$ ($M_n$ of 13 kDa, $M_w$=20.8 kDa, PDI=1.6).

Synthesis of P18

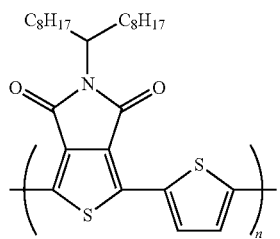

5-(9-Heptadecanyl)-4H-thieno[3,4-c]pyrrole-4,6(5H)-dione (97.9 mg, 0.25 mmol), 2,5-dibromothiophene (60.48 mg, 0.25 mmol), trans-di(μ-acetato)bis[o-(di-o-tolyl phosphino)benzyl]dipalladium(II) (5 mg, 4% mol), tris(o-methoxyphenyl)phosphine (7.3 mg, 8% mol) and $Cs_2CO_3$ (170 mg 0.5 mmol) were added in a Biotage microwave vial (2-5 mL) equipped with a magnetic stirring bar. The vial was sealed with a cap and then purged with nitrogen to remove any oxygen. THF (1.2 mL) was added and the reaction mixture was heated using an oil bath at 120° C. (reaction under pressure) for 16 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Since the desired polymers were substantially insoluble in chloroform, the residue was extracted with hot o-dichlorobenzene. The solvent was reduced to about 10 mL and the mixture was poured into cold methanol. P18 was obtained in 52% yield ($M_n$ of 15.9 kDa, $M_w$=41.2 kDa, PDI=2.59).

Synthesis of P19

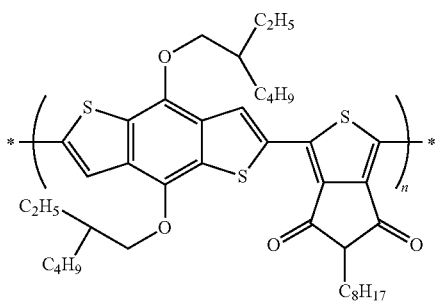

5-(Octyl)-5H-thieno[3,4-c]pyrrole-4,6-dione (93.5 mg, 0.352 mmol), 2,6-dibromo-4,8-bis[(2-ethylhexyl)oxy]-benzo[1,2-b:4,5-b']dithiophene (213 mg, 0.352 mmol), trans-di(µ-acetato)bis[o-(di-o-tolyl phosphino)benzyl]dipalladium(II) (6.6 mg, 4% mol), tris(o-methoxyphenyl)phosphine (10 mg, 8% mol), $Cs_2CO_3$ (340 mg 0.71 mmol) and pivalic acid (13 mg, 30% mol) were added in a Biotage microwave vial (2-5 mL) equipped with a magnetic stirring bar. The vial was sealed with a cap and then purged with nitrogen to remove any oxygen. Toluene (2.5 mL) was added and the reaction mixture was heated using an oil bath at 120° C. (reaction under pressure) for 24 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Since the desired polymers were substantially insoluble in chloroform, the residue was extracted with hot o-dichlorobenzene. The solvent was reduced to about 10 mL and the mixture was poured into cold methanol. P19 was obtained in 75% yield ($M_n$ of 50.8 kDa, $M_w$=144.6 kDa, PDI=2.85).

Synthesis of P20

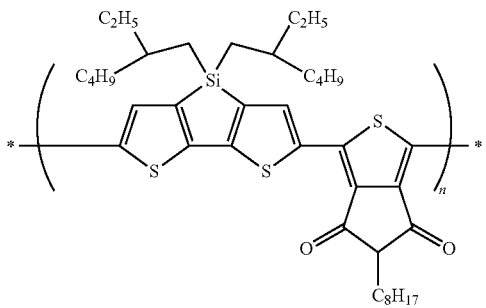

5-(Octyl)-5H-thieno[3,4-c]pyrrole-4,6-dione (126.4 mg, 0.476 mmol), 2,6-dibromo-4,8-bis(2-ethylhexyl) 4H-silolo [3,2-b:4,5-b']dithiophene (274.7 mg, 0.476 mmol), trans-di (µ-acetato)bis[o-(di-o-tolyl phosphino)benzyl]dipalladium (II) (8.9 mg, 4% mol), tris(o-methoxyphenyl)phosphine (13.7 mg, 8% mol), $Cs_2CO_3$ (505 mg 0.97 mmol) and pivalic acid (17 mg, 30% mol) were added in a Biotage microwave vial (2-5 mL) equipped with a magnetic stirring bar. The vial was sealed with a cap and then purged with nitrogen to remove any oxygen. Toluene (2.15 mL) was added and the reaction mixture was heated using an oil bath at 120° C. (reaction under pressure) for 23 h. The reaction mixture was then cooled to room temperature and the polymer precipitated by pouring the mixture into cold methanol (200 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P20 was obtained in 55% yield ($M_n$ of 21.2 kDa, $M_w$=66.6 kDa, PDI=3.14).

Synthesis of P21

1,3-Di(5'-bromo-3-octylthien-2'-yl)-5-octylthieno[3,4-c] pyrrole-4,6-dione (203.0 mg, 0.25 mmol), 5-octyl-thieno[3,4-c]pyrrole-4,6-dione (66.3 mg, 0.25 mmol), trans-di(µ-acetato)bis[o-(di-o-tolyl-phosphino)benzyl]dipalladium(II) (4.71 mg, 2% mol), tri-tert-butylphosphonium tetrafluoroborate (5.8 mg, 8% mol) and $Cs_2CO_3$ (162.9 mg 0.50 mmol) were put in a Biotage microwave vial (size 2 to 5 mL) equipped with a magnetic stirring bar. The vial was sealed with a cap and then purged with nitrogen to remove any oxygen. THF (1.0 mL) was added and the reaction mixture was heated using an oil bath at 120° C. (reaction under pressure) for 24 h. The reaction mixture was then cooled to room temperature and the polymer precipitated by pouring the mixture into cold methanol (500 mL). The precipitate was subsequently filtered. Soxhlet extractions with acetone followed by hexanes removed catalytic residues and low molecular weight materials. Polymers were then extracted with chloroform. The solvent was reduced to about 10 mL and the mixture was poured into cold methanol. P21 was obtained in 96% yield of soluble fraction in $CHCl_3$.

Synthesis of P22

1-Iodo-5-(alkyl)thieno[3,4]pyrrole-4,6-dione (0.18 mmol), trans-di(µ-acetato)bis[o-(di-o-tolyl-phosphino)benzyl]dipalladium(II) (3.34 mg, 4% mol), ligand (5.04 mg, 8% mol), $Cs_2CO_3$ (58.64 mg, 0.18 mmol) and silver acetate (29.97 mg, 0.18 mmol) were added in a Biotage microwave vial (size 2 to 5 mL) equipped with a magnetic stirring bar. The vial was sealed with a cap and then purged with nitrogen to remove any oxygen. THF (0.7 mL) was added and the reaction mixture was heated using an oil bath at 120° C. (reaction under pressure) for 22 h. The reaction mixture was then cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions with acetone followed by hexanes removed catalytic residues and low molecular weight materials. Polymers were then extracted with chloroform. The solvent was reduced to about 10 mL and the mixture was poured into cold methanol. The resulting precipitate was filtered to yield P22.

Synthesis of P23-24

1-Bromo-5-(alkyl)thieno[3,4]pyrrole-4,6-dione (0.18 mmol), trans-di(μ-acetato)bis[o-(dio-tolyl-phosphino)benzyl]dipalladium(II) (3.34 mg, 4% mol), ligand (5.04 mg, 8% mol) and KOAc (58.64 mg, 0.18 mmol) were added in a Biotage microwave vial (size 2 to 5 mL) equipped with a magnetic stirring bar. The vial was sealed with a cap and then purged with nitrogen to remove any oxygen. THF (0.7 mL) was added and the reaction mixture was heated using an oil bath at 120° C. (reaction under pressure) for 22 h. The reaction mixture was then cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions with acetone followed by hexanes removed catalytic residues and low molecular weight materials. Polymers were then extracted with chloroform. The solvent was reduced to about 10 mL and the mixture was poured into cold methanol. The resulting precipitate was filtered to yield P22 or P23.

Synthesis of P25-28

5-alkylthieno[3,4-c]pyrrole-4,6-dione (0.25 mmol), 1,3-dibromo-5-alkylthieno[3,4-c]pyrrole-4,6-dione (0.25 mmol), trans-di(μ-acetato)bis[o-(dio-tolyl-phosphino)benzyl]dipalladium(II) (4% mol), ligand (8% mol) and potassium acetate (0.50 mmol) were added in a Biotage microwave vial (size 2 to 5 mL) equipped with a magnetic stirring bar. The vial was sealed with a cap and then purged with nitrogen to remove any oxygen. THF (1.0 mL) was added and the reaction mixture was heated with an oil bath at 120° C. (reaction under pressure) for 24 h. The reaction mixture was then cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions with acetone followed by hexanes removed catalytic residues and low molecular weight materials. Polymers were then extracted with chloroform. The solvent was reduced to about 10 mL and the mixture was poured into cold methanol. The resulting precipitate was filtered to yield either of P25-P28.

Synthesis of P29

1-Bromo-5-(alkyl)thieno[3,4]pyrrole-4,6-dione (0.75 mmol), 1-Bromo-5-(alkyl)thieno[3,4]pyrrole-4,6-dione (0.25 mmol), trans-di(μ-acetato)bis[o-(dio-tolyl-phosphino)benzyl]dipalladium(II) (4% mol), ligand (8% mol) and KOAc (1.00 mmol) were added in a Biotage microwave vial (size 2 to 5 mL) equipped with a magnetic stirring bar. The vial was sealed with a cap and then purged with nitrogen to remove any oxygen. THF (2 mL) was added and the reaction mixture was heated using an oil bath at 120° C. (reaction under pressure) for 22 h. The reaction mixture was then cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions with acetone followed by hexanes removed catalytic residues and low molecular weight materials. Polymers were then extracted with chloroform. The solvent was reduced to about 10 mL and the mixture was poured into cold methanol. The resulting precipitate was filtered to yield P29.

Synthesis of P30

3,6-Bis(5-bromothiophen-2-yl)-2,5-bis(2-octyldodecyl)pyrrolo[3,4-c]pyrrole-1,4(2H,5H)-dione (101.9 mg, 0.1 mmol), 5-octylthieno[3,4-c]pyrrole-4,6-dione (26.5 mg, 0.1 mmol), Pd(o-tol)(OAc) (1.9 mg, 4%), tris(ortho-methoxyphenyl)phosphine (2.8 mg, 8%), cesium carbonate (74.9 mg, 0.23 mmol) and pivalic acid (3.1 mg, 0.03 mmol) were added in a Biotage microwave vial (5 mL) equipped with a magnetic stirring bar. The vial was sealed with a cap and then purged with nitrogen to remove any oxygen. Toluene (0.4 mL) was added and the reaction mixture was heated using an oil bath at 120° C. (reaction under pressure) for 24 h. The reaction mixture was then cooled to room temperature and the polymer precipitated by pouring the mixture into cold methanol/water (250/25 mL). The precipitate was subsequently filtered. Soxhlet extractions with methanol followed by hexanes removed catalytic residues and low molecular weight materials. Polymers were then extracted with chloroform. The solvent was reduced to about 10 mL and the mixture was poured into cold methanol. P30 was obtained in 76% yield ($M_n$ of 20.6 kDa, $M_w$=36.1 kDa, PDI=1.8).

Synthesis of P31

3,6-Bis(5-bromothiophen-2-yl)-2,5-bis(2-octyldodecyl)pyrrolo[3,4-c]pyrrole-1,4(2H,5H)-dione (101.9 mg, 0.1 mmol), bis(5-octylthieno[3,4-c]pyrrole-4,6-dione) (52.9 mg, 0.1 mmol), Pd(o-tol)(OAc) (1.9 mg, 4%), tris(ortho-methoxyphenyl)phosphine (2.8 mg, 8%), cesium carbonate (74.9 mg, 0.23 mmol) and pivalic acid (3.1 mg, 0.03 mmol) were added in a Biotage microwave vial (5 mL) equipped with a magnetic stirring bar. The vial was sealed with a cap and then purged with nitrogen to remove any oxygen. Toluene (0.4 mL) was added and the reaction mixture was heated using an oil bath at 120° C. (reaction under pressure) for 48 h. The reaction mixture was then cooled to room temperature and the polymer precipitated by pouring the mixture into cold methanol/water (250/25 mL). Soxhlet extractions with methanol followed by hexanes removed catalytic residues and low molecular weight materials. Polymers were then extracted with chloroform. The solvent was reduced to about 10 mL and the mixture was poured into cold methanol. P31 was obtained in 90% yield ($M_n$ of 28.1 kDa, $M_w$=93.0 kDa, PDI=3.3).

Synthesis of P32

3,6-Bis(5-bromothiophen-2-yl)-2,5-bis(2-octyldodecyl)pyrrolo[3,4-c]pyrrole-1,4(2H,5H)-dione (101.9 mg, 0.1 mmol), 3,4-dicyanothiophene (13.4 mg, 0.1 mmol), Pd(o-tol)(OAc) (1.9 mg, 4%), tris(ortho-methoxyphenyl)phosphine (2.8 mg, 8%), cesium carbonate (74.9 mg, 0.23 mmol) and pivalic acid (3.1 mg, 0.03 mmol) were added in a Biotage microwave vial (5 mL) equipped with a magnetic stirring bar. The vial was sealed with a cap and then purged with nitrogen to remove any oxygen. Toluene (0.4 mL) was added and the reaction mixture was heated using an oil bath at 120° C. (reaction under pressure) for 48 h. The reaction mixture was then cooled to room temperature and the polymer precipitated by pouring the mixture into cold methanol/water (250/25 mL). Soxhlet extractions with methanol followed by hexanes removed catalytic residues and low molecular weight materials. Polymers were then extracted with chloroform. The solvent was reduced to about 10 mL and the mixture was poured into cold methanol. P32 was obtained in 94% yield ($M_n$ of 14.4 kDa, $M_w$=27.8 kDa, PDI=1.9).

Synthesis of P33

3,6-Bis(5-bromothiophen-2-yl)-2,5-bis(2-octyldodecyl)pyrrolo[3,4-c]pyrrole-1,4(2H,5H)-dione (101.9 mg, 0.1 mmol), 3,4-ethylenedioxythiophene (14.2 mg, 0.1 mmol), Pd(o-tol)(OAc) (1.9 mg, 4%), tris(ortho-methoxyphenyl)phosphine (2.8 mg, 8%), cesium carbonate (74.9 mg, 0.23 mmol) and pivalic acid (3.1 mg, 0.03 mmol) were added in a Biotage microwave vial (5 mL) equipped with a magnetic stirring bar. The vial was sealed with a cap and then purged with nitrogen to remove any oxygen. Toluene (0.4 mL) was added and the reaction mixture was heated using an oil bath at 120° C. (reaction under pressure) for 72 h. The reaction mixture was then cooled to room temperature and the polymer precipitated by pouring the mixture into cold methanol/water (250/25 mL). Soxhlet extractions with methanol followed by hexanes removed catalytic residues and low molecular weight materials. Polymers were then extracted with chloroform. The solvent was reduced to about 10 mL and the mixture was poured into cold methanol. P33 was obtained in 52% yield ($M_n$ of 5.1 kDa, $M_w$=6.5 kDa, PDI=1.3).

Synthesis of P34

Monomer 17 (61.2 mg, 0.15 mmol), monomer 28 (65.0 mg, 0.15 mmol), tris(ortho-methoxyphenyl)phosphine (4.2 mg, 0.012 mmol), cesium carbonate (117.3 mg, 0.36 mmol) and pivalic acid (6.1 mg, 0.06 mmol) were added in a Biotage microwave vial (5 mL) equipped with a magnetic stirring bar. The vial was sealed with a cap and then purged with nitrogen to remove any oxygen. Toluene (0.75 mL) was added and the reaction mixture was heated using an oil bath at 120° C. (reaction under pressure) for 14 h. The reaction mixture was then cooled to room temperature, the crude reaction mixture dissolved in $CHCl_3$ and the polymer precipitated in cold methanol/water (200/25 mL). Soxhlet extractions with acetone followed by hexanes removed catalytic residues and low molecular weight materials. Polymers were then extracted with chloroform. The solvent was reduced to about 20 mL and the mixture was poured into cold methanol. P34 was obtained in 73% yield ($M_n$ of 11.5 kDa, $M_w$=30.2 kDa, PDI=2.63; UV-vis: ($CHCl_3$) $\lambda_{max}$=512 nm, (solid) $\lambda_{max}$=585, 628, 683 nm).

Synthesis of P35

Monomer 18 (105.8 mg, 0.17 mmol), monomer 23 (43.4 mg, 0.15 mmol), Pd(o-tol)(OAc) (4.8 mg, 0.0051 mmol), tris(ortho-methoxyphenyl)phosphine (6.7 mg, 0.019 mmol), cesium carbonate (149.9 mg, 0.46 mmol) and pivalic acid (6.9 mg, 0.068 mmol) were added in a Biotage microwave vial (5 mL) equipped with a magnetic stirring bar. The vial was sealed with a cap and then purged with nitrogen to remove any oxygen. Toluene (0.85 mL) was added and the reaction mixture was heated using an oil bath at 120° C. (reaction under pressure) for 25 h. The reaction mixture was then cooled to room temperature, the crude reaction mixture dissolved in $CHCl_3$ and the polymer precipitated in cold methanol/water (200/50 mL). Soxhlet extractions with acetone followed by hexanes removed catalytic residues and low molecular weight materials. Polymers were then extracted with chloroform. The solvent was reduced to about 20 mL and the mixture was poured into cold methanol. P35 was obtained in 70% yield ($M_n$=14.5 kDa, $M_w$=23.0 kDa, PDI=1.49; UV-vis: ($CHCl_3$) 526 nm, (solid) $\lambda_{max}$=541 nm).

Synthesis of P36

Monomer 27 (93.2 mg, 0.15 mmol), monomer 23 (39.8 mg, 0.15 mmol), Pd(o-tol)(OAc) (3.8 mg, 0.004 mmol), tris(ortho-methoxyphenyl)phosphine (5.6 mg, 0.016 mmol), cesium carbonate (130 mg, 0.40 mmol) and pivalic acid (6.1 mg, 0.06 mmol) were added in a Biotage microwave vial (5 mL) equipped with a magnetic stirring bar. The vial was sealed with a cap and then purged with nitrogen to remove any oxygen. Toluene (0.75 mL) was added and the reaction mixture was heated using an oil bath at 120° C. (reaction under pressure) for 15.5 h. The reaction mixture was then cooled to room temperature, the crude reaction mixture dissolved in $CHCl_3$ and the polymer precipitated in cold methanol/water (200/50 mL). Soxhlet extractions with acetone followed by hexanes removed catalytic residues and low molecular weight materials. Polymers were then extracted with chloroform. The solvent was reduced to about 20 mL and the mixture was poured into cold methanol. P36 was obtained in 73% ($M_T$, $M_w$=14.0 kDa, $M_w$=32.4 kDa, PDI=2.3; UV-vis: (solid) $\lambda_{max}$=620, 677 nm).

Synthesis of P37

5-Octyl-5H-thieno[3,4-c]pyrrole-4,6-dione (23) (53.1 mg, 0.2 mmol), 6,6'-dibromo-N,N'-(2-hexyldecyl)-isoindigo (31) (173.8 mg, 0.20 mmol), trans-di(μ-acetato)bis[o-(di-o-tolyl-phosphino)benzyl]dipalladium(II) (9.4 mg, 2% mol), tris(o-methoxyphenyl)phosphine (14.1 mg, 8% mol) and $Cs_2CO_3$ (130 mg, 0.40 mmol) were added in a Biotage microwave vial (5 mL) equipped with a magnetic stirring bar. The vial was sealed with a cap and then purged with nitrogen to remove any oxygen. THF (1.0 mL) was added and the reaction mixture was heated using an oil bath at 120° C. (reaction under pressure) for 22 h. The reaction mixture was then cooled and the corresponding 5-alkylthieno[3,4-c]pyrrole-4,6-dione (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (500 mL). The resulting precipitate was filtered. Soxhlet extractions with acetone followed by hexanes removed catalytic residues and low molecular weight materials. Polymers were then extracted with chloroform. The solvent was reduced to about 10 mL and the mixture was poured into cold methanol. The resulting precipitate was filtered. P37 was obtained in 77% yield of soluble fraction in $CHCl_3$; $M_n$ of 24.0 kDa and $M_w$ of 52.9 kDa.

Synthesis of P38

5,5'-Dioctyl-4H,4'H-1,1'-bithieno[3,4-c]pyrrole-4,4',6,6'(5H,5'H)-tetrone (24) (52.9 mg, 0.1 mmol), 6,6'-dibromo- N,N'-(2-hexyldecyl)-isoindigo (31) (86.9 mg, 0.10 mmol), trans-di(μ-acetato)bis[o-(di-o-tolyl-phosphino)benzyl]dipalladium(II) (1.9 mg, 2% mol), tri-tert-butylphosphonium tetrafluoroborate (2.3 mg, 8% mol) and potassium acetate anhydrous (19.6 mg, 0.20 mmol) were added in a Biotage microwave vial (size 2 to 5 mL) equipped with a magnetic stirring bar. The vial was sealed with a cap and then purged with nitrogen to remove any oxygen. THF (0.5 mL) was added and the reaction mixture was heated using an oil bath at 120° C. (reaction under pressure) for 22 h. The reaction mixture was then cooled and the corresponding 5,5'-dioctyl-4H,4'H-1,1'-bithieno[3,4-c]pyrrole-4,4',6,6'(5H,5'H)-tetrone (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (300 mL). The resulting precipitate was filtered. Soxhlet extractions with acetone followed by hexanes removed catalytic residues and low molecular weight materials. Polymers were then extracted with chloroform. The solvent was reduced to about 5 mL and the mixture was poured into cold methanol. The resulting precipitate was filtered. P38 was obtained in 87% yield of soluble fraction in CHCl$_3$; M$_n$ of 19.5 kDa and M$_w$ of 42.9 kDa.

Synthesis of P39

3,4-Ethylenedioxythiophene (26) (15.0 mg, 0.106 mmol), 6,6'-dibromo-N,N'-(2-hexyldecyl)-isoindigo (31) (91.7 mg, 0.106 mmol), trans-di(μ-acetato)bis[o-(di-o-tolyl-phosphino)benzyl]dipalladium(II) (5.0 mg, 5% mol), tris(o-methoxyphenyl)phosphine (7.0 mg, 20% mol), pivalic acid (3.3 mg, 0.0317 mmol) and Cs$_2$CO$_3$ (79.6 mg, 0.243 mmol) were added in a Biotage microwave vial (size 2 to 5 mL) equipped with a magnetic stirring bar. The vial was sealed with a cap and then purged with nitrogen to remove any oxygen. Toluene (0.5 mL) was added and the reaction mixture was heated using an oil bath at 120° C. (reaction under pressure) for 24 h. The reaction mixture was then cooled and the corresponding 3,4-ethylenedioxythiophene (50 mg in 1 mL) was added as a capping agent. The solution was subsequently heated again at 120° C. over a period of 1 hour to complete the end-capping procedure. After an additional hour of reaction time, the whole mixture was cooled to room temperature and poured into cold methanol (300 mL). The resulting precipitate was filtered. Soxhlet extractions with acetone followed by hexanes removed catalytic residues and low molecular weight materials. Polymers were then extracted with chloroform. The solvent was reduced to about 5 mL and the mixture was poured into cold methanol. The resulting precipitate was filtered. P39 was obtained in 44% yield of soluble fraction in CHCl$_3$; M$_n$ of 55.3 kDa and M$_w$ of 95.2 kDa.

While the present disclosure has been described with reference to what are presently considered to be the preferred examples, it is to be understood that the disclosure is not limited to the disclosed examples. To the contrary, the disclosure is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety.

REFERENCES REFERRED TO IN THE SPECIFICATION

1. B. Carsten, F. He, H.-J. Son, T. Xu, L. Yu, *Chem. Rev.* 2011, 111, 1493-1528.
2. Y.-J. Cheng, S.-H. Yan, C.-S. Hsu, *Chem. Rev.* 2009, 109, 5868-5923.
3. a) G. P. McGlacken, L. M. Bateman, *Chem. Soc. Rev.* 2009, 38, 2447-2464; b) B. Legault, I. Petrov, S. I. Gorelsky, K. Fagnou, *J. Org. Chem.* 2010, 75, 1047-1060; c) T. W. Lyons, M. S. Sanford, *Chem. Rev.* 2010, 110, 1147-1169; d) L. Ackermann, R. Vicente, A. R. Kapdi, *Angew. Chem. Int. Ed.* 2009, 48, 9792-9826; e) D. Alberico, M. E. Scott, M. Lautens, *Chem. Rev.* 2007, 107, 174-238; f) O. René, K. Fagnou, *Adv. Synth. Catal.* 2010, 352, 2116-2120; g) L. Chen, J. Roger, C. Bruneau, P. H. Dixneuf, H. Doucet, *Chem. Commun.*, 2011, 47, 1872-1874. h) M. Baghbanzadeh, C. Pilger, C. O. Kappe, *J. Org. Chem.* 2011, 76, 8138-8142.
4. a) L. Ackermann, *Chem. Rev.* 2011, 111, 1315-1345;b)$_0$. Rene, K. Fagnou, *Org. Lett.* 2010, 12, 2116-2119; c) T. Satoh, M. Miura, *Chem. Lett.* 2007, 36, 200-205; d) B. Liegault, D. Lapointe, L. Caron, A. Vlassova, K Fagnou, *J. Org. Chem.* 2009, 74, 1826-1834; e) M. Lafrance, K. Fagnou, *J. Am. Chem. Soc.* 2006, 128, 16496-16497; f) J. J. Dong, J. Roger, C. Verrier, T. Martin, R. Le Goff, C. Hoarau, H. Doucet, Green Chem. 2010, 12, 2053-2063; g) D. J. Schipper, K. Fagnou, *Chem. Matter.* 2011, 23, 1594-1600.
5. a) Q. Wang, R. Takita, Y. Kikuzaki, F. Ozawa, *J. Am. Chem. Soc.* 2010, 132, 11420-11421; b) W. Lu, J. Kuwabara, T. Kanbara, *Macromolecules* 2011, 44, 1252-1255; c) M. Sévignon, J. Papillon; E. Schulz, M. Lemaire, *Tetrahedron Lett.* 1999, 40, 5873-5876.
6. a) Y. Zou, A. Najari, P. Berrouard, S. Beaupré, B. R. Aich, Y. Tao, M. Leclerc, *J. Am. Chem. Soc.* 2010, 132, 5330-5331; b) C. Piliego, T. W. Holcombe, J. D. Douglas, C. H. Woo, P. M. Beaujuge, J. M. J. Fréchet, *J. Am. Chem. Soc.* 2010, 132, 7595-7597; c) M.-S. Su, C.-Y. Kuo, M.-C, Yuan, U.-S. Jeng, C.-J. Su, K.-H. Wei *Adv. Mater.* 2011, 23, 3315-3319; d) T.-Y. Chu, J. Lu, S Beaupré, Y. Zhang, J.-R. Pouliot, S. Wakim, J. Zhou, M. Leclerc, Z. Li, J Ding, Y. Tao *J. Am. Chem. Soc.* 2011, 133, 4250-4253; e) G.-Y. Chen, Y.-H. Cheng, Y.-J. Chou, M.-S. Su, C.-M. Chen, K.-H. Wei, *Chem. Commun.* 2011, 47, 5064-5066; f) D. Gendron, M. Leclerc, *Energy Environ. Sci.* 2011, 4, 1225-1237; g) C. M. Amb, S. Chen, K. R. Graham, J. Subbiah, C. E. Small, F. So, J. R. Reynolds, *J. Am. Chem. Soc.* 2011, 133, 10062-10065; h) D. Gendron, P.-O. Morin, P. Berrouard, N. Allard, B. R Aich, C. N. Garon, Y. Tao, M. Leclerc, *Macromolecules* 2011, 44, 7188-7193.
7. X. Guo, R. P. Ortiz, Y. Zheng, M.-G. Kim, S. Zhang, Y. Hu, G. Lu, A. Facchetti, T. J. Marks. *J. Am. Chem. Soc.* 2011, 133, 13685-13697.
8. a) G. Dyker, *Angew. Chem. Int. Ed.* 1999, 38, 1698-1712; b) V. S. Thirunavukkarasu, K. Parthasarathy, C.-H. Cheng, *Chem. Eur. J.* 2010, 16, 1436-1440; c) F. Kakiuchi, S. Mural, *Acc. Chem. Res.* 2002, 35, 826-834.
9. M.-C. Yuan, M.-Y. Chiu, S.-P. Liu, C.-M. Chen, K.-H. Wei, *Macromolecules* 2010, 43, 6936-6938.
10. M. Leclerc, F. M. Diaz, G. Wegner *Makromol. Chem.* 1989, 190, 3105-3116.

TABLE 1

Conditions for the Synthesis of P1 by Direct Heteroarylation Polycondensation

Ligands: P(–C6H4–OMe)3 (1), P(–C6H4–NMe2)3 (2)

Catalysts: P(t-Bu)3HBF4 (3), Pd(OAc)(o-Tol) (1), Pd(OAc)2 (2)

| Entry | % (Cat)/% (L) | $M_n^{[b]}$ [kDa] | PDI[c] | DP |
|---|---|---|---|---|
| R1[a] (P1) | 2% (1)/8% (1) | 56 | 2.6 | 80 |
| R2[a] (P1) | 2% (1)/8% (2) | —[b] | —[b] | —[b] |
| R3[a] (P1) | 2% (1)/8% (3) | —[c] | —[c] | —[c] |
| R4[a] (P1) | 2% (2)/8% (1) | 21 | 2.5 | 33 |
| R5[a] (P1) | 2.5% (2)/15% (1) | —[c] | —[c] | —[c] |
| R6[a] (P1) | 2.5% (2)/15% (1)[d] | 9 | 1.8 | 14 |
| R7[a] (P1*) | [e] | 9 | 1.5 | 14 |

[a]P1 was synthesized by direct heteroarylation cross coupling;
[b]No polymerization reaction occurred;
[c]All the reaction product was recovered using acetone Soxhlet extraction and no further characterization was performed on these materials;
[d]Reaction time was 44 hours instead of 22 hours;
[e]P1* was synthesized by Stifle cross-coupling.

TABLE 2

$M_n$, $M_w$ and $I_p$ data for P5

| | $M_n$ Kg/mol | $M_w$ Kg/mol | $I_p$ |
|---|---|---|---|
| Stille cross-coupling | 32 | 89 | 2.8 |
| Direct Arylation | 32 | 109 | 3.4 |

TABLE 3

Optical and Electronic Properties of P9-P18

| | HOMO (eV) | LUMO (eV) | $E_{g\,cv}$ | $E_{g\,opt}$ (onset) |
|---|---|---|---|---|
| P9 (AP065) | −5.56 | −3.76 | 1.80 | 1.80 |
| P10 (AP082) | −5.56 | −3.73 | 1.83 | 1.79 |
| P11 (AP079) | −5.66 | −3.86 | 1.80 | 1.83 |
| P12 (AP066) | −5.57 | −3.82 | 1.75 | 1.78 |
| P13 (AP067) | −5.60 | −3.86 | 1.74 | 1.76 |
| P14 (AP164) | −5.67 | −3.87 | 1.80 | 1.83 |
| P15 (AP096) | −5.66 | −3.86 | 1.80 | 1.82 |
| P16 (AP098) | −5.66 | −3.86 | 1.80 | 1.82 |
| P17 (AP080) | −5.96 | −3.86 | 2.10 | 1.70 |
| P18 (AP078) | −5.95 | −3.86 | 2.09 | 1.80 |

TABLE 4

Physical, Optical and Electronic Properties of P21

| | $M_n$ kg/mol | $M_w$ kg/mol | HOMO eV | LUMO eV | $Eg^{elec}$ eV | $Eg^{opt}$ ev |
|---|---|---|---|---|---|---|
| P21 (PB-465) | 12 | 15 | −5.75 | −3.95 | 1.8 | 1.77 |

TABLE 5

Physical and Thermal Properties of P22-P29

| | $M_n$ (Kg/mol) | PDI | DP | $n^a$ | $T_{dec}^b$ (° C.) |
|---|---|---|---|---|---|
| P22 (P1) | 23 | 1.5 | 53 | 53 | 420 |
| P23 (P2) | 22 | 1.4 | 51 | 51 | 420 |
| P24 (P3) | 21 | 1.5 | 54 | 54 | 420 |
| P25 (P4) | 25 | 1.3 | 32 | 64 | 420 |
| P26 (P5) | 4 | 1.3 | 6 | 12 | 410 |
| P27 (P6) | 8 | 1.8 | 11 | 23 | 420 |
| P28 (P7) | 5 | 1.6 | 5 | 11 | 440 |
| P29 (P8) | 7 | 1.6 | 24 | 24 | 380 |

[a]number of TPD units;
[b]evaluated by TGA at 5% mass loss under nitrogen

TABLE 6

Spectroscopic and Electrochemical Properties of P22-29 in the Solid State

| | $\lambda_{max}^a$ (nm) | $\lambda_{max}$ (nm) | $E_{g\,opt}$ (eV) | $E_{ox}^b$ (eV) | $E_{red}^b$ (eV) | $E_{g\,elect}$ (eV) |
|---|---|---|---|---|---|---|
| P22 (P1) | 523 | 539 | 1.9 | 1.5 | −0.4 | 1.9 |
| P23 (P2) | 523 | 539 | 1.9 | 1.5 | −0.4 | 1.9 |
| P24 (P3) | 481 | 481 | 2.2 | 1.7 | −0.4 | 2.1 |
| P25 (P4) | 481 | 481 | 2.2 | 1.7 | −0.4 | 2.1 |
| P26 (P5) | 528 | 527 | 1.9 | N.D. | N.D. | N.D |
| P27 (P6) | 541 | 542 | 1.8 | 1.2 | −0.4 | 1.6 |
| P28 (P7) | 523 | 533 | 1.8 | 1.2 | N.D | N.D |
| P29 (P8) | 536 | 544 | 1.9 | 1.1 | N.D | N.D |

[a]Absorbance maxima done in CHCl3 solution;
[b]onset of process potential

TABLE 7

Physical, Optical and Electronic Properties of P37-39

| | Mn kg/mol | Mw kg/mol | HOMO eV | LUMO eV | $Eg^{elec}$ eV | $Eg^{opt}_{film}$ eV | $T_{deg}$ ° C. |
|---|---|---|---|---|---|---|---|
| P37 | 24.0 | 52.9 | −6.0 | −4.2 | 1.8 | 1.72 | 412 |
| P38 | 19.5 | 42.9 | −6.1 | −4.2 | 1.9 | 1.75 | 420 |
| P39 | 55.3 | 92.2 | −5.4 | −3.9 | 1.5 | 1.55 | 410 |

The invention claimed is:

1. A method for preparing a high molecular weight polymer comprising:
   (a) treating one or more monomers, one or more catalysts and one or more ligands under conditions for the direct arylation or heteroarylation of the at least one monomer to provide the high molecular weight polymer; and
   (b) isolating the high molecular weight polymer;
   wherein treating comprises treating a monomer of Formula (I) and a monomer of Formula (II):

H*-A$^1$-H* (I) and X$^1$-A$^2$-X$^2$ (II);

in the presence of one or more catalysts and one or more ligands under conditions for the direct arylation or heteroarylation of the monomer of Formula (I) and monomer of Formula (II) to provide a polymer comprising repeating units of Formula (V):

-[A$^1$-A$^2$]-(V);

wherein
   H* is a hydrogen that is activated for direct arylation or heteroarylation reactions;
   X$^1$ and X$^2$ are independently selected from leaving groups for direct arylation or heteroarylation reactions; and A¹ and A² are independently selected from aryl and heteroaryl; and wherein the one or more ligands are trialkyl or triaryl phosphines in which the alkyl and aryl groups are substituted or unsubstituted, or complexes thereof with metals; and wherein the high molecular weight polymer has a molecular weight in excess of about 10 kDa.

2. The method of claim 1, further comprising, prior to isolating the polymer, adding an end capping reagent to the polymer.

3. The method of claim 1, wherein X¹ and X² are selected from bromine and iodine.

4. The method of claim 1, wherein A¹ and A² are selected from phenyl, biphenyl, naphthyl and indanyl.

5. The method of claim 1, wherein A¹ and A² are independently selected heteroaryl.

6. The method of claim 5, wherein the heteroaryl comprises at least one thienyl group fused to a 5-membered or 6-membered heterocyclo group.

7. The method of claim 5, wherein the heteroaryl comprises 2, 3 or 4 thienyl groups.

8. The method of claim 5, wherein the heteroaryl comprises an oxindole group, indigo group or isoindigo group.

9. The method of claim 5, wherein the heteroaryl group is selected from:

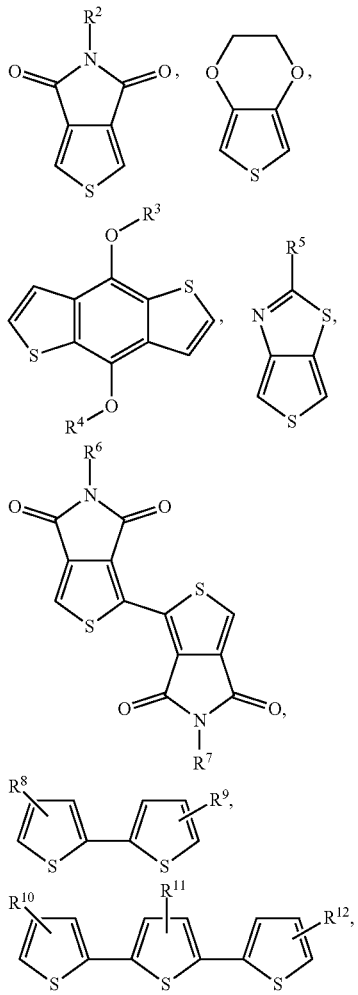

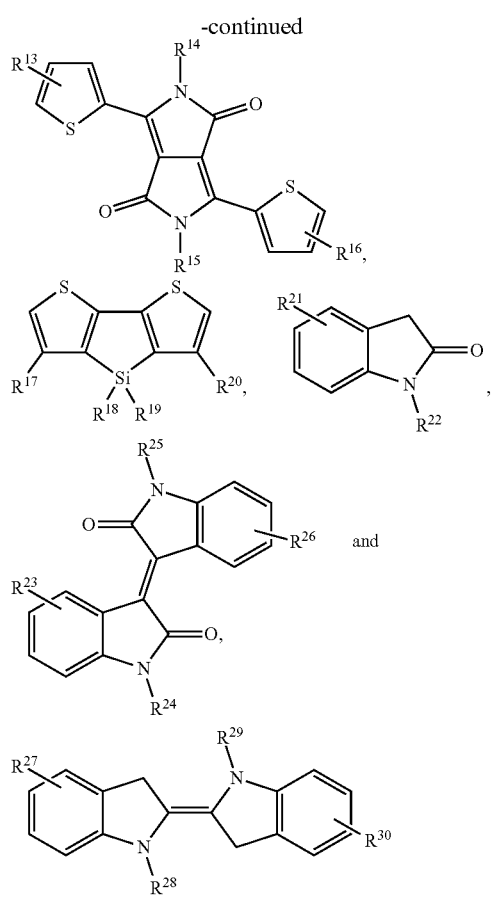

wherein $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$ and $R^{30}$ are independently selected from H, CN and $C_{1-30}$alkyl.

10. The method of claim 1, wherein the one or more ligands are selected from: $P(o\text{-}Tol)_3$,

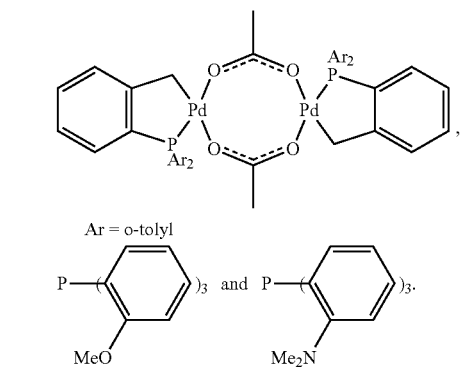

11. The method of claim 1, wherein the one or more catalysts are palladium (II) catalysts.

12. The method of claim 11, wherein the palladium catalyst is Pd(OAc)(o-Tol) or Pd(OAc)₂.

13. The method of claim 1, wherein the one or more catalysts are used in an amount of about 0.1 mol% to about 5 mol% based on the amount of monomers used.

14. The method of claim 1, wherein the one or more ligands are used in an amount of about 5 mol% to about 20 mol% based on the amount of monomers used.

15. The method of claim 1, further comprising addition of one or more mild bases along with the one or more monomers, one or more catalysts and one or more ligands under conditions for the direct arylation or heteroarylation of the at least one monomer to provide the polymer.

* * * * *

UNITED STATES PATENT AND TRADEMARK OFFICE
CERTIFICATE OF CORRECTION

PATENT NO.        : 9,505,876 B2
APPLICATION NO.   : 14/352541
DATED             : November 29, 2016
INVENTOR(S)       : Mario Leclerc et al.

It is certified that error appears in the above-identified patent and that said Letters Patent is hereby corrected as shown below:

In the Claims

In Claim 1, Column 71, Line 1, delete "$A^{I'}$" and insert --$A^1$-- therefor.

Signed and Sealed this
Seventh Day of March, 2017

Michelle K. Lee
*Director of the United States Patent and Trademark Office*